United States Patent
Chu

(10) Patent No.: US 10,170,671 B2
(45) Date of Patent: Jan. 1, 2019

(54) METHODS OF FILLING A FLOWABLE MATERIAL IN A GAP OF AN ASSEMBLY MODULE

(71) Applicant: Chen-Fu Chu, Hsinchu (TW)

(72) Inventor: Chen-Fu Chu, Hsinchu (TW)

(*) Notice: Subject to any disclaimer, the term of this patent is extended or adjusted under 35 U.S.C. 154(b) by 0 days.

(21) Appl. No.: 15/604,160

(22) Filed: May 24, 2017

(65) Prior Publication Data
US 2017/0365755 A1 Dec. 21, 2017

Related U.S. Application Data

(60) Provisional application No. 62/341,296, filed on May 25, 2016.

(51) Int. Cl.
*H01L 21/78* (2006.01)
*H01L 33/56* (2010.01)
(Continued)

(52) U.S. Cl.
CPC .............. *H01L 33/56* (2013.01); *C23C 14/14* (2013.01); *C23C 14/34* (2013.01); *C23C 16/45525* (2013.01); *C23C 16/50* (2013.01); *H01L 21/304* (2013.01); *H01L 21/78* (2013.01); *H01L 21/7806* (2013.01); *H01L 21/7813* (2013.01); *H01L 25/0753* (2013.01); *H01L 25/167* (2013.01); *H01L 27/153* (2013.01); *H01L 27/156* (2013.01); *H01L 33/0095* (2013.01);
(Continued)

(58) Field of Classification Search
None
See application file for complete search history.

(56) References Cited

U.S. PATENT DOCUMENTS

2010/0078656 A1* 4/2010 Seo .................. H01L 27/156
257/88
2015/0340346 A1 11/2015 Chu et al.
(Continued)

*Primary Examiner* — Minh-Loan Tran
(74) *Attorney, Agent, or Firm* — Muncy, Geissler, Olds & Lowe, P.C.

(57) ABSTRACT

A method to fill the flowable material into the semiconductor assembly module gap regions is described. In an embodiment, multiple semiconductor units are formed on the substrate to create an array module; the array module is attached to a backplane having circuitry to form the semiconductor assembly module in which multiple gap regions are formed inside the semiconductor assembly module and edge gap regions are formed surround an edge of the assembly module; The flowable material is forced inside the gap regions by performing the high acting pressure environment and then cured to be a stable solid to form a robustness structure. A semiconductor convert module is formed by removing the substrate utilizing a substrate removal process. A semiconductor driving module is formed by utilizing a connecting layer on the semiconductor convert module. In one embodiment, a vertical light emitting diode semiconductor driving module is formed to light up the vertical LED array. In another one embodiment, multiple color emissive light emitting diodes semiconductor driving module is formed to display color images. In another embodiment, multiple patterns of semiconductor units having multiple functions semiconductor driving module is formed to provide multiple functions for desire application.

12 Claims, 30 Drawing Sheets

(51) Int. Cl.
*H01L 27/15* (2006.01)
*H01L 21/304* (2006.01)
*H01L 33/00* (2010.01)
*C23C 14/14* (2006.01)
*C23C 14/34* (2006.01)
*C23C 16/455* (2006.01)
*C23C 16/50* (2006.01)
*H01L 25/075* (2006.01)
*H01L 25/16* (2006.01)
*H01L 33/36* (2010.01)
*H01L 33/44* (2010.01)
*H01L 33/50* (2010.01)
*H01L 33/62* (2010.01)
*H01L 33/52* (2010.01)
*H01S 5/022* (2006.01)
*B05C 5/02* (2006.01)
*B05C 9/12* (2006.01)
*B05C 9/14* (2006.01)
*H01L 31/16* (2006.01)
*H01L 33/32* (2010.01)
*H01L 33/58* (2010.01)
*H01L 33/60* (2010.01)
*H01L 33/64* (2010.01)

(52) U.S. Cl.
CPC ............. *H01L 33/36* (2013.01); *H01L 33/44* (2013.01); *H01L 33/505* (2013.01); *H01L 33/52* (2013.01); *H01L 33/62* (2013.01); *B05C 5/0204* (2013.01); *B05C 9/12* (2013.01); *B05C 9/14* (2013.01); *H01L 31/16* (2013.01); *H01L 33/0079* (2013.01); *H01L 33/32* (2013.01); *H01L 33/58* (2013.01); *H01L 33/60* (2013.01); *H01L 33/642* (2013.01); *H01L 2933/005* (2013.01); *H01L 2933/0016* (2013.01); *H01L 2933/0025* (2013.01); *H01L 2933/0033* (2013.01); *H01L 2933/0041* (2013.01); *H01L 2933/0066* (2013.01); *H01S 5/0224* (2013.01); *H01S 5/02228* (2013.01); *H01S 5/02232* (2013.01); *H01S 5/02236* (2013.01)

(56) References Cited

U.S. PATENT DOCUMENTS

2016/0087149 A1\* 3/2016 Miyachi .............. H01L 25/0753
362/509
2016/0218143 A1\* 7/2016 Chaji ................... H01L 27/156

\* cited by examiner

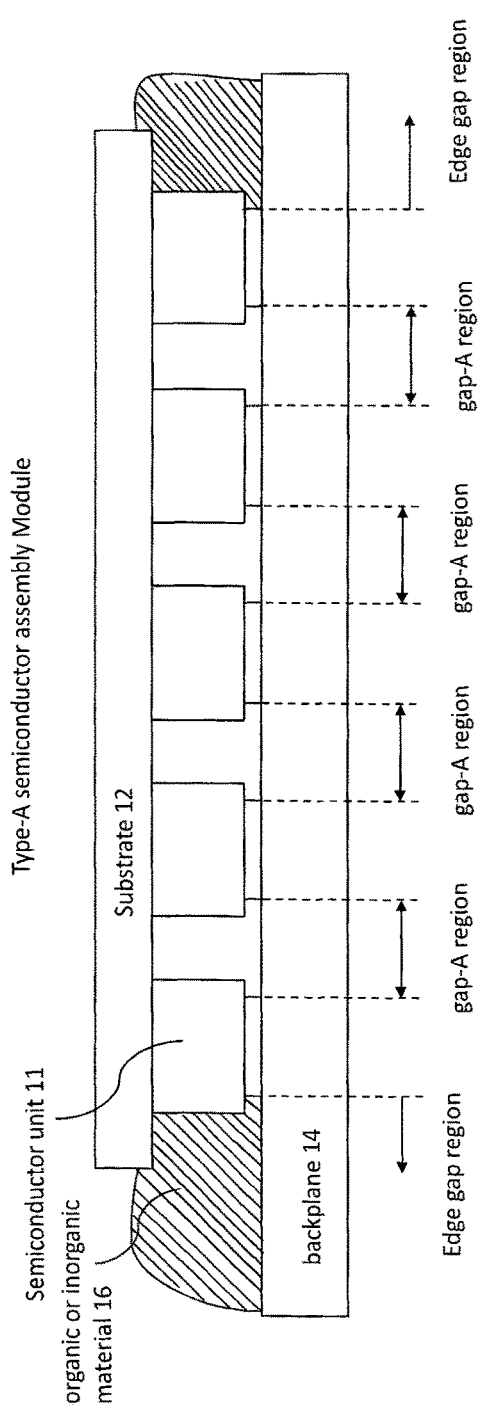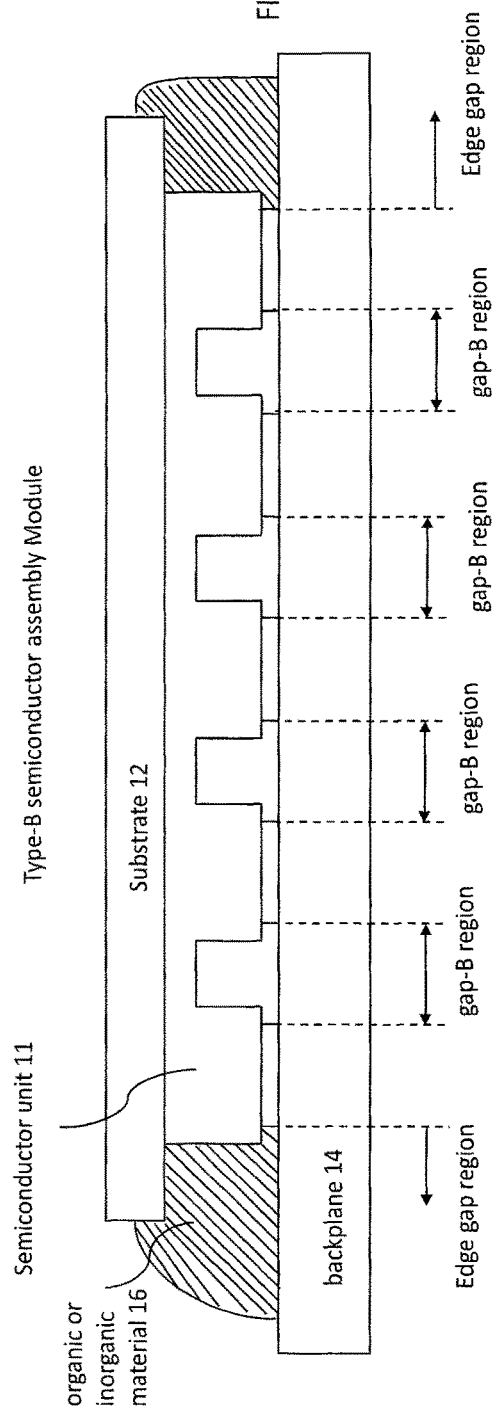

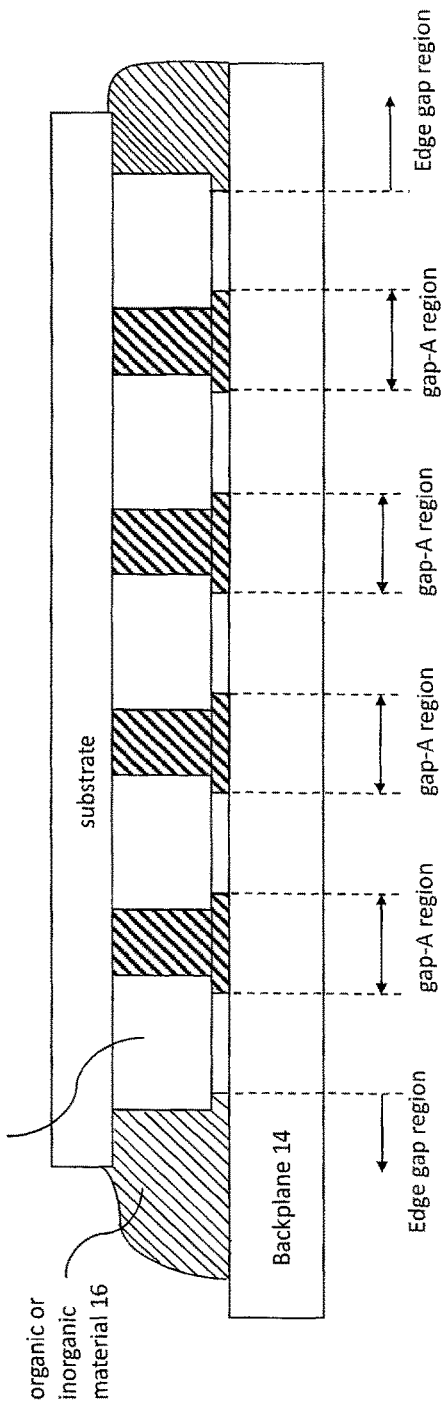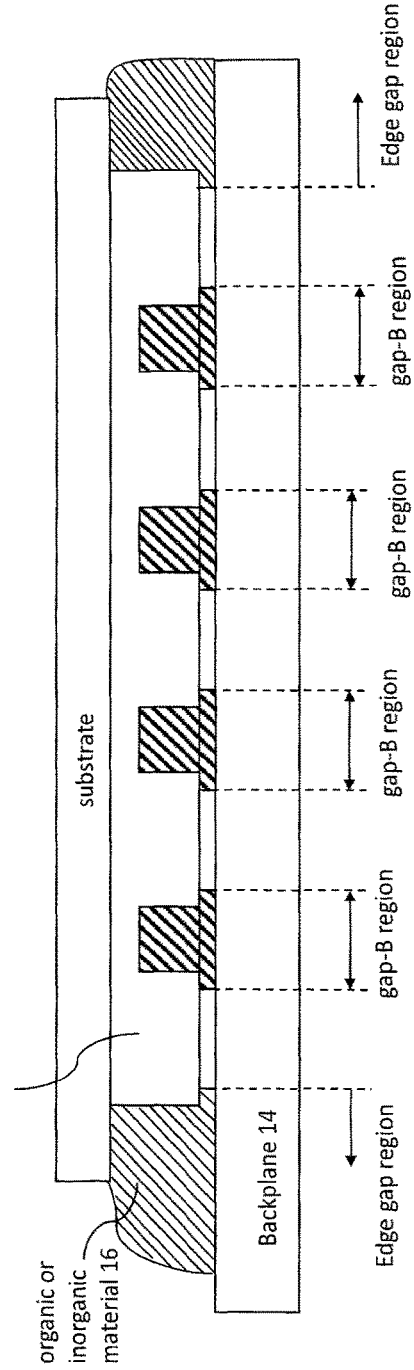

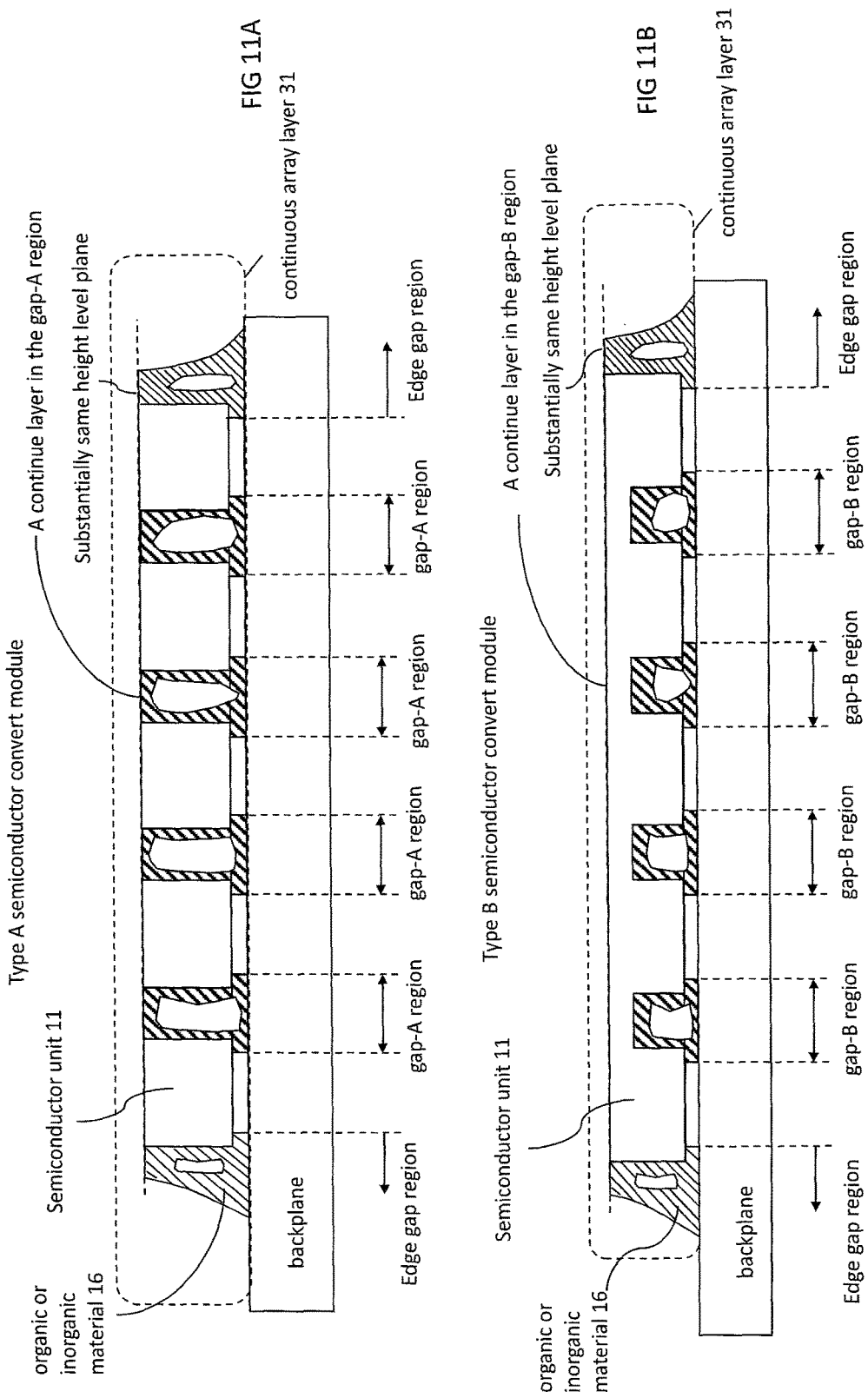

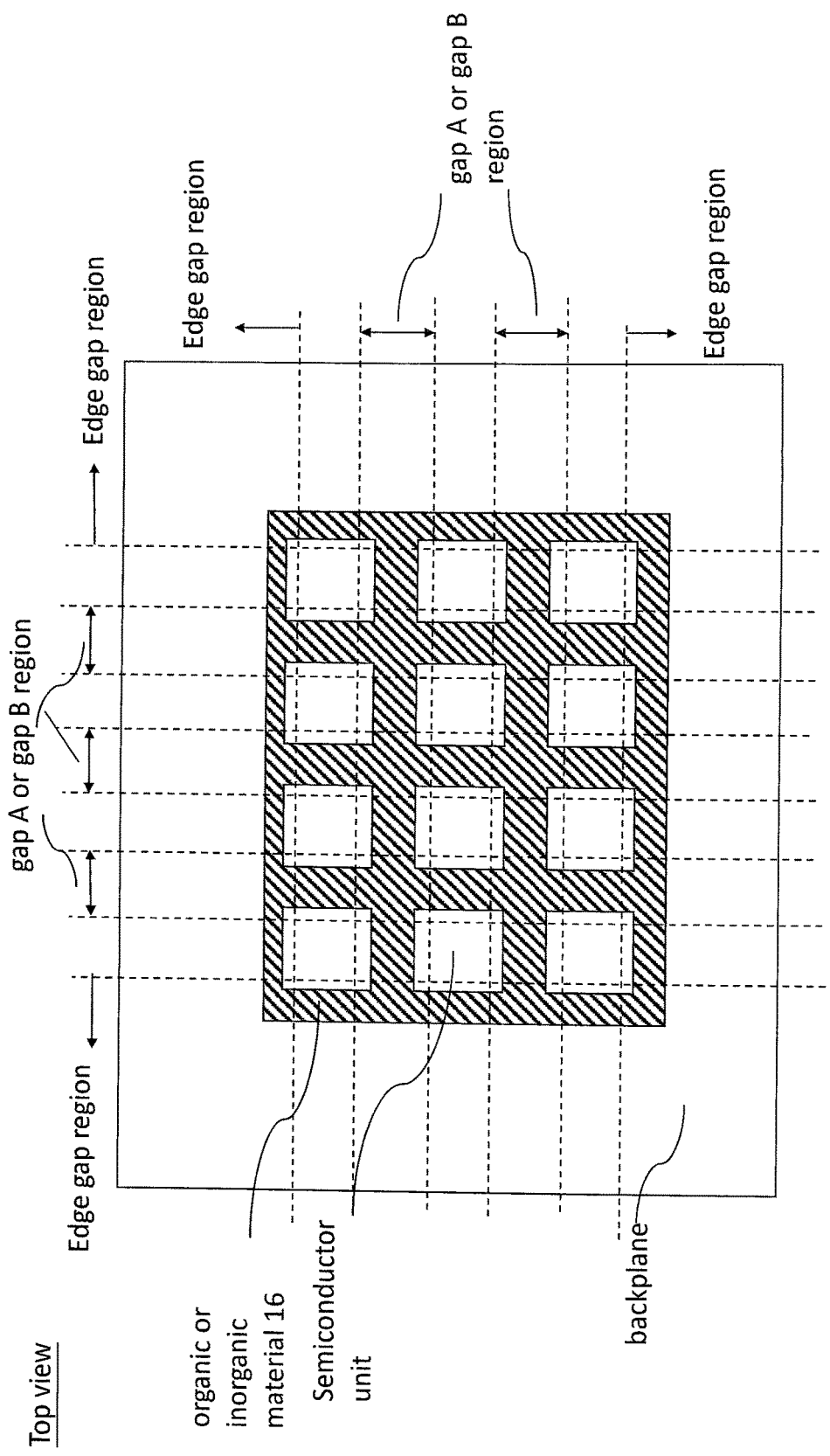

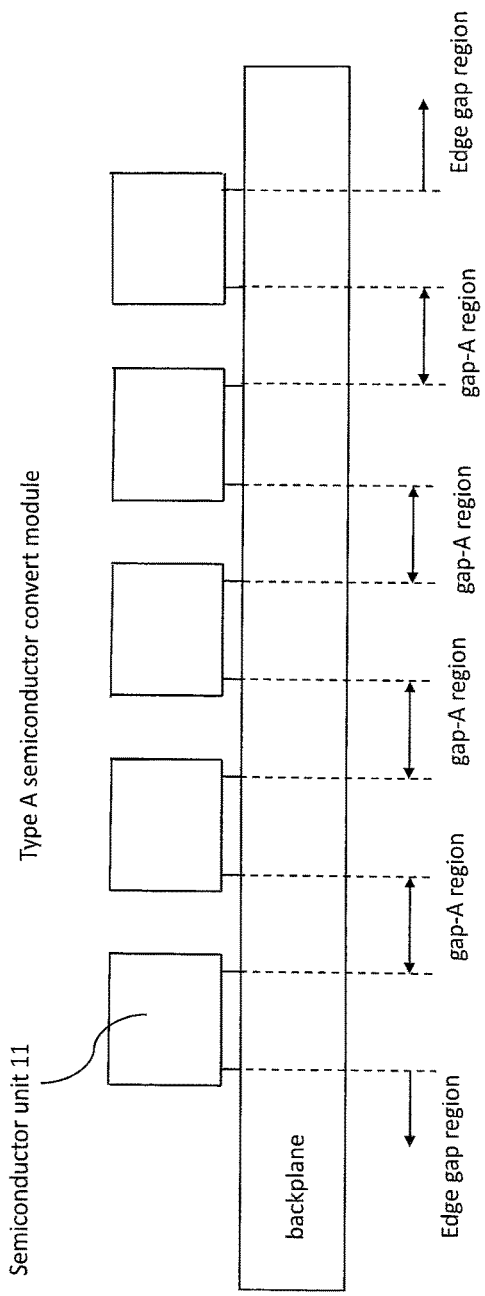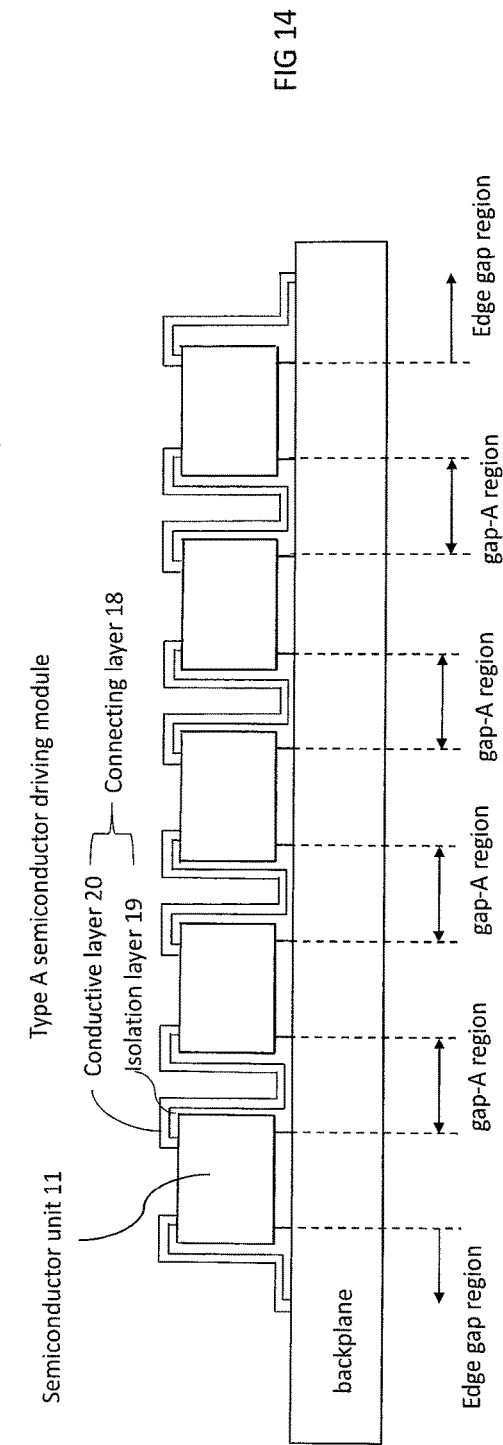

For Type A: Semiconductor Unit (LED Unit) Structure
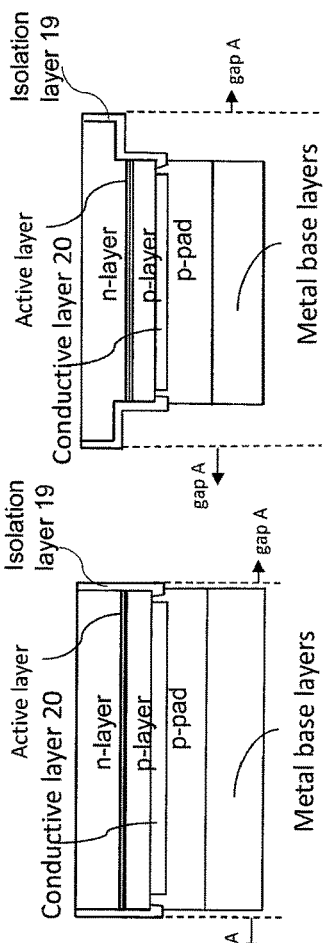
Flip-chip Type-A
FIG 16A
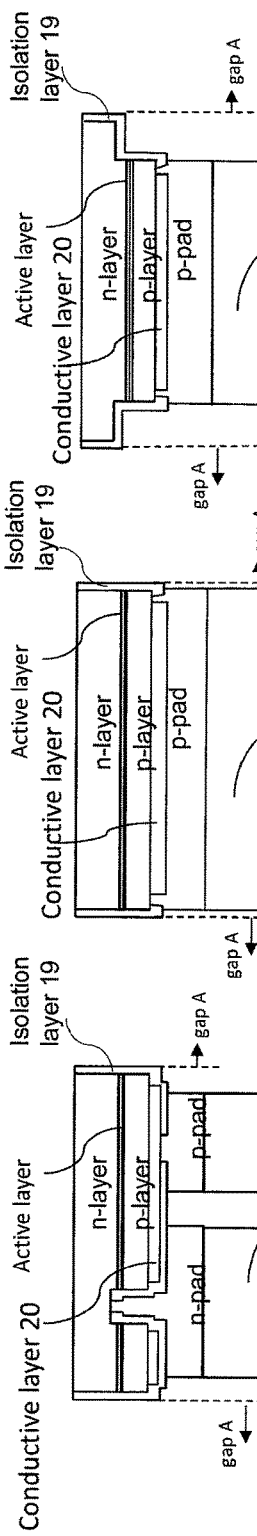
Vertical-chip Type-A1
FIG 16B
Vertical-chip Type-A2
FIG 16C
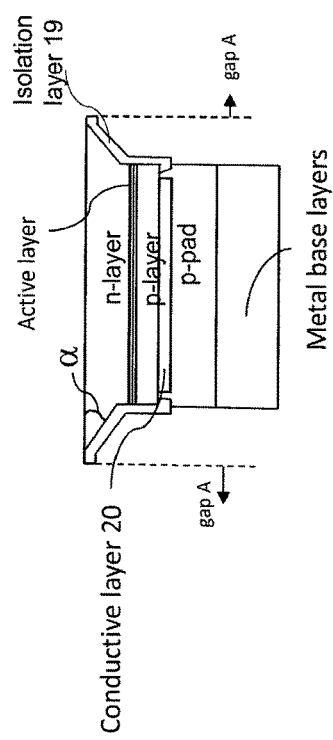
Vertical-chip Type-A3
FIG 16D
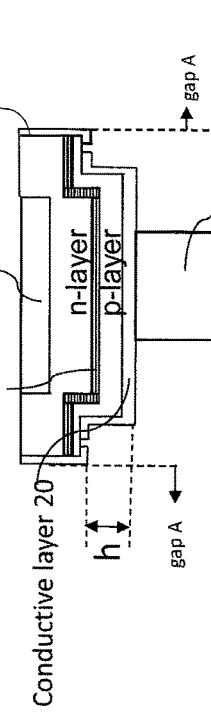
Vertical-chip Type-A4
FIG 16E For Type B: Semiconductor Unit (LED Unit) Structure Flip-chip Type-B Vertical-chip Type-B1

Vertical-chip Type-B2

Vertical-chip Type-B3

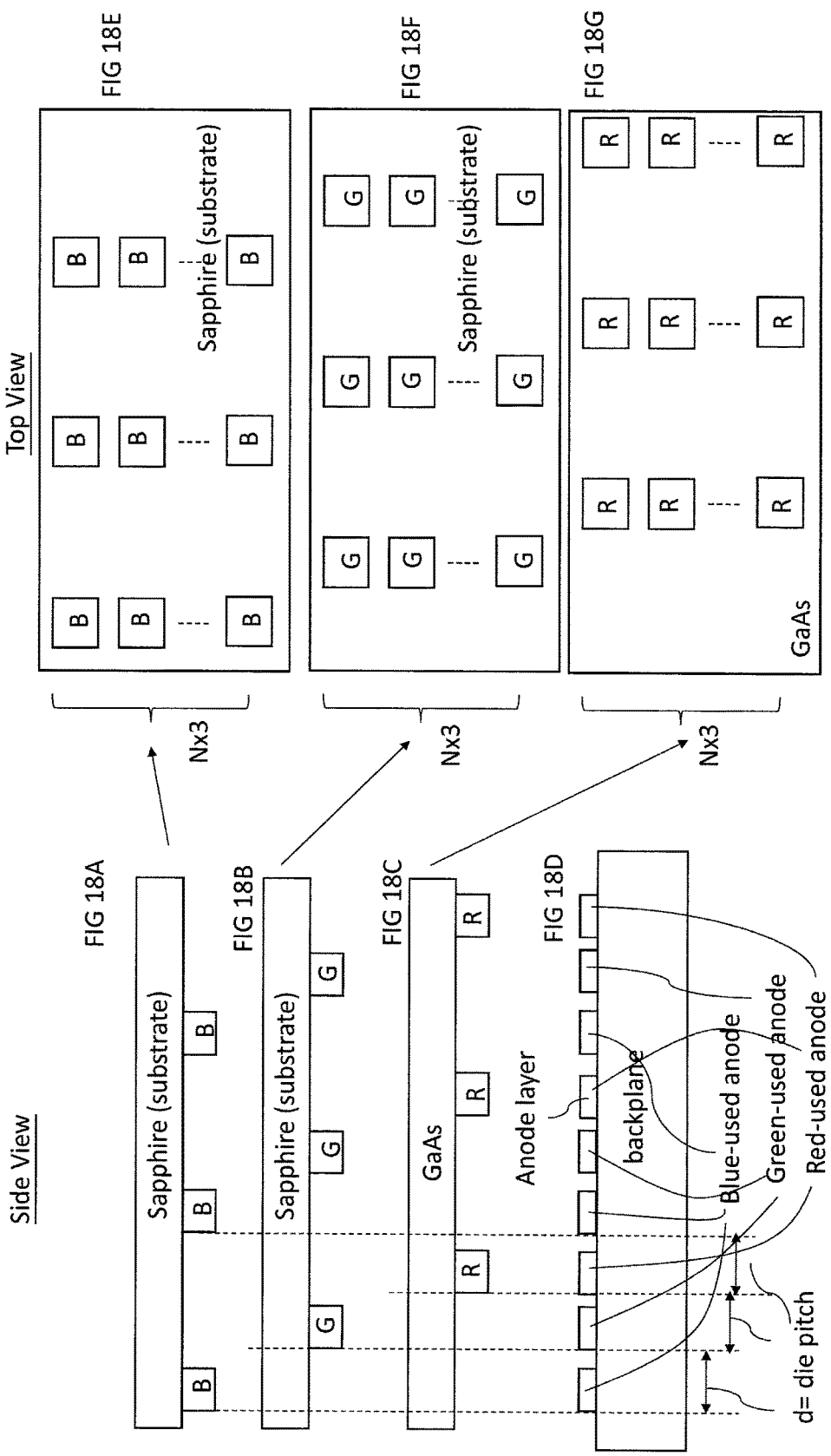

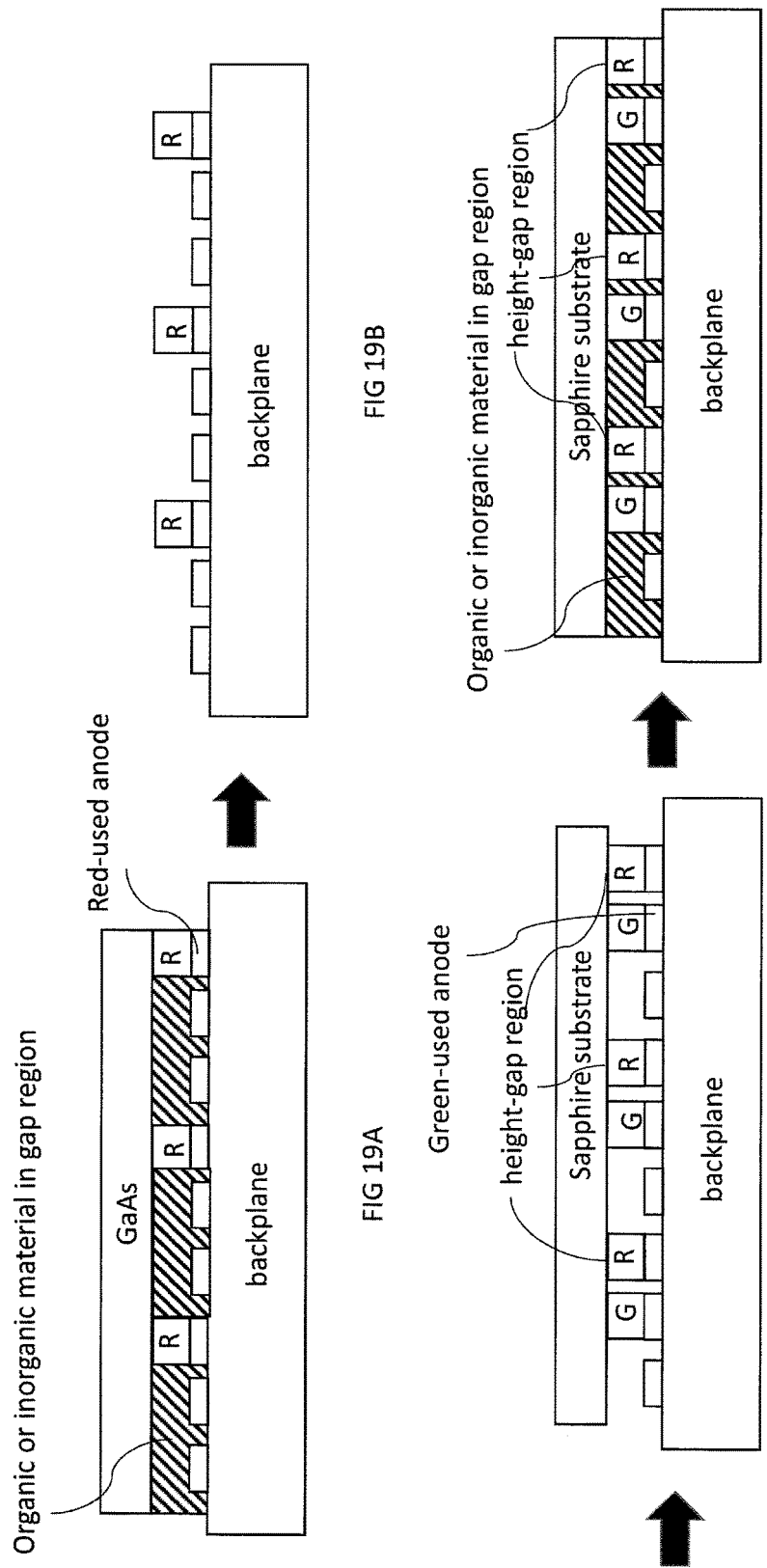

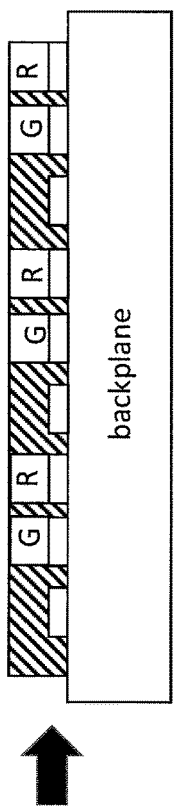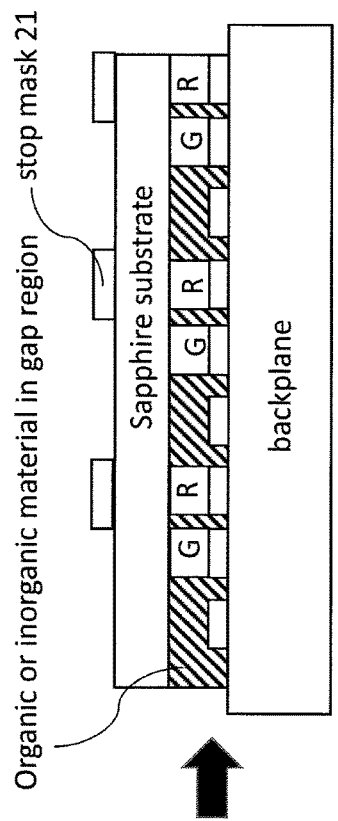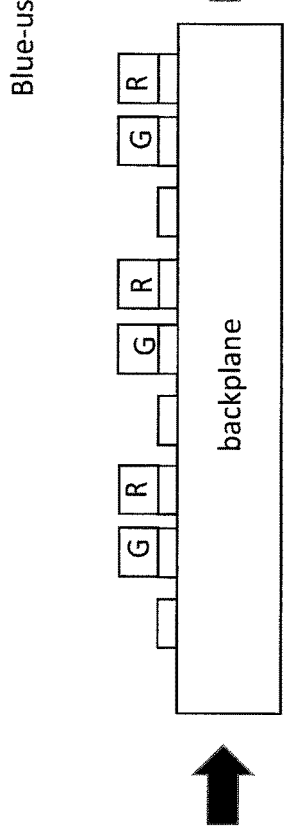
FIG 19E
FIG 19F
FIG 19G
FIG 19H

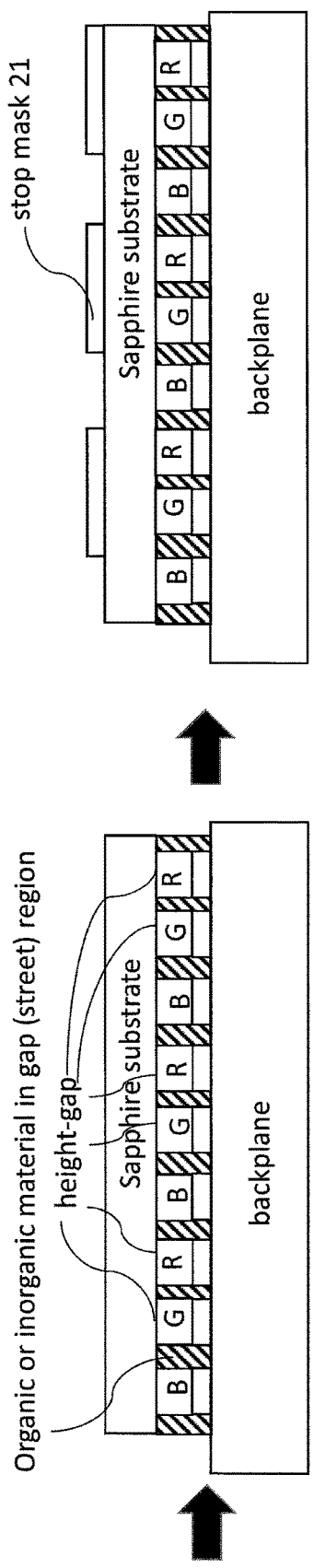
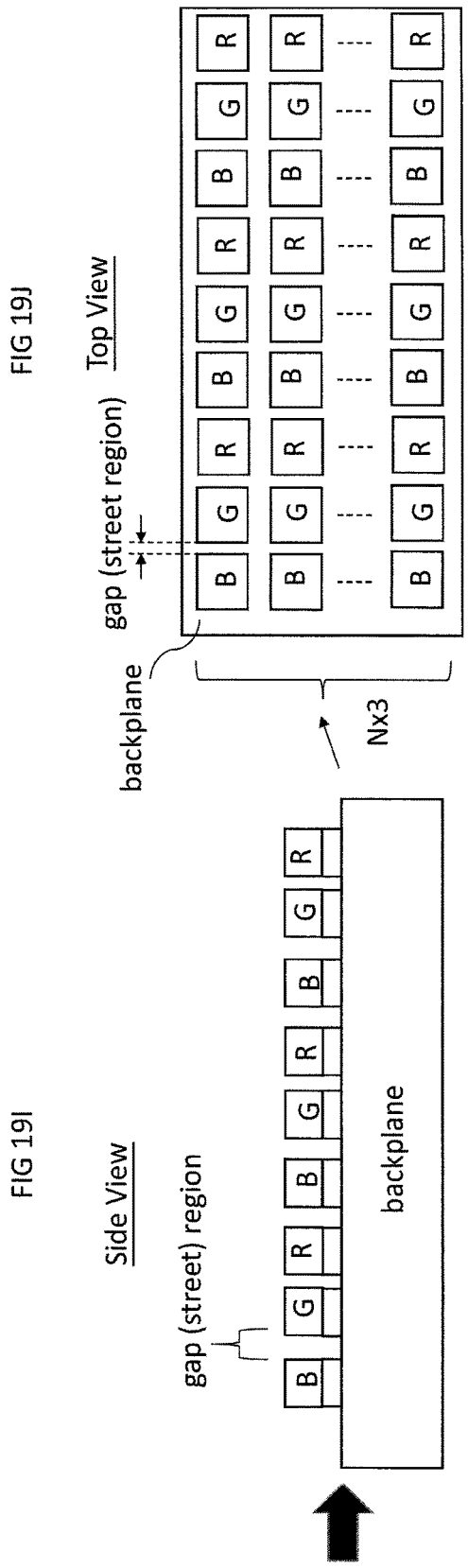
FIG 19I
FIG 19J
FIG 19K
FIG 19L

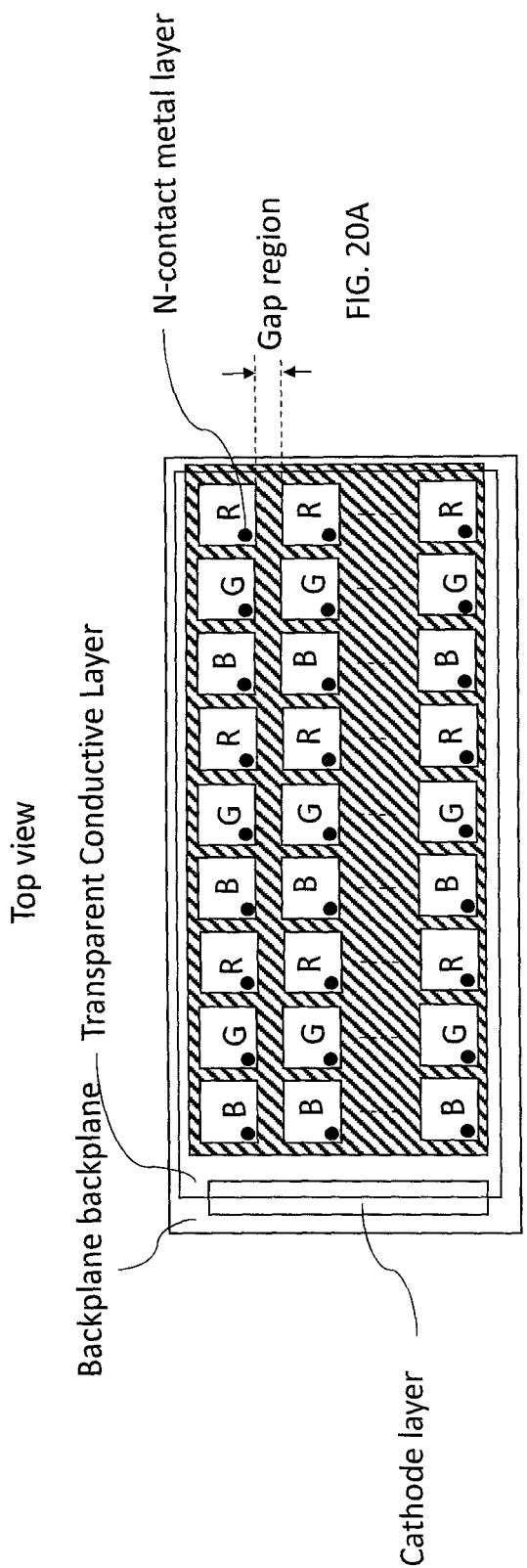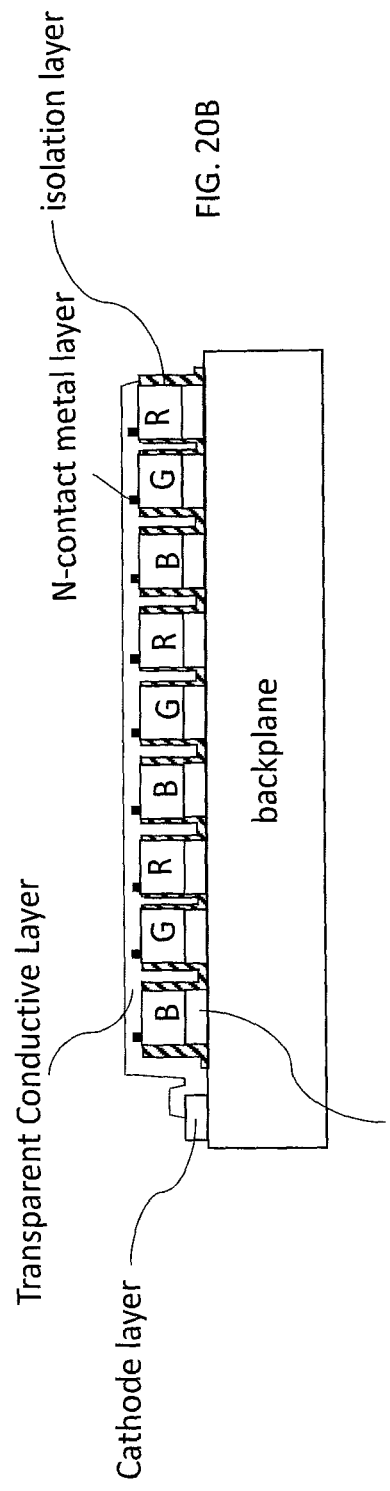
FIG 20

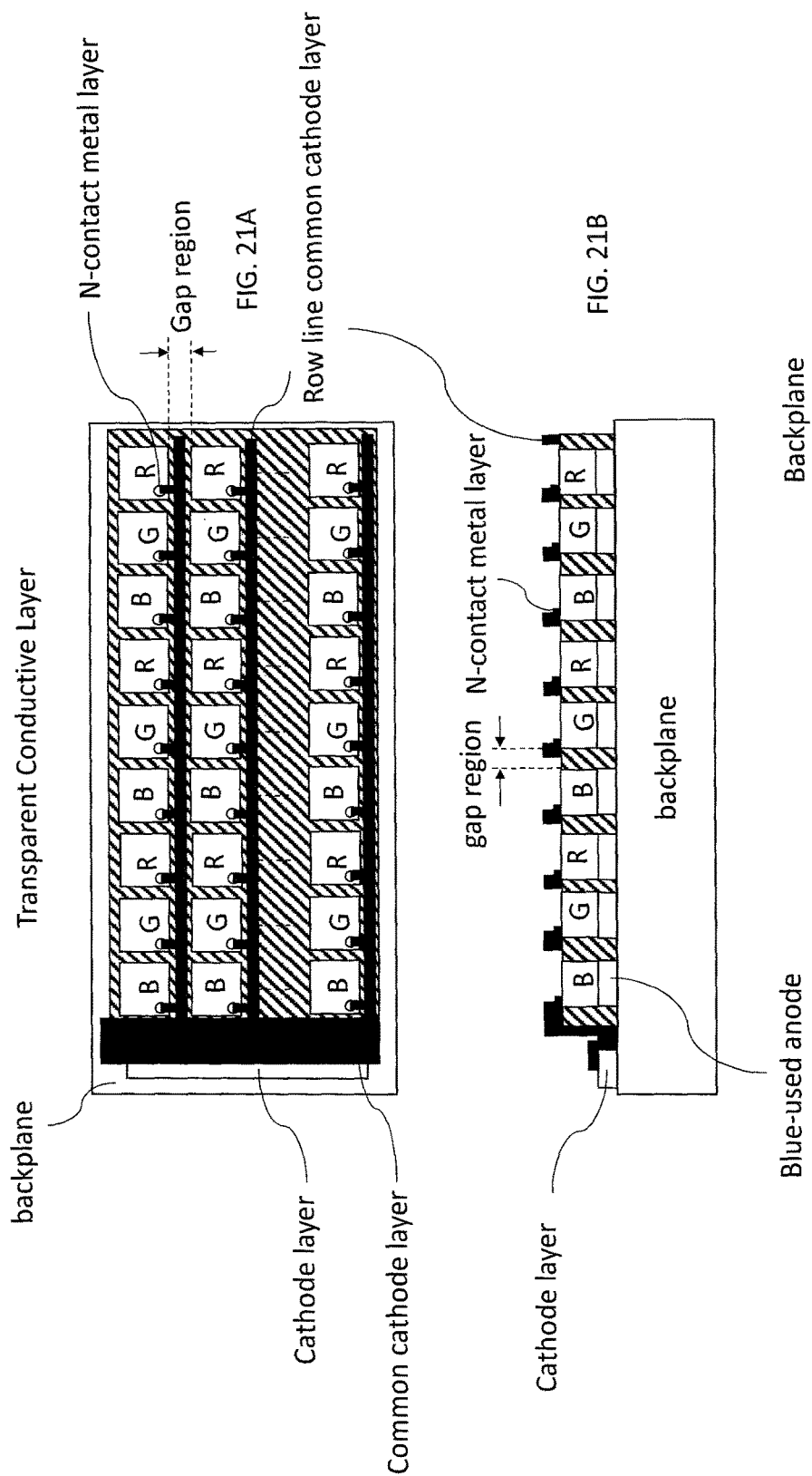

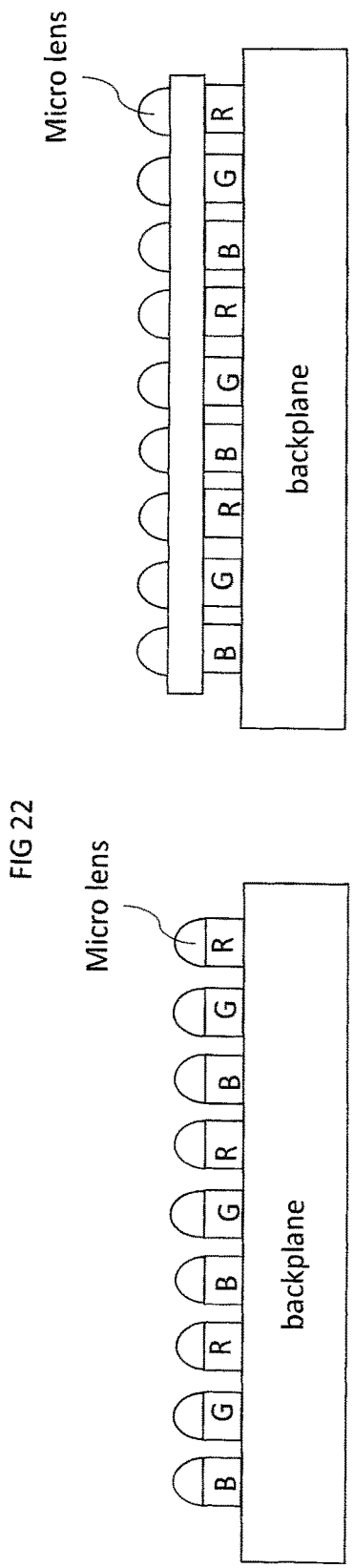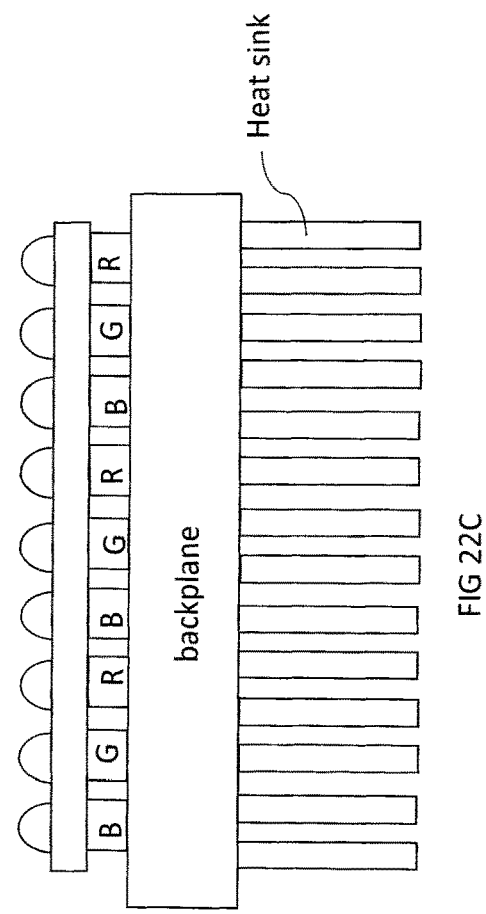

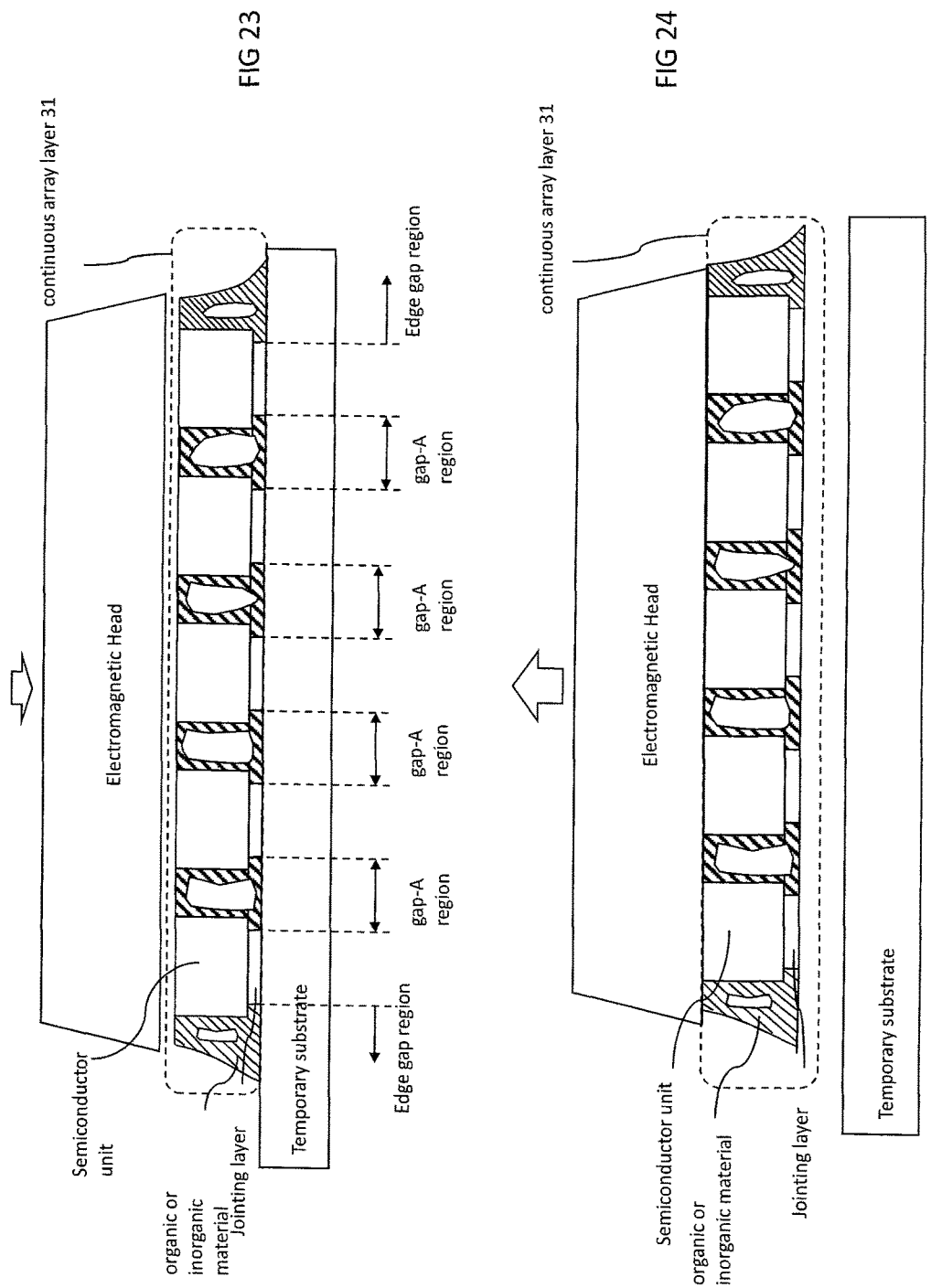

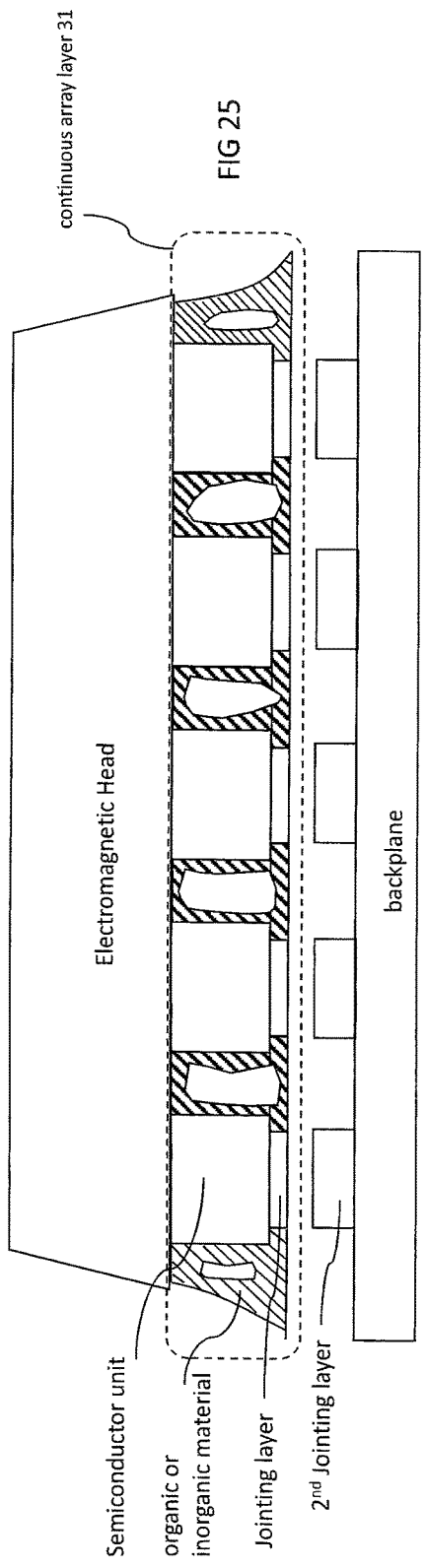
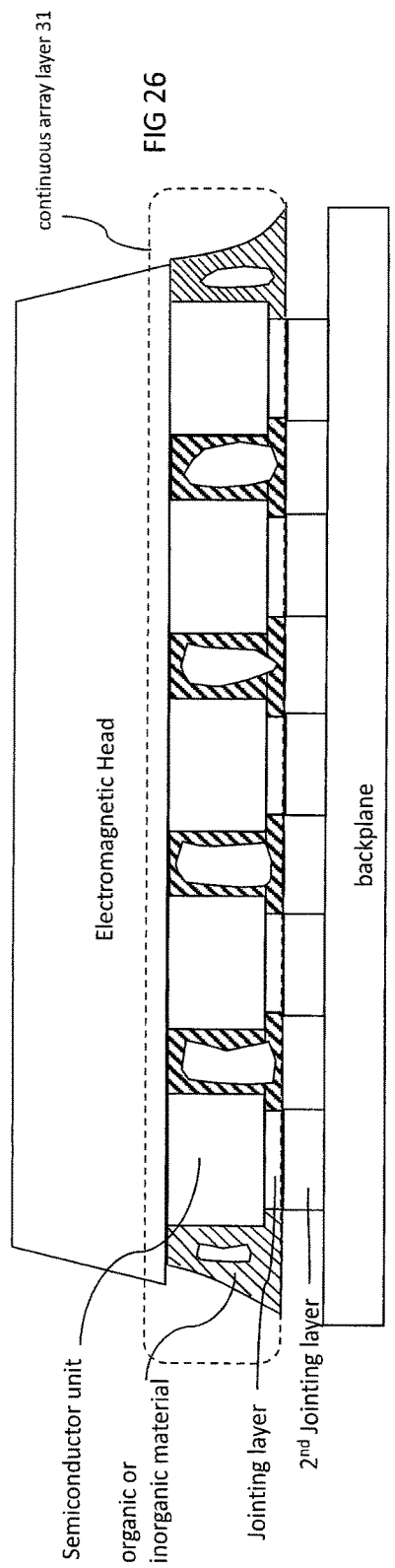

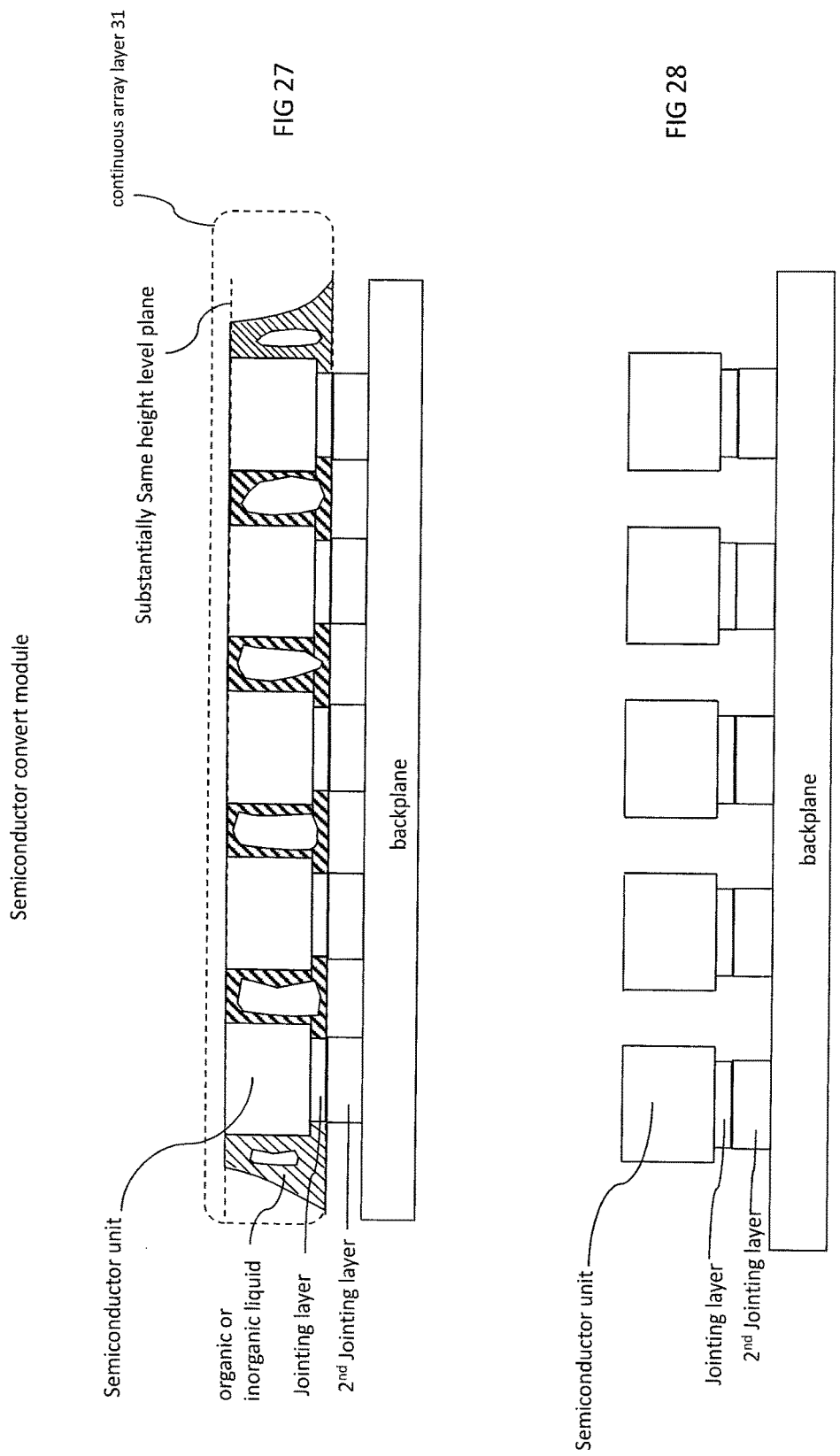

METHODS OF FILLING A FLOWABLE MATERIAL IN A GAP OF AN ASSEMBLY MODULE

This application claims benefit of U.S. provisional applications No. 62/341,296 filed on May 25, 2016 under 35 U.S.C. § 119(e); the entire contents of which are hereby incorporated by reference.

BACKGROUND OF THE INVENTION

Field of the Invention

This invention relates a method to fill an organic or inorganic liquid in a gap region in an assembly module.

Related Art

There are many known semiconductor substrate removal technologies. These technologies include mechanical grinding removal, planer removal, chemical wet etching removal and laser irradiation the interfacial layer for removal. For removal of semiconductor chip array from their growth substrate to another backplane, a method to protect the semiconductor chip array is a key to obtain high yield chip array transfer. More specifically, for the micro LED display, a high yield micro LED substrate removal and transferring is a key to obtain robust micro LED array for its application. The micro LED structure is required to be enhanced and the enhanced structure could be sustained the physical force removal of the LED substrate. In addition, the micro LED should be robust enough to be transferred to any other backplanes or backplanes. More specifically, for the micro display technologies such as the organic light emitting diode display, micro LED display. Recently, small size displays with high resolution for wearable electronic devices are getting more popular, for example of display using in head mounted display, virtual reality, augmented reality, pico-projector. Currently, most of small size high resolution display is fabricated by organic light emitting diode. The organic light emitting diode display is potentially used in many wearable electronic display, head mounted display (HMD), head up display (HUD), smart watch display, smart band display, virtual reality (VR), augmented reality (AR), pico-projector and smart ring display.

SUMMARY OF THE INVENTION

This invention relates a method to fill an organic or inorganic liquid into a gap region in a semiconductor assembly module. More specifically, a semiconductor assembly module structure comprising multiple semiconductor units together formed an array on a substrate and assembled to a backplane having circuitry. An organic or inorganic liquid material dispensed on an edge of the assembly module. This invention disclosure a method to fill the organic or inorganic liquid material in the semiconductor assembly module. This invention further disclosure a method to form a semiconductor driving module, a method to form a VLED driving module, a method to form a full color light emitting driving module. This invention disclosure a structure of the semiconductor assembly module with filled organic or inorganic liquid material to improve robustness. This invention further disclosure a structure of a semiconductor driving module, a structure of a full color light emitting driving module.

The method and structure in this invention could be, utilized to any suitable process in different application fields such as semiconductor light emitting unit display, semiconductor lighting panel, semiconductor thin film lighting, touch panel, light emitting diode, solid state lighting, lighting communication, micro engineering mechanical system, high power devices, high voltage devices, optical interconnection, solar cell, battery, bio array sensor, smart display panel, smart lighting communication, smart LED package, and other suitable semiconductor devices.

In one embodiment, a method to fill an organic or inorganic flowable material which could be liquid material into the gap regions of an semiconductor assembly module comprising: forming semiconductor units 11 on a substrate 12 to create an array module 15; attaching the array module to a backplane 14 having circuitry to form the semiconductor assembly module 10 in which multiple gap regions are formed inside the semiconductor assembly module and edge gap regions are formed surround the edge of the semiconductor assembly module; dispensing an organic or inorganic flowable material 16 on an edge of the semiconductor assembly module; loading the semiconductor assembly module into a compressive chamber; introducing a gas into the compressive chamber to create high pressure environment inside the compressive chamber; using the high internal acting gas pressure $P_{acting}$ (the $P_{acting}$ is the force created by the differential pressure of the $P_{chamber}$ and the pressure $P_{gap}$ when the flowable material is dispensed on the edge of the semiconductor assembly module) to force the organic or inorganic flowable material into the semiconductor assembly module gap regions; venting the compressive chamber to pressure that is lower than $P_{chamber}$ to create voids or air-gaps 17 in the semiconductor assembly module gap regions; crosslinking the organic or inorganic flowable material to be the partially cured (semi-cured) organic or inorganic material by applying heat or photon energy; removing the partially cured organic or inorganic material on the edge of the substrate sidewall using mechanical or chemical means; performing a final curing step by applying heat and time to the semiconductor assembly module to cure the partially cured organic or inorganic material to be stable solid.

In another one embodiment, a method to form a semiconductor driving module comprising: forming a semiconductor convert module by removing the substrate from the Semiconductor assembly module utilizing a substrate removal process such as laser irradiation lift-off, chemical or plasma etching or mechanical process; fabricating a circuitry connection on the semiconductor convert module to form a semiconductor driving module.

In another one embodiment, a method to form a vertical light emitting diode (VLED) driving module comprising multiple VLED units formed on a substrate to create a VLED array module; attaching the VLED array module to a backplane to form the VLED semiconductor assembly module in which multiple gap regions are formed inside the VLED semiconductor assembly module and edge gap regions are formed surround the edge of the VLED semiconductor assembly module; dispensing an organic or inorganic flowable material on an edge of the VLED semiconductor assembly module; loading the VLED semiconductor assembly module into a compressive chamber; introducing a gas into the compressive chamber to create high pressure environment inside the compressive chamber; using the high internal acting gas pressure $P_{acting}$ to force the organic or inorganic flowable material into the VLED semiconductor assembly module gap regions; venting the compressive chamber to atmosphere pressure environment creating void or an air-gap in the VLED semiconductor assembly module gap regions; crosslinking the organic or inorganic flowable material to be the partially cured (semi-cured) organic or inorganic material by applying heat or photon energy;

removing the partially cured organic or inorganic material on the edge of the substrate sidewall using mechanical or chemical means; performing a final curing step by applying heat and time to the VLED semiconductor assembly module to cure the partially cured organic or inorganic material to be stable solid; forming a VLED semiconductor convert module by removing the substrate from the VLED semiconductor assembly module utilizing a substrate removal process such as laser irradiation lift-off process; forming N-contact metal layer and isolation layer on the VLED units of the VLED semiconductor convert module; fabricating a common cathode conductive layer on the cathode layer of the backplane and on the N-contact metal layer of the VLED semiconductor convert module to connect to form a VLED semiconductor driving module.

In another one embodiment, a method to form a color emissive light emitting diode driving module comprising: multiple first color LED units formed on a substrate to create a first color LED array module; multiple second color LED units together formed on a substrate to create a second color LED array module; multiple third color LED units together formed on a substrate to create a third color LED array module; Attaching a first color LED array module on a backplane having circuitry to form a first color LED semiconductor assembly module in which multiple gap regions are formed inside the first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the first color LED substrate; removing the organic or inorganic material to form a first color LED semiconductor convert module; Attaching a second color LED array module on the first color LED semiconductor convert module to form a second-first color LED semiconductor assembly module in which multiple gap regions are formed inside the second-first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the second color LED substrate; removing the organic or inorganic material to form a second-first color LED semiconductor convert module; Attaching a third color LED array module on the second-first color LED semiconductor convert module to form a third-second-first color LED semiconductor assembly module in which multiple gap regions are formed inside the third-second-first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the third color LED substrate; removing the organic or inorganic material to form a third-second-first color LED semiconductor convert module; additional color could be added to the semiconductor convert module by repeating the process steps of forming color LED semiconductor assembly module and as an option to obtain additional one or more color LED to desire level of light output; utilizing an insulation layer to the gap regions; forming a N-contact metal layer and an isolation layer on multiple color LED units of the third-second-first color LED convert module; fabricating a common cathode conductive layer on a cathode of the backplane, and connect to the N-contact metal layer of the third-second-first color LED semiconductor convert module to form a color emissive light emitting diode semiconductor driving module.

In another one embodiment, the semiconductor units such as LED, VSCEL having metal base layers with magnetic property such that one could handle or pick-up the whole continuous array layer from a temporary substrate and placing the continuous array layer on a backplane having circuitry then applying a bonding process via heat or photon energy to connect the jointing layers of the continuous array layer to the second jointing layers of a backplane to form a semiconductor convert module; the electromagnetic force could be released before or after the bonding taking place;

In another one embodiment, a method to form an organic or inorganic material inside multiple gap regions of multiple-patterns semiconductor assembly module comprising: multiple-patterns of semiconductor units having multiple functions together formed on a substrate to create a multiple-patterns semiconductor array module; Attaching the multiple-patterns semiconductor array module to a backplane having circuitry by a jointing layer to form a multiple-patterns semiconductor assembly module in which multiple gap regions including gaps and multiple gap channels are formed inside the multiple-patterns semiconductor assembly module; dispensing the organic or inorganic flowable material and introducing an internal acting gas pressure $P_{acting}$ to force the organic or inorganic flowable material into the multiple gap regions through multiple gap channels; performing curing step by applying heat and time to cure the organic or inorganic material to be stable solid; wherein an voids or air-gaps in the stable solid organic or inorganic material in the assembly multiple-patterns module gap regions and multiple gap channels.

BRIEF DESCRIPTION OF THE DRAWINGS

FIG. 3A is a cross sectional view of an organic or inorganic flowable material dispensed on the edge of the substrate in FIG. 1A structure.

FIG. 3B is a cross sectional view of an organic or inorganic flowable material dispensed on the edge of the substrate in FIG. 1B structure.

FIG. 5A is the cross sectional view of the organic or inorganic flowable material filled into all of the gap-A regions in the Type-A semiconductor assembly module.

FIG. 5B is the cross sectional view of the organic or inorganic flowable material filled into all of the gap-B regions in the Type-B semiconductor assembly module.

FIG. 11A is the Type-A semiconductor convert module.

FIG. 11B is the Type-B semiconductor convert module.

FIG. 12 is a top view of the organic or inorganic material fill in the edge gap regions and gap regions of the semiconductor convert module.

FIG. 13 is to remove the organic or inorganic material in the edge gap region and gap-A regions of the Type A semiconductor convert module.

FIG. 14 is a connecting layer forming on the semiconductor unit and gap regions of the semiconductor convert module.

FIG. 16A is a flip-chip Type-A LED unit structure.
FIG. 16B is a vertical-chip Type-A1 LED unit structure.
FIG. 16C is a vertical-chip Type-A2 LED unit structure.
FIG. 16D is a vertical-chip Type-A3 LED unit structure.
FIG. 16E is a vertical-chip Type-A4 LED unit structure.

FIGS. 18A-18G show a schematic diagram of side view and top view to fabricate the individual original emissive color LED unit array module and the backplane.

FIG. 18A is a scheme diagram of N×3 blue LED units on a sapphire substrate to form a blue LED array module.

FIG. 18B is a scheme diagram of N×3 green LED units on a sapphire substrate to form a green LED array module.

FIG. 18C is a scheme diagram of N×3 red LED units on a sapphire substrate to form a red LED array module.

FIG. 18D is multiple anode layers together formed on a backplane having circuitry to form an anode array module.

FIG. 18E is the top view of N (row)×3 (column) blue LED units together formed on a sapphire substrate to form a blue LED array module.

FIG. 18F is the top view of N (row)×3 (column) green LED units together formed on a sapphire substrate to form a blue LED array module.

FIG. 18G is the top view of N (row)×3 (column) blue LED units together formed on a GaAs substrate to form a red LED array module.

FIGS. 19A-19L are process follow and steps to fabricate a full color RGB LED driving module.

FIG. 19A is a red LED semiconductor assembly module.
FIG. 19B is a red LED semiconductor convert module.
FIG. 19C is a green-red LED semiconductor assembly module.

FIG. 19D is to fill an organic or inorganic material into the green-red LED semiconductor assembly module gap regions.

FIG. 19E is to pattern a stop mask in relative red LED unit region patterned on the top of the sapphire substrate.

FIG. 19F is a green-red LED semiconductor convert module.

FIG. 19G is to remove the organic or inorganic material in green-red LED semiconductor convert module.

FIG. 19H is blue-green-red LED semiconductor assembly module.

FIG. 19I is to fill an organic or inorganic material into the blue-green-red LED semiconductor assembly module gap regions.

FIG. 19J is to pattern a stop mask in the relative red LED unit and green LED unit region on the top of the sapphire substrate.

FIG. 19K is a blue-green-red LED semiconductor convert module.

FIG. 19L is the top view of the blue-green-red LED semiconductor convert module.

FIG. 20 is one embodiment layout for the color emissive blue-green-red LED semiconductor driving module.

FIG. 20A is a top view of the full color emissive blue-green-red LED semiconductor driving module.

FIG. 20B is a cross section structure of the color emissive blue-green-red LED semiconductor driving module.

FIG. 21 is another one embodiment structure for the color emissive blue-green-red LED semiconductor driving module.

FIG. 21A is a top view of the color emissive blue-green-red LED semiconductor driving module.

FIG. 21B is a cross section structure of the color emissive blue-green-red LED semiconductor driving module.

FIG. 22A is a micro lens formed on top of the FIG. 19K structure.

FIG. 22B is another one embodiment for the micro lens forming on top of the FIG. 19K structure.

FIG. 22C is a heat sink module formed underneath of the backplane.

FIG. 23 shows a top electromagnetic head could be posited to close to the top of FIG. 11A structure for an example.

FIG. 24 is the electromagnetic head touched to the continuous array layer.

FIG. 25 is the continuous array layer picked up by the electromagnetic head.

FIG. 26 is the continuous array layer placed/pressed to a backplane by the electromagnetic head.

FIG. 27 is another one semiconductor convert module.

FIG. 28 is to remove the organic or inorganic material in the edge gap region and gap regions of the semiconductor convert module.

DETAILED DESCRIPTION OF THE INVENTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

This invention disclosure a method to fill an organic or inorganic flowable material into a gap region in a semiconductor assembly module. More specifically, a semiconductor assembly module structure comprising multiple semiconductor units 11 together formed an array on a substrate and assembled to a backplane having circuitry. An organic or inorganic flowable material dispensed on an edge of the semiconductor assembly module (10a or 10b). This invention disclosure a method to fill the organic or inorganic flowable material in the semiconductor assembly module (10a or 10b). This invention further disclosure a method to form a semiconductor driving module, a method to form a full color light emitting driving module. This invention disclosure a structure of the semiconductor assembly module (10a or 10b) with filled organic or inorganic liquid material to improve robustness. This invention further disclosure a structure of a semiconductor driving module, a structure of a full color light emitting driving module.

Figure 1:
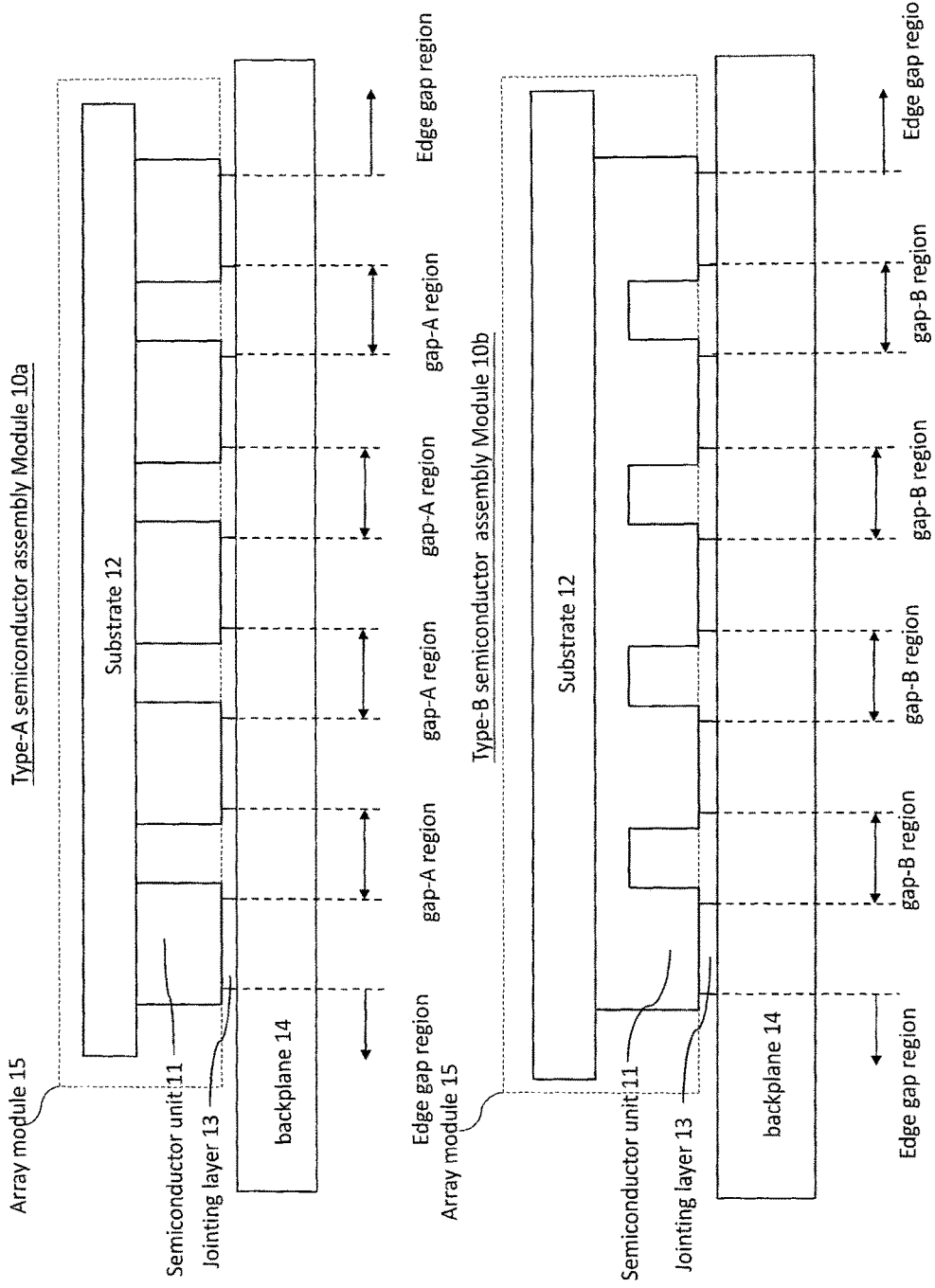
FIG. 1A is the scheme cross section diagram of a Type-A semiconductor assembly module.
FIG. 1B is the scheme cross section diagram of a Type-B semiconductor assembly module.

In one embodiment, FIG. 1A shows the scheme cross section diagram of a Type-A semiconductor assembly module 10a. The Type-A semiconductor assembly module structure comprising multiple semiconductor units 11 together formed an array on a substrate 12 to form an array module 15; The array module 15 is assemble attached to a backplane having circuitry by a jointing layer 13. Multiple gap-A regions are formed inside the Type-A semiconductor assembly module 10a and edge gap regions are formed surround the edge of the Type-A semiconductor assembly module 10a; FIG. 1B shows the scheme cross section diagram of a Type-B semiconductor assembly module 10b. The Type-B semiconductor assembly module structure comprising multiple semiconductor units 11 together formed an array on a substrate 12 to form an array module 15; The array module 15 is assemble attached to a backplane by a jointing layer 13. Multiple gap-B regions are formed inside the Type-B semiconductor assembly module 10b and edge gap regions are formed surround the edge of the Type-B semiconductor assembly module 10b; Please note that a portion of semiconductor layer is not etched and remained in gap-B region. The semiconductor units are connected via the remaining semiconductor layer for Type B semiconductor assembly module 10a and the Semiconductor units 11 are electrically separated for Type A semiconductor assembly module 10a.

Multiple semiconductor units 11 (N×M) together formed on a substrate is a N×M array module; The N×M array module is attached to a backplane 14 to form an N×M semiconductor assembly module; wherein, N, or M is an integer. N is the number of semiconductor units in one column and M is the number of semiconductor units in one row.

Figure 2:
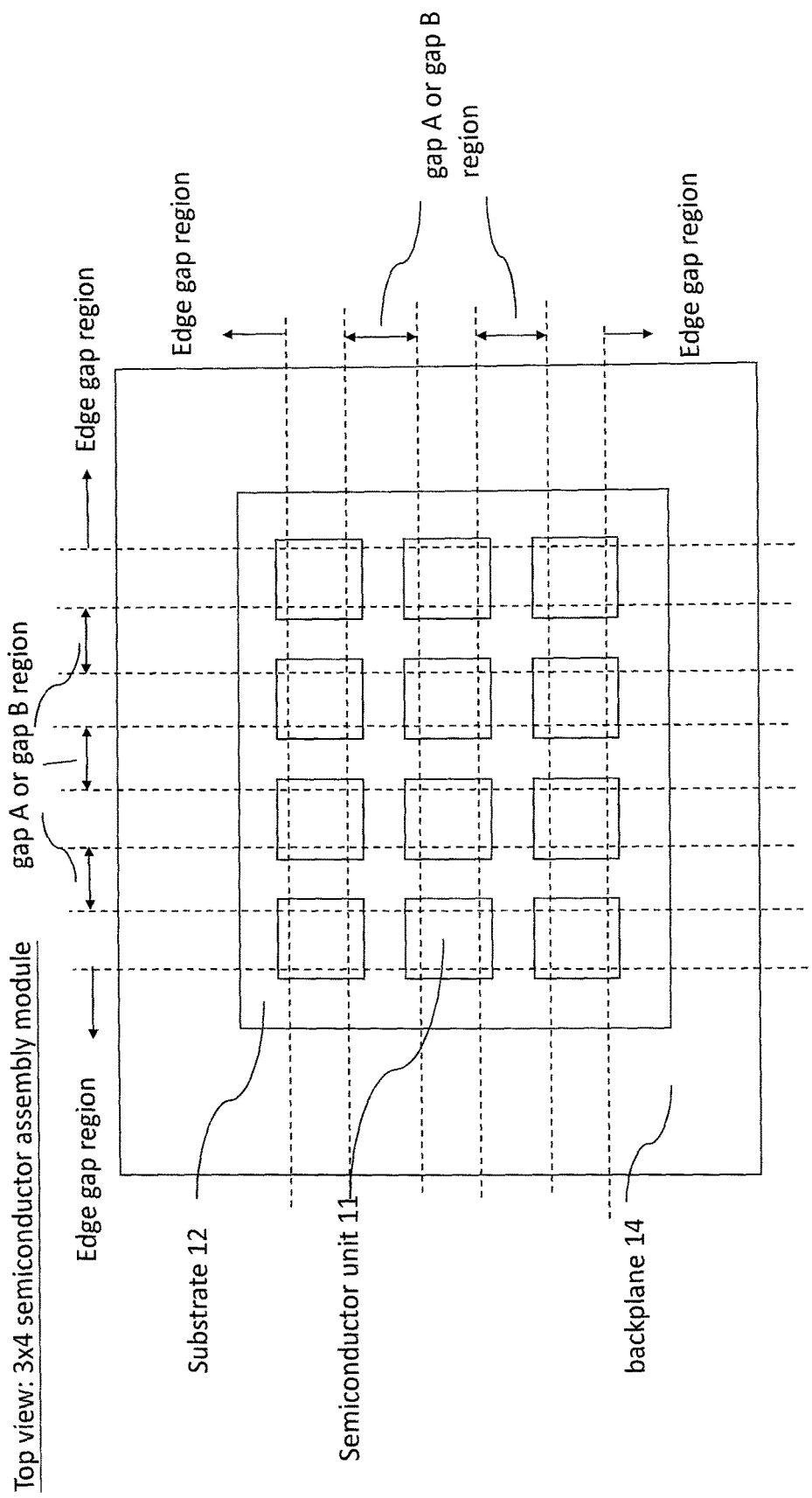
FIG. 2 is a top view for an example of 3×4 semiconductor assembly module.

FIG. 2 gives a top view for an example of 3×4 semiconductor assembly module. In FIG. 2, the size of backplane 14 is larger than that of the substrate 12. The substrate 12 is on the top, and the semiconductor units 11 are underneath of the substrate 12. The jointing layer 13 (is not shown in FIG. 2) underneath of the semiconductor units 11 as described in FIG. 1A and FIG. 1B. The gap-A region, gap-B region, edge gap region described in FIG. 1A, and FIG. 1B could be formed in the related position as shown in FIG. 2.

Figure 3C:
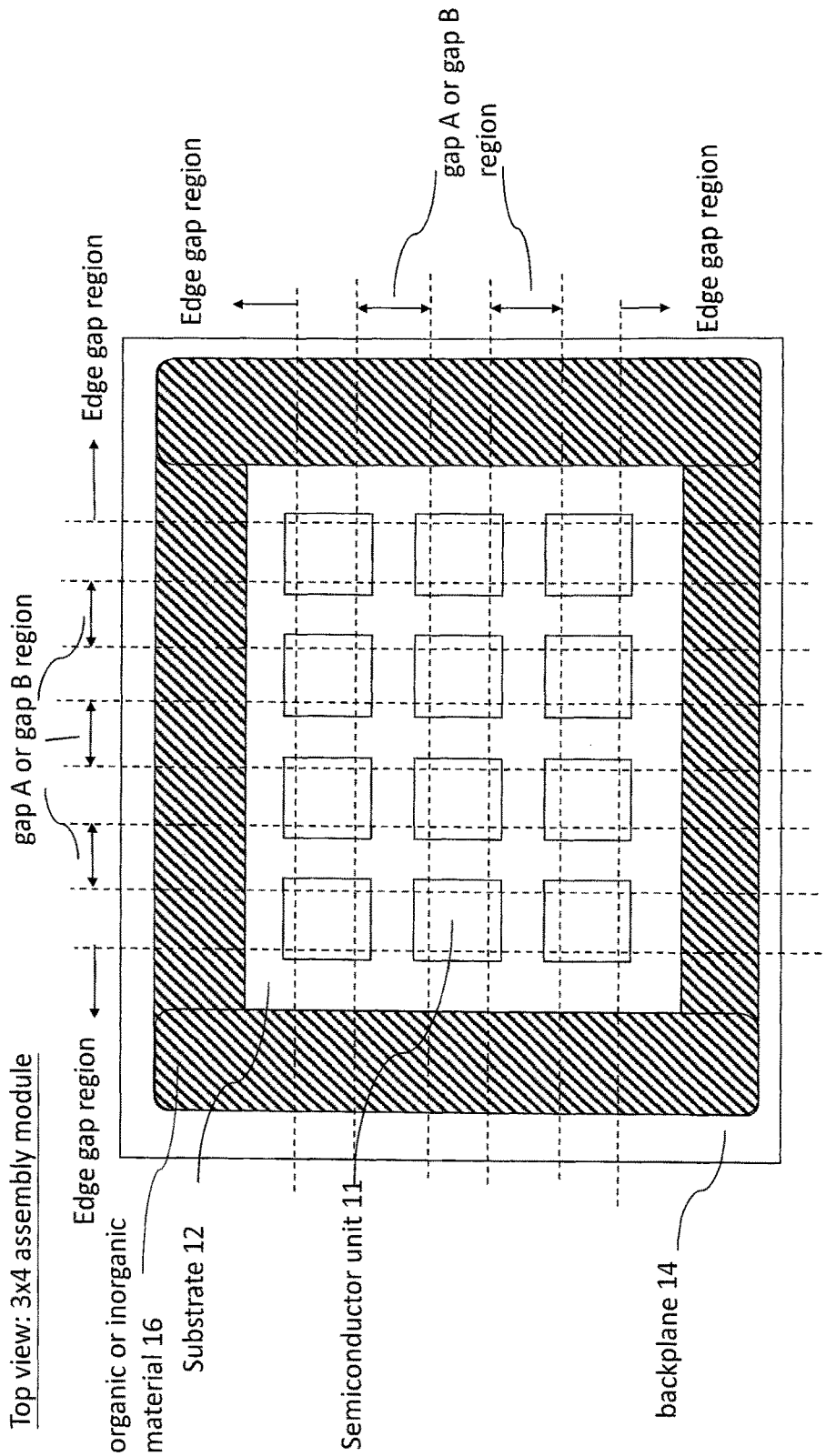
FIG. 3C is a top view of an organic or inorganic flowable material dispensed on the edge of the substrate, and on a portion of the backplane.

Please refer to FIG. 1A and FIG. 3A, FIG. 3A is a cross sectional view of the semiconductor assembly module (10a or 10b) after an organic or inorganic material (a liquid, a flowable material) 16 is dispensed on the edge of the substrate 12 in FIG. 1A structure. Please also refer to FIG. 1B and FIG. 3B, FIG. 3B is a cross sectional view of an organic or inorganic material 16 (a liquid, a flowable material) dispensed on the edge of the substrate 12 in FIG. 1B structure. For the top view of FIG. 3A and FIG. 3B, FIG. 3C is a top view of an organic or inorganic material 16 (a liquid, a flowable material) dispensed on the edge of the substrate 12 and dispensed on a portion of the backplane 14.

A filling method could be used to fill an organic or inorganic flowable material 16 into gap-A regions inside the Type-A semiconductor assembly module 10a or gap-B regions inside the Type-B semiconductor assembly module 10b. The gap regions including semiconductor units 11 and the sidewalls of the jointing layer 13 could be filled with the organic or inorganic flowable material 16. The filling method could be made by using different methods: an ultrasonic wave vibration method to deliver the flowable material from edge of the semiconductor assembly module into the inside gap regions, a liquid pressure method to provide the liquid pressure to press the flowable material from edge of the semiconductor assembly module into the inside gap regions, or compressive chamber method to generate a high internal acting gas pressure $P_{acting}$ to force the flowable material from edge of the semiconductor assembly module into the inside gap regions.

For the ultrasonic wave vibration method, the semiconductor assembly module could be immersing into the organic or inorganic flowable material container and put in a water of the ultrasonic generator (such as DELTA-D150). The ultrasonic wave could provide a high vibration frequency wave to the water to generate the high frequency wave and deliver the high frequency wave to vibrate the organic or inorganic flowable material inside container. The organic or inorganic flowable material could be vibrated and diffused into the inside gap regions of the semiconductor assembly module. Please note since high frequency wave energy delivery needed a liquid type material as a medium to transmit the high frequency wave, if one decides to use the ultrasonic wave vibration method, the selected organic or inorganic liquid flowable material needs to have relative low viscosity property.

For the high liquid pressure method, the semiconductor assembly module is put in a bath containing the organic or inorganic flowable material having sufficient depth h that produces sufficient liquid pressure P to force the organic or inorganic flowable material into the semiconductor assembly module gap regions; the equation for the liquid pressure:

$$P = h \cdot d \cdot g;$$

wherein, P is the pressure, h is the height (depth) of the liquid, d is the liquid density and g is acceleration of gravity.

In one embodiment, a compressive chamber 400 filling method could be used to fill the organic or inorganic material (a liquid, a flowable material) from the edge of the semiconductor assembly module into the inside gap regions. dispensing an organic or inorganic flowable material 16 on an edge of the semiconductor assembly module; The dispensing of the flowable material could be performed in air, or other gases environment, in atmosphere or reduced pressure environment $P_{gap}$; loading the semiconductor assembly module into a compressive chamber; introducing a gas into the compressive chamber to create high pressure environment inside the compressive chamber called $P_{chamber}$; In general, the compressive chamber pressure $P_{chamber}$ is higher than $P_{gap}$ creating a pressure gradient effect; utilizing the internal acting gas pressure $P_{acting}$ to force the organic or inorganic flowable material into the semiconductor assembly module gap regions; venting the compressive chamber to atmosphere pressure environment creating voids or air-gaps 17 in the semiconductor assembly module gap regions; removing the semiconductor assembly module (10a or 10b) from the compressive chamber 400; crosslinking the organic or inorganic flowable material 16 to be the partially cured (semi-cured) organic or inorganic material 16 by applying heat or photon energy; removing the partially cured organic or inorganic material 16 on the edge of the substrate 12 sidewall using mechanical or chemical means; performing a final curing step by applying heat and time to the semiconductor assembly module (10a or 10b) to cure the partially cured organic or inorganic material 16 to be stable solid.

Figure 4:
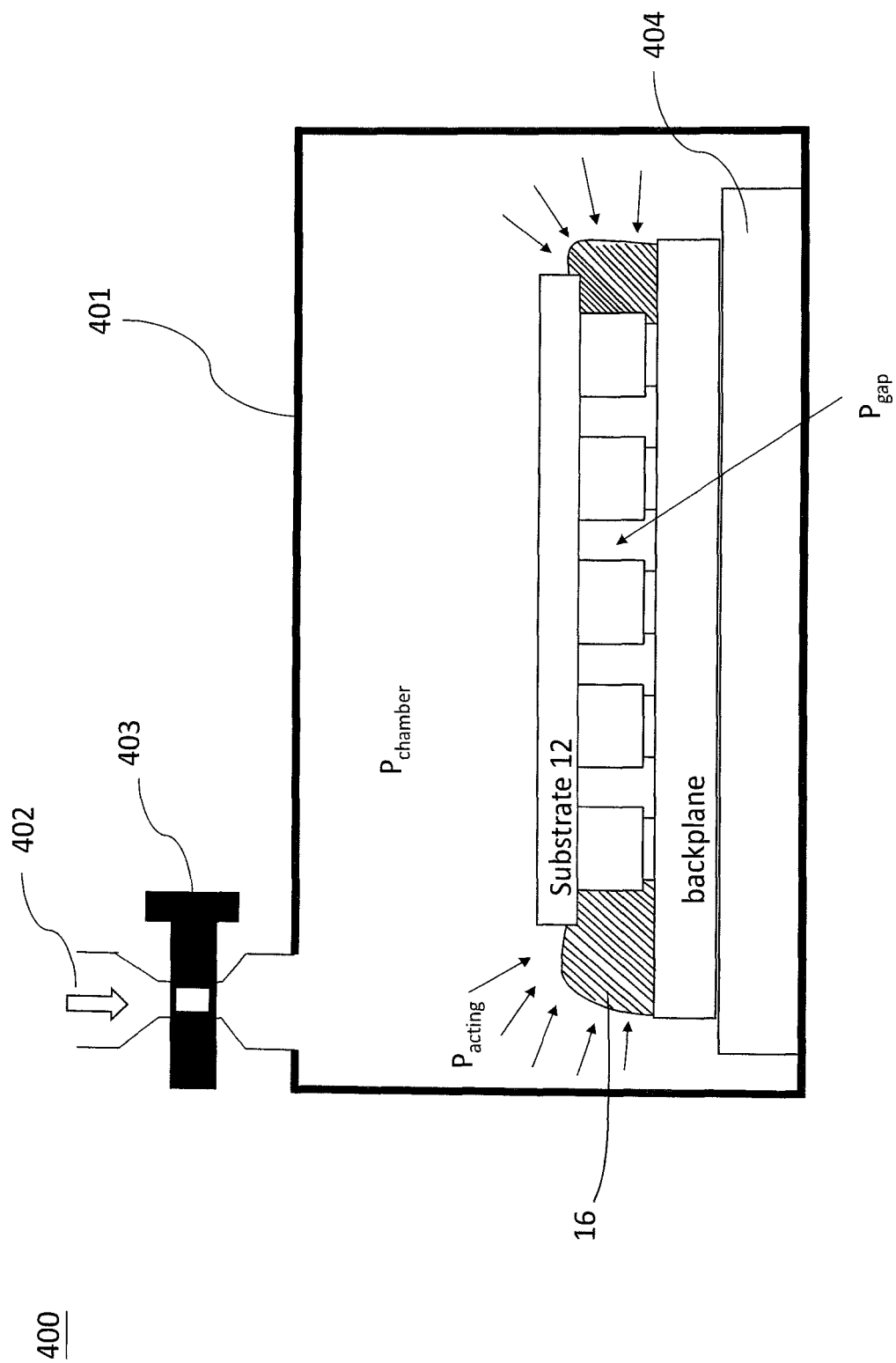
FIG. 4 is a scheme diagram of a compressive chamber.

A gas could be filling into the chamber to create a high internal acting gas pressure $P_{acting}$ condition inside the chamber. As shown in FIG. 4, FIG. 4 shows a scheme diagram of the compressive chamber. The compressive chamber 400 comprising a chamber 401 with a heating function, a gas-in port 402, a programmable controlling valve 403, a stage 404 in the chamber 401. The internal acting gas pressure $P_{acting}$ could be controlled by the programmable controlling valve 403. The internal acting gas pressure $P_{acting}$ could be increased by filling a gas; The internal acting gas pressure $P_{acting}$ could be reduced by venting the gas; FIG. 3A and FIG. 3B structure with dispensed organic or inorganic material could be loaded on the stage 404. By filling the gas into the chamber 401, a compressive pressure could be formed inside the chamber 401. Since the compressive pressure could provide an internal high pressure gas as a force direct acting on the edge of the organic or inorganic flowable material 16. The organic or inorganic flowable material 16 on the edge of the substrate 12 could be forced into the gap regions inside the semiconductor assembly module to fill the gap regions by using the internal acting gas pressure $P_{acting}$. Higher pressure of gas fill in to the compressive chamber 400 could generate more internal acting gas pressure $P_{acting}$ to force the organic or inorganic material to fill into deeper gap regions inside the semiconductor assembly module (10a or 10b).

After introducing a gas into the compressive chamber to create high pressure environment inside the compressive chamber and using the internal acting gas pressure $P_{acting}$ to force the organic or inorganic flowable material into the semiconductor assembly module gap regions; Please refer to FIG. 1A and FIG. 5A, FIG. 5A is the cross sectional view of the organic or inorganic flowable material 16 filled into all of the gap-A regions in the Type-A semiconductor assembly module. The organic or inorganic flowable material 16 is also covered to a portion of the substrate sidewall in the edge gap regions of the semiconductor assembly module; Please refer to FIG. 1B and FIG. 5B, FIG. 5B is the cross-sectional view of the organic or inorganic flowable material filled into all of the gap-B region in the Type-B semiconductor assembly module. The organic or inorganic flowable material 16 is also covered to a portion of the substrate sidewall in the edge gap regions of the semiconductor assembly module.

Figure 6:
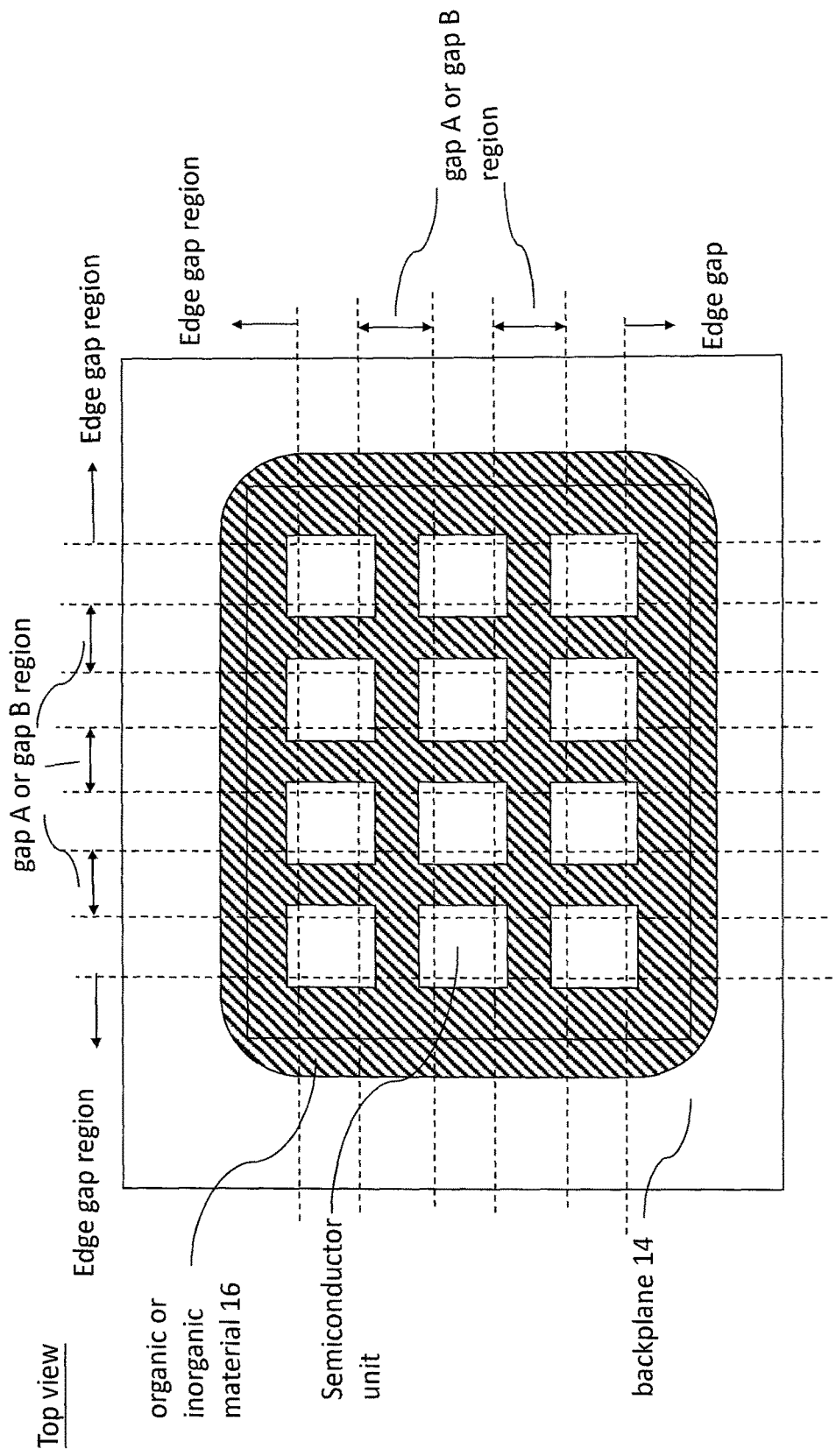
FIG. 6 is a top view of the organic or inorganic flowable material filling into all gap regions of the semiconductor assembly module.

Please refer to FIG. 5A and FIG. 5B, FIG. 6 is a top view of the organic or inorganic flowable material filling into all gap regions of the semiconductor assembly module. Please note that the organic or inorganic flowable material 16 could be also formed surround on the backplane 14 of the semiconductor assembly module and covered to a portion of the substrate sidewall of the semiconductor assembly module.

The organic or inorganic material 16 is a flowable material such as a liquid could be photosensitive or non-photosensitive properties. The organic or inorganic flowable material 16 could be dyeing by color chemical solutions. The organic or inorganic flowable material 16 could be semi cured or cured to be solid by using a thermal curing process, a UV curing (photon energy curing) process, or a IR curing process. The organic or inorganic flowable material 16 could be selected to form as hard properties after curing, such as gels, glues, sol-gels, epoxy, silicone, phenyl-silicone; photosensitive resister, UV cure able glues and thermal cure able glues. The organic or inorganic flowable material 16 could be also selected to form as stretch properties after curing, such as gels, glues, epoxy, polyimide, silicone, methyl-silicone, cohesive gels, silicone gels, PMMA, photosensitive resister, UV or thermal cure able glues. The organic or inorganic flowable material 16 could be mixed with micron or submicron insulators, such as $TiO_2$, $Al_2O_3$, $SiO_2$, sol-gel, or any suitable powder. The organic or inorganic liquid could be mixed with Nano-metals, such as Ni, Cu, Ag, Al and Au.

Please also refer to FIG. 4, the compressive chamber 400 could provide a high internal acting gas pressure $P_{acting}$ environment by filling a gas into the compressive chamber to create high pressure environment inside the compressive chamber; using the internal acting gas pressure $P_{acting}$ to force the organic or inorganic flowable material from the edge of substrate 12 to the gap regions of the semiconductor assembly module. The chamber pressure could be released to relative lower pressure or atmosphere environment by the chamber controlling valve venting; In some particular condition, the viscosity of the organic or inorganic flowable material 16 could be diluted to be a lower viscosity property to force the flowable material into a longer distance of the gap regions of the semiconductor assembly module. The filling of the chamber gas could be selected from air (atmosphere), Nitrogen, Oxygen, Argon, Ammonia, Carbon dioxide, Chlorine, or Forming gas ($N_2+H_2$). In some particular condition, high thermal conductivity of the gas such as Helium and Hydrogen could be selected in the chamber 401 to quickly transfer the heat to the semiconductor assembly module. The organic or inorganic flowable material inside the gap regions of the semiconductor assembly module could be partial cured (semi cured) by applying a heat or a photon energy; Furthermore, the organic or inorganic flowable material inside the gap regions of the semiconductor assembly module could be completely cured to be stable solid by applying heat up to the curing temperature and curing process time.

In one embodiment of curing the organic or inorganic flowable material 16 to be stable solid, the chamber 401 with high chamber pressure could be kept by sealing the programmable controlling valve 403. For curing the organic or inorganic flowable material 16 to be stable solid, the chamber 401 could be then heating up to the curing temperature of the organic or inorganic flowable material 16. Based on ideal gas equation of state expressed by:

$$PV=NKT;$$

wherein $P=P_{chamber}$ is the pressure of the chamber, the V is the volume of the chamber 401, N is the numbers of gas, K is a constant and T is the temperature of the chamber 401.

Therefore, the chamber pressure $P_{chamber}$ could be increased when increasing the chamber temperature (T). The $P_{gap}$ is also linear dependent with the temperature (T). Therefore, the $P_{acting}$ in the chamber 401 could be changed during heating up the chamber 401. The higher $P_{acting}$ should be sufficient to keep the organic or inorganic flowable material staying inside the gap regions while curing. For example, the chamber pressure could be set to $P_{chamber}$=5 atm by filling the gas at room temperature; the organic or inorganic flowable material 16 curing temperature is 200° C. The target temperature to cure the organic or inorganic flowable material 16 is to heat up the chamber to a temperature higher than that of 200° C. When the chamber 401 heating up from room temperature to over 200° C., the chamber pressure $P_{chamber}$ could be a linear increasing from 5 atm to be about 20 atm or more. To keep the curing temperature at 200° C. and maintain the internal acting gas pressure $P_{acting}$ inside the chamber 401 such that the organic or inorganic flowable material staying inside the gap regions while curing; after a certain curing time, the organic or inorganic flowable material 16 could be substantially cured to be stable solid in all the gap regions of the semiconductor assembly module. Then, nature cooling or programmable controlling cooling could be followed to cool down the chamber 401 from a high temperature (e.q. of 200° C.). down to the room temperature. The chamber pressure $P_{chamber}$ could be completely released after curing at high temperature (e.q. of 200° C.), or the chamber pressure $P_{chamber}$ could be completely released after cooling down to the room temperature. Please note that, when curing the organic or inorganic flowable material, an out-gassing effect of the organic or inorganic flowable material 16 could be generated to create voids or air-gaps in gap regions. However, the out-gassing of air-gaps could be trapped without expansion due to the high internal acting gas pressure $P_{acting}$ condition in the chamber 401.

In another one embodiment of curing the organic or inorganic flowable material to be stable solid, the initial internal acting gas pressure $P_{acting}$=$P1_{acting}$ inside the chamber 401 could be controlled by the chamber pressure ($P_{chamber}$=$P1_{chamber}$) to force the organic or inorganic flowable material into the gap regions of the semiconductor assembly module. The chamber pressure $P_{chamber}$ could be then reduced to $P2_{chamber}$ ($P2_{chamber}$<$P1_{chamber}$) by the chamber controlling valve 403 for curing process. For example, the initial chamber pressure $P_{chamber}$ could be 5 atm (e.q. $P_{chamber}$=$P1_{chamber}$=5 atm). Before heating up the chamber 401 to the curing temperature of the organic or inorganic flowable material, the chamber pressure $P_{chamber}$ could be reduced to a certain pressure $P_{chamber}$=$P2_{chamber}$ that under 5 atm (e.g. $P_{chamber}$=$P2_{chamber}$<$P1_{chamber}$) by venting gas from the chamber. Under a $P2_{chamber}$ condition, the internal acting gas pressure $P_{acting}$=$P2_{acting}$ could be performed to retain the organic or inorganic flowable material 16; Then heating up the chamber temperature to the target organic or inorganic flowable material 16 curing temperature (e.q. 200° C.) to cure the organic or inorganic flowable material 16 to be stable solid. When curing the organic or inorganic flowable material 16, an out-gassing effect could be generated due to $P2_{acting}$<$P1_{acting}$ to create more voids or air-gaps in the gap regions of the semiconductor assembly module.

In another embodiment of curing organic or inorganic flowable material to be solid, the initial internal acting gas pressure $P_{acting}$ in the compressive chamber 401 could be controlled to a pressure $P_{acting}$=$P1_{acting}$ to force the organic or inorganic flowable material into the gap regions of the semiconductor assembly module. The internal acting gas pressure $P_{acting}$ could be then reduced to $P_{acting}$=$P2_{acting}$ ($P2_{acting}$<$P1_{acting}$) by the chamber controlling valve 403 for curing process. In the relative lower internal acting gas pressure $P2_{acting}$ environment, the organic or inorganic flowable material 16 inside gap regions of the assembly module formed by the initial internal acting gas pressure $P1_{acting}$ could be then partially flow out and diffuse outside to edges of the substrate; expansion of the voids or air-gaps in gap regions of the semiconductor assembly module could be created; The chamber temperature could be heat up to a certain temperature which is less than that of the curing temperature of the organic or inorganic flowable material to form a partial cured (semi cured) organic or inorganic flowable material. After heating up for a certain time, the organic or inorganic flowable material could be semi cured to be solid and remained inside the gap regions of the semiconductor assembly modules; the semi cured organic or inorganic material is a layer covered on the exposed surface inside the gap regions of the semiconductor assembly module.

In another one embodiment of curing organic or inorganic flowable material to be stable solid, the compressive chamber 401 could be controlled to $P_{chamber}$=$P1_{chamber}$ (e.q. $P1_{chamber}$=5 atm) to provide an internal acting gas pressure $P1_{acting}$ to force the organic or inorganic flowable material into the gap regions of the semiconductor assembly module. The semiconductor assembly module could be then loaded out from the compressive chamber 401 to 1 atm atmosphere environment. The organic or inorganic flowable material 16 filled in semiconductor assembly module gap regions could be then partially flow out and diffuse outside to edges of the substrate; more expansion of the voids or air-gaps in gap regions of the semiconductor assembly module could be created; Applying a heat to heat up the semiconductor assembly module to the curing temperature, the organic or inorganic flowable material could be cured to be a stable solid and remained inside the gap regions of the semiconductor assembly modules under 1 atm atmosphere environment; the cured organic or inorganic material is a layer covered on the exposed surface inside the gap regions of the semiconductor assembly module.

In general, the high internal acting gas pressure $P_{acting}$ could force the organic or inorganic flowable material 16 from the edge of substrate 12 into the gap regions of the semiconductor assembly module. In some particular condition, the organic or inorganic flowable material 16 could not be able to be forced by the internal acting gas pressure $P_{acting}$ to a far distance inside the semiconductor assembly module gap regions due to not providing enough internal acting gas pressure $P_{acting}$ by the compressive chamber pressure $P_{chamber}$. Therefore, a microscope could be performed to view from the top of the substrate to inspect the fill-in behavior of the organic or inorganic flowable material. If the organic or inorganic flowable material 16 could not be forced to the far distance inside the semiconductor assembly module gap regions, the organic or inorganic flowable material 16 could be dispense again to the edge of the substrate 12 and repeat the internal acting gas force-in process again by applying another much higher internal acting gas pressure $P_{acting}$ condition by increasing the chamber pressure $P_{chamber}$. In another aspect, the viscosity of the organic or inorganic flowable material 16 could be diluted to a relative lower viscosity for easier force-in into a longer distance to cover the all gap regions of the semiconductor assembly module. The covering layer of the dilute organic or inorganic flowable material 16 inside the semiconductor assembly module gap regions may not be enough due to the relative lower viscosity property. Thus, multiple times of internal acting gas pressure $P_{acting}$ force in process steps could be applied to achieve enough covering layer purpose to cover all semiconductor assembly module gap regions. In another aspect, for multiple internal acting gas pressure $P_{acting}$ force-in process steps, the viscosity of the organic or inorganic flowable material 16 could be increased gradually to form enough covering layer inside gap regions of the semiconductor assembly module.

Figure 7:
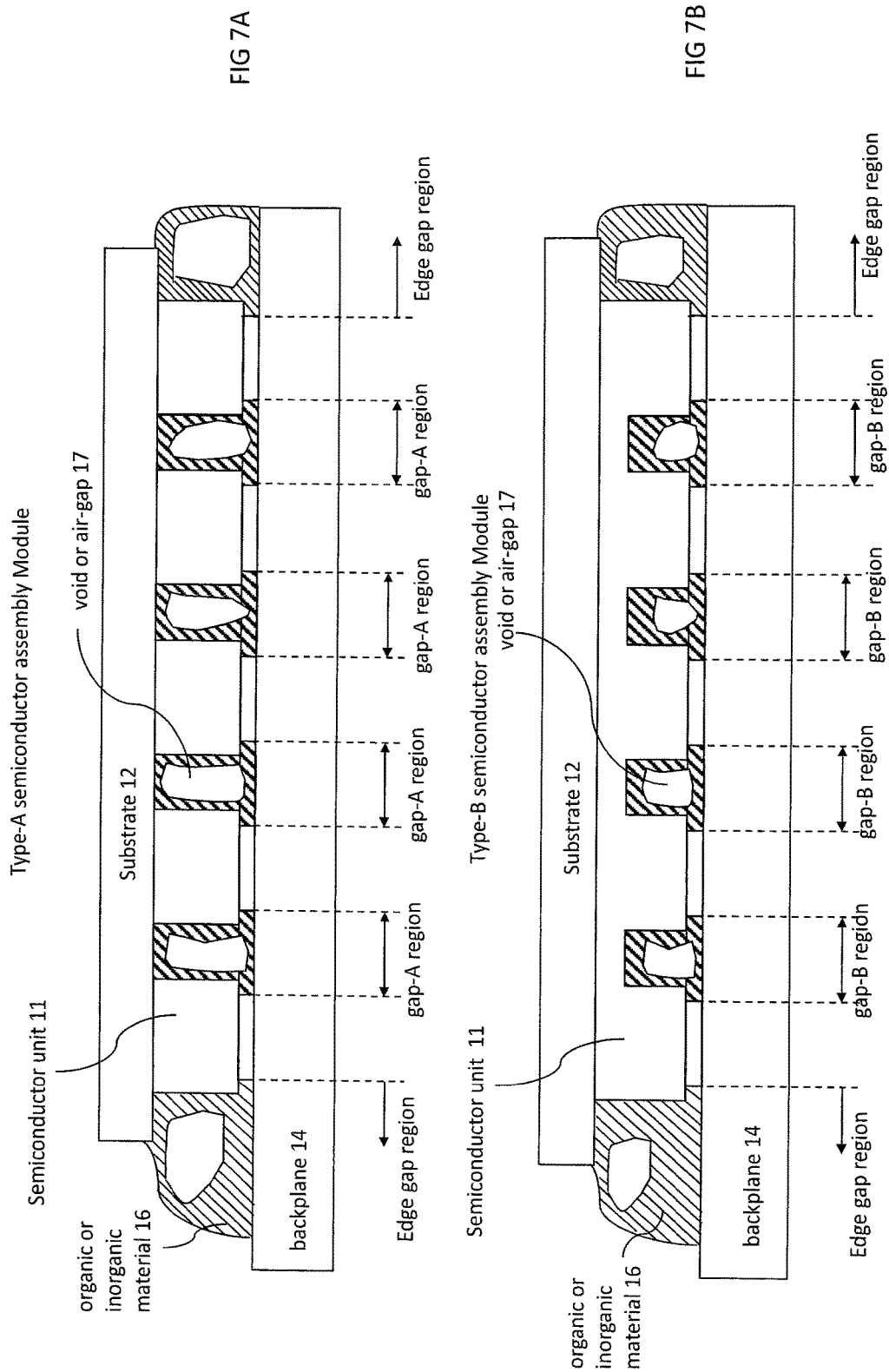
FIG. 7A is the organic or inorganic material in all the gap-A regions of the Type-A semiconductor assembly module.
FIG. 7B is the organic or inorganic material in all the gap-B regions of the Type-B semiconductor assembly module.
Figure 8:
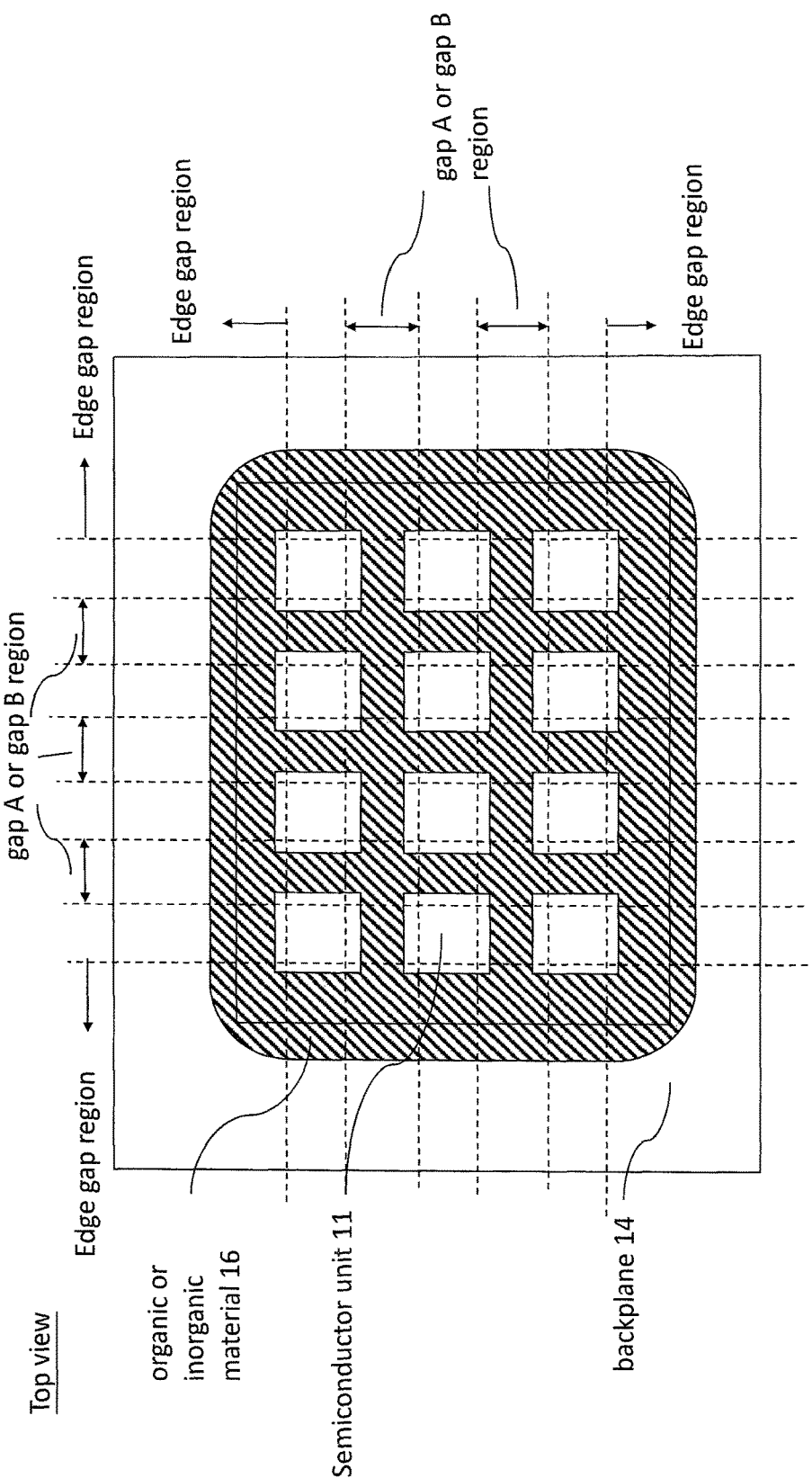
FIG. 8 is a top view of the organic or inorganic material filled in semiconductor assembly module gap regions.

Please refer to FIG. 5A and FIG. 7A. FIG. 7A shows the organic or inorganic flowable material could be formed as a layer covered to all of the gap-A regions in the Type-A semiconductor assembly module. Please note that, the organic or inorganic material 16 on the edge of the substrate 12 could be cover a portion of the edged substrate sidewall. A void or an air-gap 17 formed in the organic or inorganic flowable material 16 on the edge gap regions could be due to the out-gassing effect of organic or inorganic martial 16. Please refer to FIG. 5B, and FIG. 7B. FIG. 7B shows the organic or inorganic flowable material 16 could be formed as a layer covered to all of the gap-B regions in the Type B semiconductor assembly module. Please note that the organic or inorganic flowable material 16 on the edge of the substrate could be cover a portion of the edged substrate sidewall. A void or an air-gap 17 formed in the organic or inorganic flowable material 16 on the edge gap regions could be due to the out-gassing effect of organic or inorganic material. FIG. 8 is a top view of the organic or inorganic flowable material covered to the semiconductor assembly module in all semiconductor assembly module gaps. In the gap (gap-A or gap-B) regions, a void or an air-gap 17 (could not be illustrated from the top view) could be formed inside an organic or inorganic flowable material in gap regions. Please note that the organic or inorganic flowable material 16 on the edge of the substrate 12 could be covered on a portion of the edged substrate 12 sidewall and on a portion of the backplane 14.

The organic or inorganic flowable material 16 on the edge of the substrate sidewall and a portion of the backplane could be substantially removed by using a chemical solution or mechanical means. For example, the organic or inorganic flowable material 16 could be a photo resist material such as AZ-series, or NR-series etcetera the commercial common used photoresist, the photoresist could be cured at a certain temperature, and could be then removed by acetone or by the removal of photoresist chemicals. Please note that, the chemical solution could not be able to get into the gap regions due to no internal acting gas pressure $P_{acting}$ applying. In one embodiment to remove the edged photoresist, a cotton with chemical solution could be slightly touch the edge of the substrate sidewall and the backplane multiple times to remove the photoresist. In some particular, the photoresist could be exposure by a UV light to create a crosslink effect before stable solid curing to enhance the photoresist strength.

Figure 9:
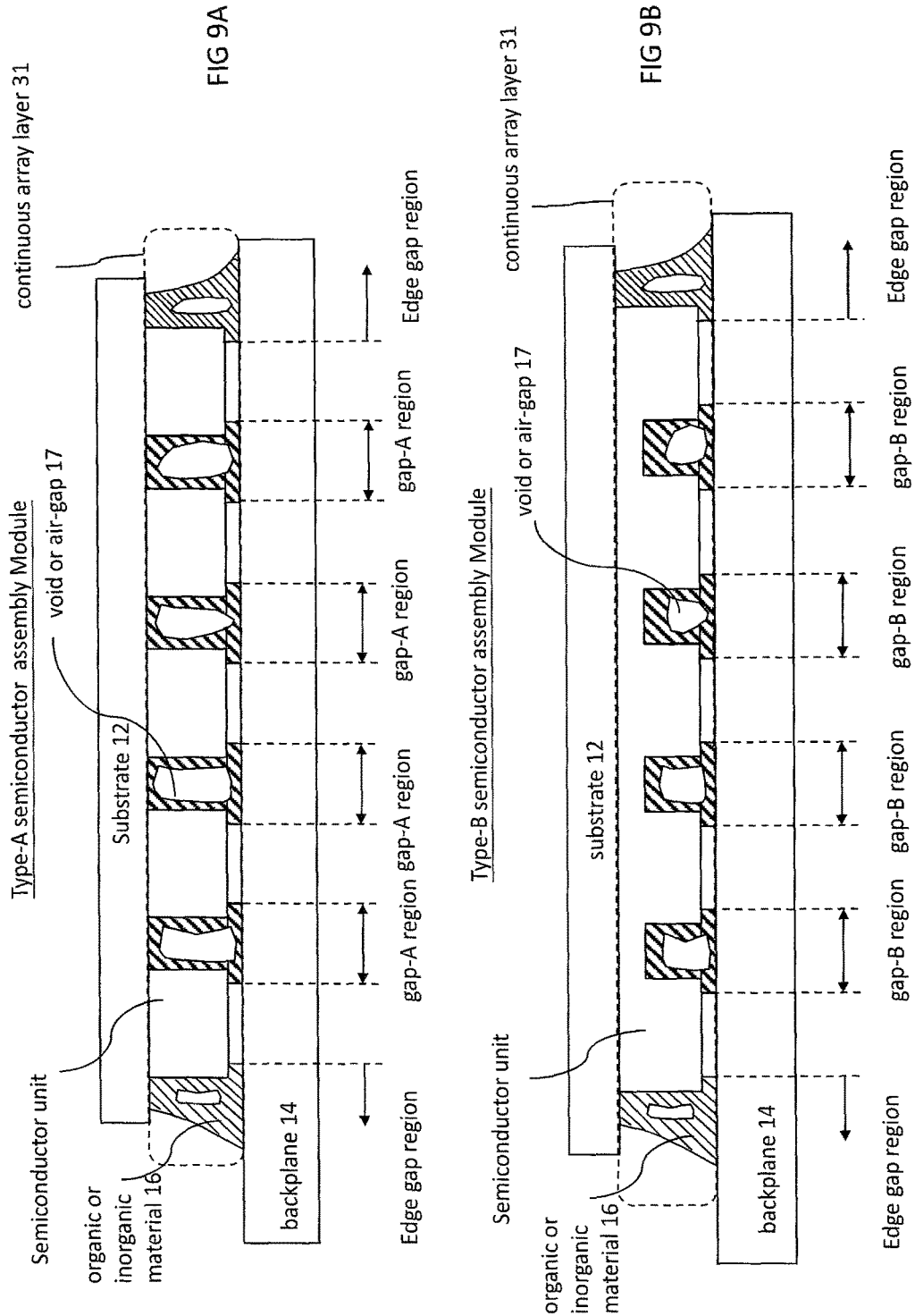
FIG. 9A is to remove a portion of the organic or inorganic material on the edge of the substrate sidewall in the edge gap region.
FIG. 9B is to remove a portion of the organic or inorganic material on the edge of the substrate sidewall in the edge gap region.

After filling and curing the organic or inorganic flowable material in the gap regions and edge gap regions, regarding to the Type-A semiconductor array module, please refer to FIG. 5A, FIG. 7A and FIG. 9A, FIG. 9A shows a portion of the semi-cured or cured organic or inorganic material on the edge of the substrate sidewall in the edge gap regions could be removed by mechanical or chemical means. In the edge gap regions, a portion of the organic or inorganic material that is underneath of the edge of the substrate is remained to provide a property to hold, grip and connect the semiconductor units on the edge of the array module 15. Please note that, the organic or inorganic material 16 covered on the sidewall of the substrate could be substantially removed. In similar, regarding to the Type-B semiconductor array module, please refer to FIG. 5B, FIG. 7B and FIG. 9B, FIG. 9B shows a portion of the semi-cured or cured organic or inorganic material on the edge of the substrate sidewall in the edge gap region could be removed by mechanical or chemical means. In the edge gap region, a portion of the organic or inorganic material that is underneath of the edge of the substrate is remained to provide a property to hold, grip and connect the semiconductor array units on the edge of the array module 15. Please note that, the organic or inorganic material 16 covered on the sidewall of the substrate could be substantially removed.

Figure 10:
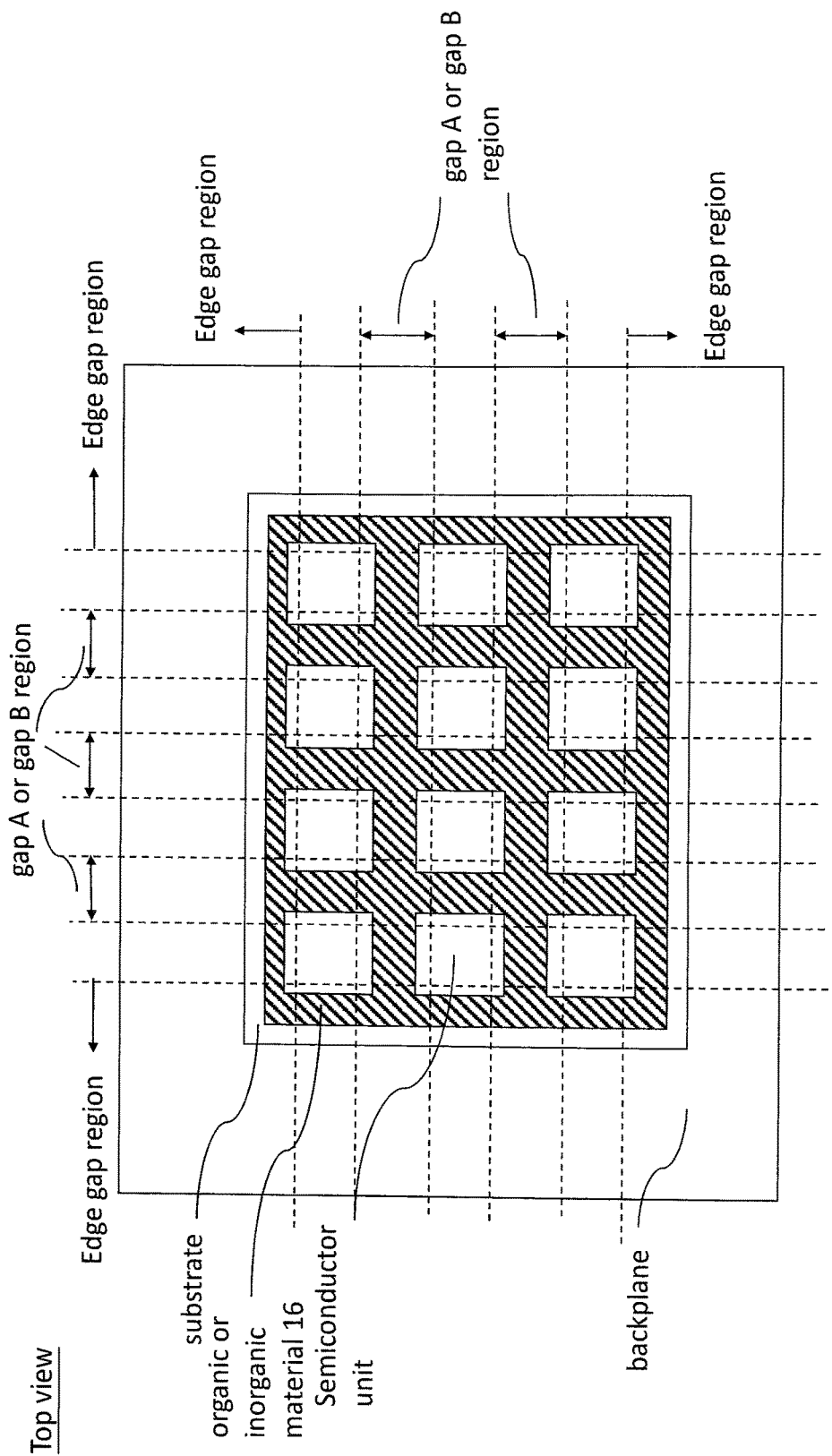
FIG. 10 is a top view of the organic or inorganic material fill in the semiconductor assembly module gap regions.
Figure 15:
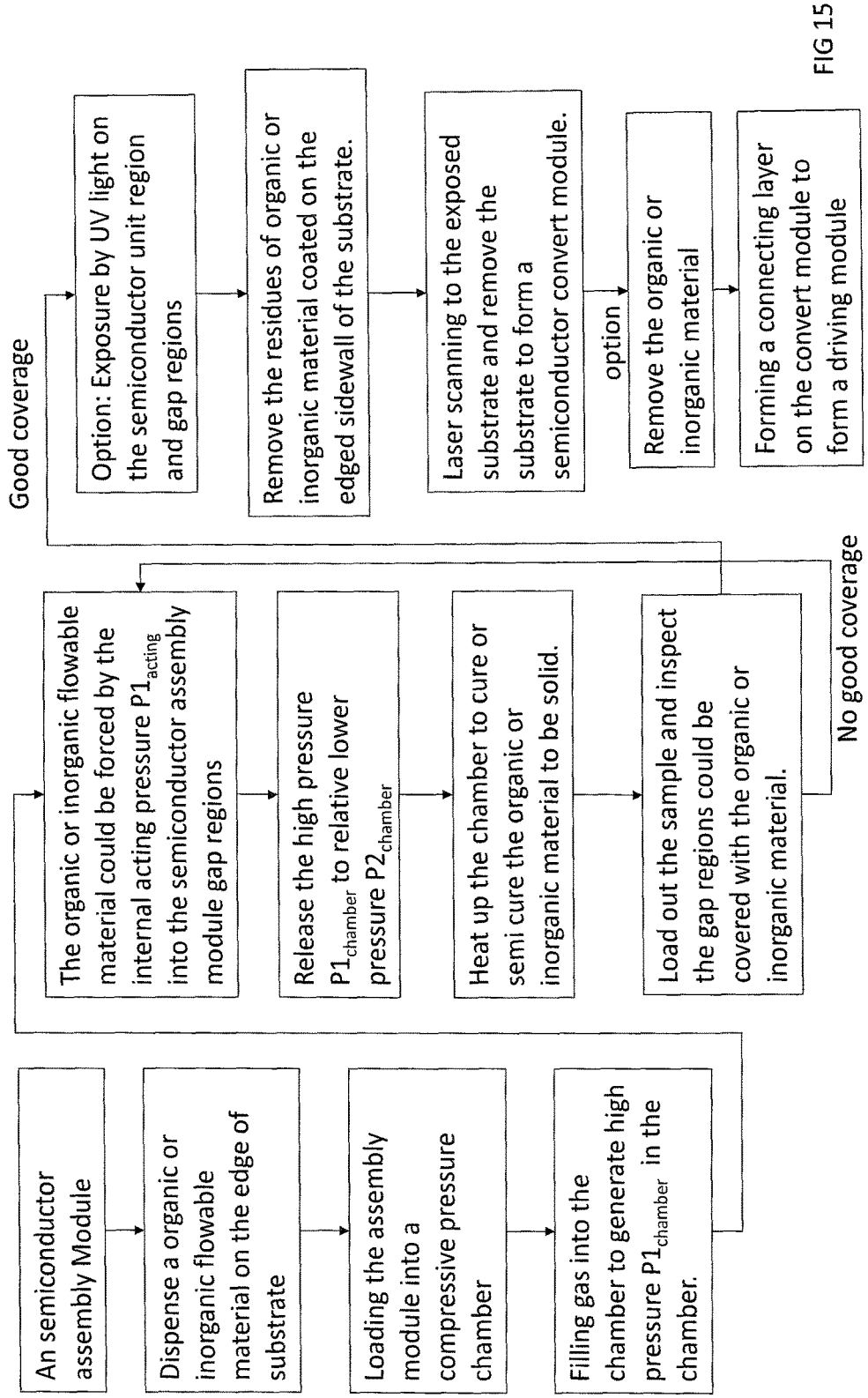
FIG. 15 is a process scheme diagram of one embodiment method to fabricate the semiconductor driving module.

FIG. 10 is a top view of the organic or inorganic material covered to the semiconductor assembly module in gap regions and a portion of the edge gap regions. In the gap (gap-A or gap-B) regions, voids or air-gaps 17 (could not be illustrated from the top view) could be formed inside the organic or inorganic material 16 in all assembly gap regions. Please note that, the organic or inorganic material 16 could only remain underneath of the substrate edge and not cover to the sidewall of the substrate.

For the properties of the organic or inorganic flowable material 16, in particular, the organic or inorganic flowable material 16 after UV light exposure could be a difficult removal material called a "hard organic or inorganic material". The "hard organic or inorganic material" could be photosensitive based material such as photosensitive-epoxy or photosensitive-silicone, or photosensitive-polyimide. The "hard organic or inorganic material" could be crosslink by UV light exposure to be a relative hard property. Now referring to the above methods of filling the organic or inorganic flowable material into the gap regions inside the semiconductor assembly module 10, the curing steps for the particular material of the "hard organic or inorganic material" could be modified as follows. The "hard organic or inorganic material" is initially a flowable material and could be dispensed on the edge of the substrate 12 of the semiconductor assembly module 10; load the semiconductor assembly module into the compressive chamber 400. The compressive chamber 400 provides a high internal acting gas pressure $P_{acting}$ to force the flowable "hard organic or inorganic material" into the semiconductor assembly module gap regions. After high internal acting gas pressure $P_{acting}$ forced in process, the semiconductor assembly module could be loaded out to the air at 1 atm atmosphere. voids or an air-gaps 17 could be formed in the gap regions and the edge gap regions. The semiconductor assembly module could be exposure by a UV light exposure to the assigned region. The assigned region for the UV light exposure is the region underneath the substrate 12 including a portion the edge gap regions and the gap regions inside the semiconductor assembly module. The region outside of the assigned region could be patterned by a mask to shield the UV light exposure. The UV light could only illuminate to exposure the flowable "hard organic or inorganic material" in the assigned region through the substrate 12. The flowable "hard organic or inorganic material" in this assigned region could be crosslink to be solid with a relative hard property and difficult to be removed by chemical solutions. In the region that is outside of the assigned region, the "hard organic or inorganic material" could be removed by a chemical solution due to non-UV light exposure to perform the crosslinking. The semiconductor assembly module could be then cured by heat up to a certain temperature. The temperature could be selected to be over the curing temperature of the "hard organic or inorganic material" to create a hard cured property, or the temperature could be selected to be below the curing temperature of the "hard organic or inorganic material" to generate semi-cured flexible, stretch, soft properties.

Please refer to FIG. 9A and FIG. 9B, the organic or inorganic material in the semiconductor assembly module gap regions could provide a flexible, stretch, soft characteristics to hold, grip and connect the semiconductor units 11 and the jointing layer 13 to form an "continuous array layer 31" on the backplane. The semiconductor units 11 connected by the organic or inorganic material could strengthen the semiconductor assembly module to avoid a further physical violent process such as substrate 12 removal process. In another aspect, the organic or inorganic material in the semiconductor assembly module gap regions could provide a hard property to hold, grip and connect the semiconductor units 11 and the jointing layer 13 to form the "continuous array layer 31" on the backplane. The semiconductor units 11 and the jointing layer 13 connected by the organic or inorganic material could enhance the semiconductor assembly module structure for further process such as substrate 12 removal process.

Please refer to FIG. 9A and FIG. 9B, the substrate 12 of the semiconductor assembly module (10a, or 10b) could be removed to form a semiconductor convert module. Moreover, FIG. 11A shows the Type-A semiconductor convert module, and FIG. 11B shows the Type B semiconductor convert module.

The substrate could be removed through different technologies such as laser irradiation lift-off technology, grinding substrate technology, chemical wet etching technology, planarization technology, and mechanical removal technology. Please note that, when substrate removal is performed through laser irradiation technology, the semiconductor units and organic or inorganic material are laser irradiation decomposable materials.

For the grinding, planarization, and mechanical removal technologies, a violent physical force to remove the substrate is required. The "continuous array layer 31" on the backplane is a completely connecting compact structure. The completely connecting compact structure could provide enough strength to keep the whole structure of the semiconductor assembly module more robust. The semiconductor units could have minimized damage before and after the violent substrate removal process such as grinding, planarization and mechanical removal process.

For the chemical wet etching technology, the substrate will be removed or etched by a chemical solution. The "continuous array layer 31" is a compact continuous layer to minimize the chemical solution penetration. When utilizing the chemical solution to remove the substrate, the continuous compact "continuous array layer 31" could protect the entire structures of the semiconductor assembly module to minimize the chemical damage.

For the laser irradiation lift off technology, the laser could irradiate through the substrate and interacting on the interface of the material underneath the substrate. The interfacial layer underneath of the substrate could be a decomposable material. In the semiconductor assembly module, the continuous compact "continuous array layer 31" is a robustness layer. In other words, the organic or inorganic material in the semiconductor assembly module gap regions is to hold, grip, connect the semiconductor units. When applying the laser irradiation lift-off process, the organic or inorganic material in the semiconductor assembly module gap regions including voids or air-gaps could provide a buffer effect as a damper to release the stress acting on the semiconductor units. The substrate could be delaminated to remove by additional physical force after performing the laser irradiation lift-off process. The semiconductor units in the "continuous array layer 31" has minimize or almost no damage before and after laser irradiation lift-off and physical force delaminate process.

In one specific embodiment for laser irradiation lift off technology, the laser beam could be controlled to be a circle beam or a square beam. The laser beam could be overlapping scanning; the overlapping region of the laser beam could be controlled to be less than 90% beam size. The size of the laser beam could be controlled smaller than that of a semiconductor unit size. The laser beam could be scanned by a line direction scanning. The laser beam could be scanned along the edge of the semiconductor assembly module to provide a linear alignment decomposition from one edge gap regions to the another edge gap regions. The purpose of the along alignment laser scanning is to provide a gentle decomposition of the interfacial layer and symmetry to the connecting structure. The interfacial layer of the symmetry array module in the semiconductor assembly module could be decomposed in sequence. Thus, the connecting structure underneath of the substrate could be delaminated linearly from the substrate by the laser irradiation without creating damage. In another one embodiment, the size of the semiconductor unit could be smaller than that of the laser beam size. In this case, the laser beam size could be adjusted to a beam size which could be a size just cover multiple semiconductor units as a selection.

Please refer to FIG. 9A and FIG. 9B, for the laser irradiation lift-off substrate process, the laser beam could be transparent through the substrate to decompose the interfacial semiconductor layer underneath of the substrate. The laser irradiation beam could also decompose the interfacial organic or inorganic material layer underneath of the substrate 12. Please note that, the laser irradiation beam to decompose the interfacial layer could create a violent explosion in a local region. For example, a nitride based semiconductor material, the nitride compound semiconductor could be decomposed to generate the nitrogen gas explosion and spray to a local micro region. A local violent vibration could be enabled by the nitrogen gas explosion to be a shock wave. The vibration shock wave could damage the semiconductor unit to be crack or micro crack. The voids or an air-gaps 17 in the semiconductor assembly module gap-A regions could provide a damper effect to absorb or buffer the vibration shock wave. In another one particular advantage, the organic or inorganic material 16 filled or covered the semiconductor assembly module gap regions could provide a laser beam STOP zone (region) to protect the potential laser beam ablation damage of the circuitry on the backplane 14.

After the substrate removal, referring to FIG. 11A, the semiconductor units 11 and the organic or inorganic material 16 could be at the substantially same height level plane. A continue layer could be formed in the gap-A regions. The substantially same height level plane could be very useful for further process steps required especially for same height level required structures fabrication.

Please refer to FIG. 9B, for the laser irradiation substrate removal technology, the laser beam could transparent through the substrate to decompose the interfacial semiconductor layer underneath of the substrate 12. Please note that, FIG. 9B structure has a continue semiconductor layer in the gap-B region. The laser irradiation beam to decompose the semiconductor interfacial layer of the semiconductor unit could create a violent explosion in a local micro region. For example, a nitride based semiconductor material, the nitride compound semiconductor could be decomposed to generate the nitrogen gas explosion to spray to a local micro region.

A local micro violent vibration could be enabled by the nitrogen gas explosion to be a shock wave. The vibration shock wave could damage the remained semiconductor layer in the gap-B region and the semiconductor units to be crack or micro crack. In particular, FIG. 9B, the Type-B semiconductor assembly module, the uneven structure combines the semiconductor units and the thinner semiconductor layer remained in the gap-B regions is a weak structure. The weak structure might not sustain the violent vibration shack wave. The voids or air-gaps of the organic or inorganic material in the semiconductor assembly module gap-B regions could provide a damper effect (air gap as a buffer region) to absorb and buffer the vibration shock wave in the gap-B regions.

After the substrate removal, referring to FIG. 11B, the remained semiconductor layer is at the substantially same height level plane. A continue compact layer could be formed in the gap-B regions. The same height level plane could be very useful for further process required especially for same height level required structures fabrication.

In the particular case of the laser irradiation lift-off substrate, the method to fill the organic and inorganic material in semiconductor assembly module gap regions to form an enhanced semiconductor assembly module could be utilized to any suitable application semiconductor devices fields such as semiconductor light emitting array unit display (micro LED display), touch panel, light emitting diode application, backlight unit (BLU) of liquid crystal display (LCD), liquid crystal on silicon (LCoS), solid state lighting, micro engineering mechanical system, high power devices, optical interconnection used vertical cavity surface emitting laser (VCSEL), solar cell, battery, bio array sensor and other suitable semiconductor devices application. In particular, several embodiments in flexible semiconductor devices such as flexible semiconductor light emitting array unit display, flexible solar cell, flexible battery (flexible battery), flexible light emitting diode, flexible paper lighting, flexible solid state lighting, flexible sensors, flexible panels, flexible electronics, flexible optical interconnection, flexible high power devices, the forming of the organic or inorganic material in semiconductor assembly module gap regions and utilizing laser irradiation lift-off process to form a semiconductor convert module with a flexible backplane could be very useful methods to protect the semiconductor units completely and saving cost.

In one embodiment, referring to FIG. 11A and FIG. 11B, additional chemical solution treatment or dry etching process is applied to the top surface semiconductor units in the FIG. 11A, and FIG. 11B structure to remove partial of the semiconductor layer of the semiconductor units. Please note that, the top surface of the FIG. 11A structure is a continuous plane which consists the semiconductor layer of the semiconductor units and the organic or inorganic material in the gap-A regions to form a continuous array layer 31; The continuous plane could provide a well protection structure in the gap-A regions to protect the sidewall of semiconductor units in the gap-A region and the backplane underneath of the gap-A regions not to be damaged when applying the additional chemical wet etching or dry etching process.

FIG. 12 is a top view of the organic or inorganic material fill in the edge gap regions and gap regions of the semiconductor convert module. In the gap regions, voids or air-gaps (could not be illustrated from the top view) could be formed between top organic or inorganic material layer and bottom organic or inorganic material layer. Please note that, the top surface of the semiconductor assembly module is at the same height level to perform a substantially same height level plane.

After removing the substrate, in one embodiment, FIG. 13 shows the organic or inorganic material in the edge gap regions and gap-A regions could be completely removed to form another type of the semiconductor convert module. For example, the organic or inorganic material could be selected by a photo resist material such as AZ series, or NR series excreta commercial common used photo resist, the commercial common photo resist could be filled and cured at a certain temperature. After curing, the commercial common photo resist could be then removed by acetone or removal of photo-resist chemicals. After removing the substrate, the organic or inorganic material in the gap-A regions could be removed by chemical solutions.

In addition, another connecting layer could be formed on the FIG. 13 structure. FIG. 14 shows a connecting layer is formed on the semiconductor unit 11 and the gap regions to form a semiconductor driving module. The connecting layer 18 could be multiple layers containing an isolation layer 19 and a conductive layer 20 covered to a portion of the semiconductor unit and the gap regions. The isolation layer 19 could be deposited on a portion of the top surface of the semiconductor units 11, the sidewall of the semiconductor units 11 and the gap-A regions; The isolation layer 19 is a dielectric material such as $SiO_x$, $Si_xN_y$, $Al_2O_3$, $TiO_2$ using plasma enhance chemical vapor deposition, chemical vapor deposition, physical vapor deposition, atomic layer deposition. The isolation layer 19 could be multiple dielectric materials having high/low refractive index such as distributed Bragg reflector (DBR) structure to provide a dielectric reflection layer on the sidewall of the semiconductor units 11. The isolation layer 19 could be optional selected from an organic or inorganic material such as polyimide, silicone, parylene and epoxy. The isolation layer 19 could be also option combined by multiple layers such as dielectric material and organic or inorganic material. The isolation layer 19 could be multiple layers containing a dielectric layer and an organic or inorganic material layer. The conductive layer 20 deposit on the isolation layer 19 and on a portion of the semiconductor layer of the semiconductor to form a semiconductor driving module; The conductive layer 20 could be a metal layer and provide a circuitry to contact the semiconductor unit 11 and electrical connection to an electrode to form a common cathode or a common anode circuitry. The conductive layer 20 could be a metal layer having a reflective characteristic to reflect a light, or reflect an electrical magnetic wave inside a region of each one single semiconductor unit 11. The electrical magnetic wave could be confined in a single semiconductor unit 11 region to minimize the electrical magnetic wave cross talk to the adjoin/adjacent semiconductor unit 11. The conductive layer 20 is one or multiple metal layers and could be selected direct from Ti, W, Ta, Cr, Al, Pt, Ag, Ni, Cu, Au or select from the mixed of these metals to make an alloy layer or multiple combination metal layers. The multiple combination metal layers could be such as Ti/Al/Ni/Au, Ti/Al/Ni/Cu, Ti/Ag/Ni/Au, Ti/Ag/Ni/Cu, Cr/Al/Ni/Au. Cr/Ag/Ni/Au. In another one embodiment, the conductive layer 20 could be a transparent conductive layer (TCL). The TCL could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength to output the optimized optical power. In one embodiment of utilizing TCL, the conductive layer 20 could be covered to the semiconductor convert module (not shown in FIG. 16A) to form the semiconductor driving module. The conductive layer 20 could be multiple layers comprising: a TCL layer and one or multiple metal layers. In some particular, the connecting layer could be only formed by a specific conductive layer 20; the specific conductive layer 20 deposit on a portion of the semiconductor unit 11 and on the gap regions. The specific conductive layer 20 could be the metal layer formed on a portion of the semiconductor unit 11 and the TCL layer formed on a portion of the semiconductor unit and the metal layer.

Now also referring from FIG. 1A to FIG. 13 and FIG. 15, FIG. 15 illustrates a process scheme diagram of one embodiment to fabricate the semiconductor driving module. 1) Forming a semiconductor assembly module; 2) Dispense an organic or inorganic flowable material on the edge of the substrate. 3) Loading the semiconductor assembly module into a compressive pressure chamber. 4) Input a gas to fill into the compressive chamber to generate a high pressure $P1_{chamber}$ in the chamber. The $P1_{chamber}$ is greater than that of 1 atm (for example of 5 atm). 5) The organic or inorganic flowable material could be forced by the internal acting gas pressure $P1_{acting}$ into the semiconductor assembly module gap regions. The gap regions between the adjoin/adjacent semiconductor units including the edge of the jointing layer could be filled by the organic or inorganic flowable material. 6) Release the high pressure $P1_{chamber}$ to a relative lower pressure $P2_{chamber}$. The pressure $P2_{chamber}$ could be equal to 1 atm or optional to be less than 1 atm. 7) Heat up the chamber to cure the organic or inorganic flowable material to be solid. In option, the heat up temperature could be lower than that of the curing temperature of the organic or inorganic flowable material to create a semi-cured flexible property. In some particular, process steps in step 6 and step 7, the semiconductor assembly module could be optional to be loaded out from the chamber to release the pressure, and curing the organic or inorganic flowable material outside the chamber. 8) Load out the sample and inspect the organic or inorganic material could be cover gap regions of the semiconductor assembly module. If the covering of organic or inorganic flowable material has good coverage layer in the gap regions of the semiconductor assembly module, then go to the next step. If the covering of the organic or inorganic flowable material has no good coverage layer in the gap regions of the semiconductor assembly module, go back to step 5 to repeat the high internal acting gas pressure $P1_{acting}$ force-in process again and then followed step 5 to step 8 step to repeat. 9) In option, UV light exposure on the Semiconductor Unit region and the semiconductor assembly module gap regions (not exposure the edge of substrate sidewall). 10) Remove the residues of organic or inorganic flowable material coated on the edge of the substrate sidewall. 11) Laser scanning to the exposed substrate and remove the substrate of the semiconductor assembly module to form a semiconductor convert module. 12) In option, the organic or inorganic material in the semiconductor assembly module gap regions could be removed by chemical solutions after removing the substrate. 13) Forming a connecting layer on the semiconductor convert module to form a semiconductor driving module.

For the Type-A semiconductor assembly module, in one embodiment, the semiconductor unit could be a light emitting diode (LED) unit. FIGS. 16A-16E show the Type-A semiconductor unit (LED unit). The LED unit structure consists of a n-type layer, an active layer, and a p-type layer. A conductive layer is formed on a p-type layer and the conductive layer is formed on a pad. A metal base layer could be selected to form on the pad to enhance the LED unit structure. The metal base layer could be deposited by one or multiple metal layers through E-beam deposition, plasma enhanced chemical vapor deposition, sputtering. The metal base layer could be further formed one or multiple metal layers by electroforming or electrical less forming. In one embodiment, the metal base layer has a magnetic property selected from at least one of Fe, Ni and Co. In one particular embodiment, the magnetic metal base layer could be formed by electroforming. In one embodiment of electroforming, the electroforming of the magnetic metal base layer could be selected from a nickel-cobalt electroplating chemical solution. The weight percentage of cobalt could be ranging from 10% to 90% to form an electroforming nickel-cobalt metal layer. A thicker electroforming metal base layer with a higher composition weight percentage of cobalt could enhance the magnetic properties to be much stronger.

FIG. 16A is a flip-chip Type-A LED unit structure formed by using a flip-chip LED process technology. A separated n-pad and metal base layers, p-pad and metal base layers could be formed on the bottom in the flip-chip LED unit structure. FIG. 16B is a vertical-chip Type-A1 LED unit structure formed by a vertical LED process technology. FIG. 16C is a vertical-chip Type-A2 LED unit structure formed by a vertical LED process technology. Please note that a portion of the n-type layer is larger than that of p-type layer. FIG. 16D is a vertical-chip Type-A3 LED unit structure formed by a vertical LED process technology. Please note that, a portion of the n-type layer is gradual larger than that of p-type layer and forming a bevel edge. The bevel angle α could be greater than 10°. The bevel edge could be formed by a gradual shape hard mask and dry etching process. The purpose of the bevel edge is to provide a bevel surface on edge to form a better conformal protected isolation layer 19 to protect the exposed p-n junction; the isolation layer 19 could be a dielectric reflection layer. The bevel surface coated with the dielectric reflection layers could help to obtain more light output from a vertical LED structure. FIG. 16E is a vertical Type-A4 LED unit structure formed by a patterning growth substrate or patterning a pre-growth n-type bulk layer to provide a height structure. A continues n-type layer could be grown on the pattering pre-growth n-type bulk layer. A continues active layer, and a continues p-type layer could continue growth across the height structure on the pre-growth n-type bulk layer and following a vertical LED process technology. The height structure could be a cubic structure, a hemisphere structure, a parabolic ball structure, hexagonal structure, a cylinder structure, a pyramid structure, a pillar structure.

Figure 16F:
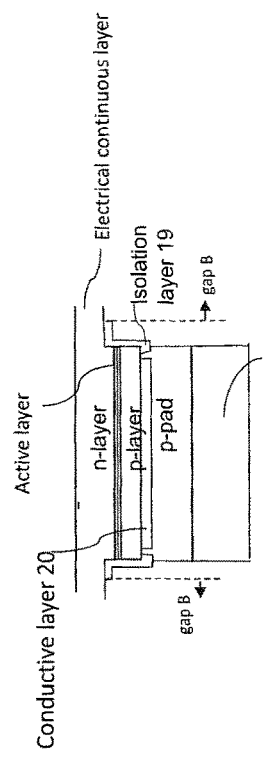
FIG. 16F is a flip-chip Type-B LED unit structure.
Figure 16G:
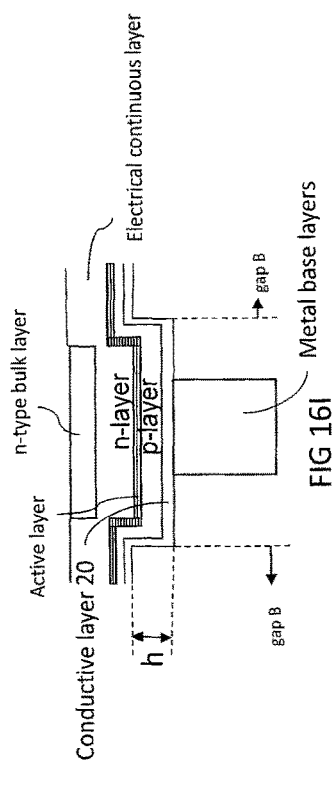
FIG. 16G is a vertical-chip Type-B1 LED unit structure.
Figure 16H:
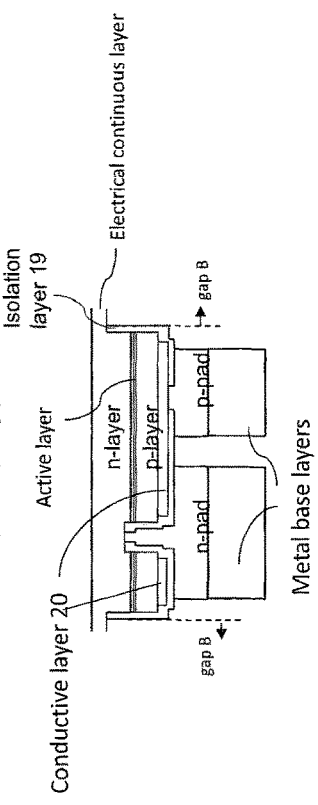
FIG. 16H is a vertical-chip Type-B2 LED unit structure.
Figure 16I:
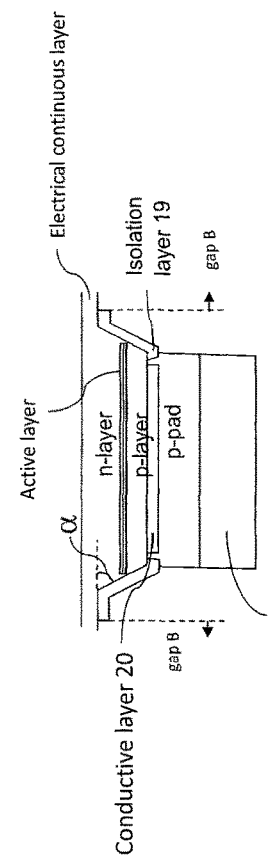
FIG. 16I is a vertical-chip Type-B3 LED unit structure.

For Type-B semiconductor assembly module, in one embodiment, the semiconductor unit could be light emitting diode (LED) unit. In particular, for a LED unit, a portion of the n-type layer on the edge sides could be remained and electrical continuous to the neighbor/adjacent LED unit. FIG. 16F is a flip-chip Type-B LED unit structure could be formed by using a flip-chip LED process. A separated n-pad and metal base layers, p-pad and metal base layers could be formed on the bottom of the flip-chip Type-B LED unit structure. FIG. 16G is a vertical Type-B1 LED unit structure formed by a vertical LED process technology. A portion of the n-type layer on the edge sides could be remained to be electrical continues layer to the neighbor/adjacent vertical LED unit. An isolation layer 19 could be formed on the exposed p-n junction to prevent a short current effect. FIG. 16H is a vertical Type-B2 LED unit structure formed by a vertical LED process technology. Please note that a portion of the n-type layer is gradual larger than that of p-type layer and forming a bevel edge. The bevel angle α could be greater than 10°. The bevel edge could be formed by a gradual shape hard mask and dry etching process. The purpose of the bevel edge is to provide a bevel surface on edge to form a protected isolation layer 19 on the exposed p-n junction; the isolation layer 19 could be a dielectric reflection layer. The bevel surface coated with the dielectric reflection layer could help to obtain more light output from a vertical LED structure. FIG. 16I is a vertical Type-A4 LED unit structure formed by a patterning growth substrate or patterning a pre-growth n-type bulk layer to provide a height structure. A continues n-type layer could be grown on the pattering pre-growth n-type bulk layer. A continues active layer, and a continues p-type layer could continue growth across the height structure on the n-type bulk layer and following a vertical LED process technology. The height structure could be a cubic structure, a hemisphere structure, a parabolic ball structure, hexagonal structure, a cylinder structure, a pyramid structure, a pillar structure. Please note that, the continue semiconductor layers are continuing to the neighbor vertical LED unit.

The isolation layer 19 in FIG. 16A, FIG. 16B, FIG. 16C, FIG. 16D, FIG. 16E, FIG. 16F, FIG. 16G, FIG. 16H, and FIG. 16I could be a single layer selected from the dielectric material. The isolation layer 19 could be a single layer such as an organic or inorganic material layer. The organic or inorganic material such as polyimide, silicone, parylene, and epoxy could be selected. The isolation layer 19 could be a multiple layer containing a dielectric layer and an organic or inorganic layer. In some particular, the organic or inorganic layer could be a non-completely cured (partial semi-cured) to provide a flexible, stretch, and soft properties. The conductive layer 20 could be a reflective metal layer to provide a metal contact and reflector property. The conductive layer 20 in FIG. 16A, FIG. 16B, FIG. 16C, FIG. 16D, FIG. 16E, FIG. 16F, FIG. 16G, FIG. 16H, and FIG. 16I could be a transparent conductive layer (TCL). The conductive layer 20 could combine a transparent conductive layer and a reflective metal layer.

The transparent conductive layer (TCL) could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength to output the optimized optical power. The reflective metal layer could be selected from Ti, W, Ta, Cr, Al, Ag, Pt, Ni, Cu, Au or mixed these metals to make an alloy layer or the multiple combination metal layers. The multiple combination metal layers could be such as Ti/Al/Ni/Au, Ti/Al/Ni/Cu, Ti/Ag/Ni/Au, Ti/Ag/Ni/Cu, Cr/Al/Ni/Au. Cr/Ag/Ni/Au.

In one embodiment, a method to form a vertical light emitting diode (VLED) driving module comprising multiple VLED units formed on a substrate to create a VLED array module; attaching the VLED array module to a backplane to form the VLED semiconductor assembly module in which multiple gap regions are formed inside the VLED semiconductor assembly module and edge gap regions are formed surround the edge of the VLED semiconductor assembly module; dispensing an organic or inorganic flowable material on an edge of the VLED semiconductor assembly module; loading the VLED semiconductor assembly module into a compressive chamber; introducing a gas into the compressive chamber to create high pressure environment inside the compressive chamber; using the high internal acting gas pressure $P_{acting}$ to force the organic or inorganic flowable material into the VLED semiconductor assembly module gap regions; venting the compressive chamber to atmosphere pressure environment creating voids or air-gaps in the VLED semiconductor assembly module gap regions; removing the VLED semiconductor assembly module from the compressive chamber; crosslinking the organic or inorganic flowable material to be the partially cured (semi-cured) organic or inorganic material by applying heat or photon energy; removing the partially cured organic or inorganic material on the edge of the substrate sidewall using mechanical or chemical means; performing a final curing step by applying heat and time to the VLED semiconductor assembly module to cure the partially cured organic or inorganic material to be stable solid; forming a VLED semiconductor convert module by removing the substrate from the VLED semiconductor assembly module utilizing a substrate removal process such as laser irradiation lift-off process; forming N-contact metal layer on the VLED unit and an isolation layer on the VLED semiconductor convert module; fabricating a common cathode conductive layer on the cathode of the backplane and on the N-contact metal layer of the VLED semiconductor convert module to connect to form a VLED semiconductor driving module.

Figure 17:
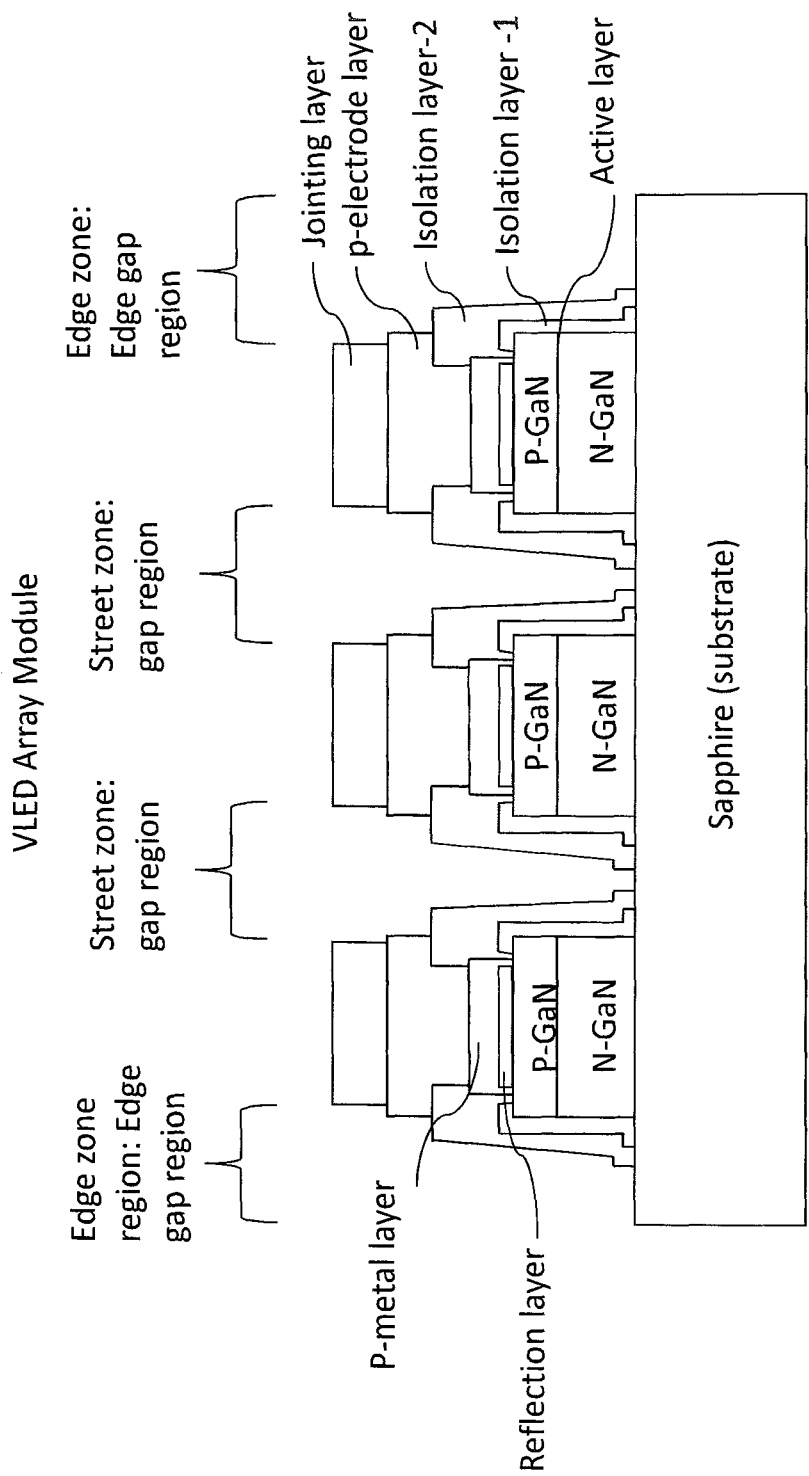
FIG. 17 is a VLED array module.

FIG. 17 shows multiple VLED units together formed on a sapphire substrate create a VLED array module. The LED epitaxial layer consists of a p-GaN, an active layer, and a n-GaN could be defined to form multiple LED units on the sapphire substrate. A reflection layer could be formed on a portion of the top p-GaN surface. An isolation layer-1 could be deposited and formed on the edge sidewall of the LED unit and on a portion of the top p-GaN. A p-metal layer could be then formed to cover the reflection layer and cover a portion of the top p-GaN surface. The p-metal could be also selected to cover a portion of the isolation layer-1. The p-metal layer thickness could be greater than 20% of epitaxial layer thickness. Another isolation layer-2 could be then formed to cover the isolation layer-1 and a portion of the top p-GaN surface, and a portion of the p-metal layer. A p-electrode layer could be then formed to cover a portion of the isolation layer-2 and the whole p-metal layer. A jointing layer could be then selected to from on the top of the p-electrode layer. The reflection layer on p-GaN could be a reflective metal layers such as, TCL, Pt, Ti, Cr, Ni, Ag, Al, Au, Cu, or their metal combination to a multiple metallization layers such as Ni/Ag, Ni/Ag/Ni/Au, Ti/Ag/Ni/Au, Ti/Al/Ni/Au, Cr/Al/Ni/Au, or their alloyed metal layers. The p-metal layer could be thicker than 20% of LED epitaxial layer and selected from Pt, Ti, W, Ta, Cr, Ni, Ag, Al, Au, Cu, or their metal combination to a multiple metal layers such as Ti/Ni/Cu/Ti, Ti/Ni/Au/Ti, Ti/Al/Ni/Au/Ti, Pt/Cu/Ti, Pt/Au/Ti. The p-electrode layer could be selected from Pt, Ti, W, Ta, Cr, Ni, Ag, Al, Au, Cu, or their metal combination to a multiple metal layers such as Cr/Ni/Au, Cr/Al/Ni/Au, Ti/Al/Ni/Au.

In another one embodiment, the reflection layer could be formed by multiple dielectric layers. The dielectric layers having high/low refractive index such as distributed Bragg reflector (DBR) structure to provide a dielectric reflection layer. For the reflection layer contact to the p-GaN, in particularly, to prevent a current leakage issues caused from the crystal particles or defects, one particular embodiment could be utilized to reduce probability of metal contact. The isolation layer-1 could be selected to cover a major portion of the p-GaN region. The reflection layer could cover the major isolation layer-1 and cover to a portion of the top p-GaN surface as metal contact layer. Please note that the current could be spread uniformly to the vertical LED from the metal contact layer. In general, the current in p-GaN could be spread well to a distance ranging from submicron meter to be about few tens μm. However, the not enough metal contact area to the p-GaN could result in high operation voltage. Thus, the design area for the isolation layer-1 and the reflection layer formed on the p-GaN could be optimized. Please note that the reflection layer covered the isolation layer-1 could provide a light reflection effect. An optimized selection of the isolation layer-1 thickness could provide a property having an omnidirectional reflection effect after a reflection layer deposition.

The jointing layer formed on the semiconductor units could be a metal bonding layer selected from a metal such as Cu, Au, Pb, Sn, In, Al, Ag, Bi, Ga, or their alloys such as AuSn, InAu, CuSn, CuAgSn, SnBi, etcetera; The jointing layer could be selected from the organic or inorganic liquid material mixed Nano-metals, such as Ni, Cu, Ag, Al, Au. The organic or inorganic liquid material mixed Nano-metals could be formed self-assembly to the metal base layers of LED units.

The VLED array module structure could be aligned and bonded to an anode layer of a circuitry backplane to from a VLED semiconductor assembly module in which multiple gap regions (represented as street zones in FIG. 17) are formed inside the semiconductor assembly module and edge gap regions (represented as edge zones in FIG. 17) are formed surround the edge of the semiconductor assembly module (which is not shown here). Now referring to the steps of method of fill an organic and inorganic flowable material in semiconductor assembly module gap regions in FIG. 15: dispensing an organic or inorganic flowable material on an edge of the VLED semiconductor assembly module; loading the VLED semiconductor assembly module into a compressive chamber; introducing a gas into the compressive chamber to create high pressure environment inside the compressive chamber; using the high internal acting gas pressure $P_{acting}$ to force the organic or inorganic flowable material into the VLED semiconductor assembly module gap regions; venting the compressive chamber to atmosphere pressure environment and creating voids or air-gaps in the VLED semiconductor assembly module gap regions; removing the VLED semiconductor assembly module from the compressive chamber; crosslinking the organic or inorganic flowable material to be the partially cured (semi-cured) organic or inorganic material by applying heat or photon energy; removing the partially cured organic or inorganic material on the edge of the substrate sidewall using mechanical or chemical means; performing a final curing step by applying heat and time to the VLED semiconductor assembly module to cure the partially cured organic or inorganic material to be stable solid;

A laser beam irradiation could be utilized to scan from the top sapphire substrate and transparent through the sapphire and decompose the interfacial layer underneath of the sapphire substrate. The decomposition of the GaN could be resulting as Ga residues and $N_2$ gas. The isolation layer-1 could not be able to decompose due to a transparent effect of a dielectric material at the laser irradiation wavelength. The isolation layer-2 could be decomposed to be a carbon. After laser beam irradiation, the Ga residues and the burned carbon may still provide a stick force to connect the sapphire substrate. Another additional physical force could be utilized to lifting off the sapphire substrate. Please note that, the isolation layer-1 could be stick well on the sapphire substrate, however, the LED unit, and the isolation layer-2 in the street could sandwich to the isolation layer-1. When utilizing additional physical force to the sapphire substrate or the LED array, the isolation layer-1 on sapphire could be clipped by LED unit and isolation layer-2, and then peeled from the sapphire substrate. The isolation layer-1 could be well protected without cracking or damaging when utilizing the laser irradiation and the additional physical force to peel it. The sapphire substrate could be removed to form a VLED semiconductor convert module.

In another aspect, a portion of the exposed n-GaN layer of the VLED semiconductor convert module could be removed by dry etching to reduce the light absorption effect. In option, the exposed n-GaN surface could be roughening selected by Alkaline chemical solutions or high density plasma treatment. An isolation layer-3 (is not shown in here) could be formed on edge zones and street zones, and on a majority portion of the exposed n-GaN surface. An N-contact metal layer could be deposited on the exposed n-GaN surface to form a contact. The N-contact metal layer could be selected from Ti, Cr, Al, Ag, Ni, Cu, Pt, Au or mixed these metals to make a metallization layer or an alloy layer. The combination metal layers could be such as Al/Pt/Au, Ti/Al/Ni/Au, Cr/Al/Ni/Au, Cr/Ag/Ni/Au. In some particular, the exposed n-GaN could be plasma treatment or chemical treatment to create a roughen surface for more light output and generate nitrogen vacancies on the exposed n-GaN surface for better electrical contact (N-contact metal). For example, O2 plasma could be formed to treat the exposed n-GaN surface, and then deposit a Ti/Al, or TiAl/Ni/Au. The Ti on the plasma treated exposed n-GaN could form a Ti—N compound as a donor in the n-GaN surface to make good metal-semiconductor contact.

The isolation layer-1, isolation layer-2 and isolation layer-3 could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that the isolation layer could be multiple dielectric layers having high/low refractive index such as distributed Bragg reflector (DBR) structure to provide a dielectric reflection layer on the sidewall of the micro light emitting device. The isolation layer-1, isolation layer-2 and isolation layer-3 could be optional selected from organic or inorganic liquid such as polyimide, silicone, and epoxy. The isolation layer-1, isolation layer-2 and isolation layer-3 could be option combined by multiple layers such as dielectric material and organic or inorganic material. The organic or inorganic material could be cured by thermal curing, UV curing, or IR curing after photolithography patterning or filling. The organic or inorganic material could be selected from the hard materials, such as gels, glues, sol-gels, epoxy, silicone, polyimide, phenyl-silicone; photo-sensitive resister, UV cure able glues, and thermal cure able glues. The organic or inorganic material could be also selected from the stretch materials, such as gels, glues, epoxy, polyimide, silicone, methyl-silicone, cohesive gels, silicone gels, PMMA, photosensitive photoresist, UV or thermal cure able glues. In another aspect, the organic or inorganic material could be purposed as black matrix array to absorb the light. The organic or inorganic material could be selected from dyeing hard materials, such as gels, glues, sol-gels, epoxy, silicone, polyimide, parylene, phenyl-silicone; photo-sensitive resister, UV cure able glues, and thermal cure able glues. The organic or inorganic material could be also selected from dyeing stretch materials, such as gels, glues, epoxy, polyimide, parylene, silicone, methyl-silicone, cohesive gels, silicone gels, PMMA, photosensitive photo resist, UV or thermal cure able glues.

A common cathode could be formed on top of the VLED semiconductor convert module to form a VLED semiconductor driving module for the VLED units to light up. A common cathode layer could contact to a portion cathode layer of the backplane, contact to one edge zone of the VLED semiconductor convert module, contact to a major portion region on the street zones and connected a portion of the N-contact metal layer. A common cathode layer combined a common cathode layer array could be as a dam array for further process application. In one embodiment, the VLED semiconductor driving module could be utilized to provide a direct panel backlighting unit. An additional light diffusion layer and a color conversion layer could be formed on the VLED semiconductor driving module for uniform surface lighting. For a blue VLED, a color conversion layer such as a phosphor sheet or a quantum dots (QDs) layer could be formed on the VLED semiconductor driving module to be a surface white light LED lighting. For some particular of surface white lighting, the backplane could be a flexible substrate to form a soft, flexible white lighting panel. In another one embodiment, an additional micro lens array could be formed on top of a dam array to provide a projected lighting from a surface. In another one embodiment, the VLED semiconductor driving module could be utilized to a micro LED display. An additional color conversion module could be aligned and formed on top of the dam array to convert the original VLED light wavelength spectrum (color) to another wavelength spectrum (color) to display color images. A color conversion layer could be formed in the dam of the dam array. The color conversion layer could be an organic or inorganic material mixed with color converting particles such as phosphors or QDs. For a blue VLED semiconductor driving module, a green conversion layer could be formed in a dam array in one column, and a red conversion layer could be formed in another one dam array in one column to display a color image. For a UV light VLED semiconductor driving module, a blue conversion layer could be formed in a dam array in one column, a green conversion layer could be formed in another one dam array in one column, and a red conversion layer could be formed in the other one dam array in one column to display color images.

In another one embodiment, a method to form a color emissive light emitting diode driving module comprising: multiple first color LED units formed on a substrate to create a first color LED array module; multiple second color LED units together formed on a substrate to create a second color LED array module; multiple third color LED units together formed on a substrate to create a third color LED array module; Attaching a first color LED array module on a backplane having circuitry to form a first color LED semiconductor assembly module in which multiple gap regions are formed inside the first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the first color LED substrate; removing the organic or inorganic material to form a first color LED semiconductor convert module; Attaching a second color LED array module on the first color LED semiconductor convert module to form a second-first color LED semiconductor assembly module in which multiple gap regions are formed inside the second-first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the second color LED substrate; removing the organic or inorganic material to form a second-first color LED semiconductor convert module; Attaching a third color LED array module on the second-first color LED semiconductor convert module to form a third-second-first color LED semiconductor assembly module in which multiple gap regions are formed inside the third-second-first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the third color LED substrate; removing the organic or inorganic material to form a third-second-first color LED semiconductor convert module; utilizing an insulation layer to the gap regions; forming a N-contact metal layer and an isolation layer on the third-second-first color LED convert module; fabricating a common cathode conductive layer on a cathode of the backplane, and connect to the N-contact metal layer of the third-second-first color LED semiconductor convert module to form a color emissive light emitting diode semiconductor driving module.

Please note that, the steps to form each color semiconductor assembly module could be repeat; For an example, in a particular option for obtaining an enough second color light output, the steps to form the second-first color LED semiconductor convert module could be repeat to the following steps: another one second color LED array module (which is called second-2 color LED array module) could be attached to the second-first color LED convert module to form a second-2-second-first color LED semiconductor assembly module in which multiple gap regions are formed inside the second-second-first color LED semiconductor assembly module; dispensing the organic or inorganic flowable material and introducing an internal acting gas pressure $P_{acting}$ to force the organic or inorganic flowable material into the multiple gap regions; performing curing step by applying heat and time to cure the organic or inorganic material to be stable solid; utilizing a substrate removing process to remove the second-2 color LED substrate; removing the organic or inorganic material to form a second-2-second-first color LED semiconductor convert module;

The color emissive LED semiconductor driving module could be applied to display color images, a color LED micro projector module to project a color images to a screen for head up display such as HMD, VR, AR. In another one embodiment, the color LED driving module could be formed to be a color LED direct type-backlight unit (BLU) module for LCD to perform a high lumen needed and high color saturation needed industrial monitor display application. In another one embodiment, the color LED semiconductor driving module could be formed to be a high resolution full color LED display screen module in a mall for commercial advertisement. In another one embodiment, the color emissive LED semiconductor driving module could be formed to be a colorful array LED light source assembled with jewelry, accessories, purses or any elements to perform higher price-performance ratio.

More specifically to form a color emissive light emitting diode semiconductor driving module; In one embodiment, FIGS. 18A-18G show a schematic diagram of side view and top view to fabricate the individual original emissive color LED unit array module and the backplane. The side view is the cross section scheme for each individual original emissive color LED device unit on a substrate. The original emissive color LED unit structure could be a flip chip type LED unit, a vertical chip type LED unit, a series circuitry connection of multiple LED units together formed an integrated LED unit.

FIG. 18A is a scheme diagram of N (row)×3 (column) blue (such as nitride compound) LED units on a sapphire substrate to form a blue LED array module. FIG. 18E is the top view of N (row)×3 (column) blue LED units together formed on a sapphire substrate to form a blue LED array module. For the blue LED array module, number of N units of blue LED could be formed on the row, and three units of the blue LED could be formed on the column. For the side view, three column blue LED units in the column is represented underneath of the sapphire substrate. The die pitch of three column blue LED units is 3d. FIG. 18B is a scheme diagram of N (row)×3 (column) green (such as nitride compound) LED units on a sapphire substrate to form a green LED array module. FIG. 18F is the top view of N (row)×3 (column) green LED units together formed on a sapphire substrate to form a green LED array module. In similar, for the green LED array module, number of N units of green LED could be formed on the row, and three units of the green LED could be formed on the column. For the side view, three column green LED units in the column is represented underneath of the sapphire substrate. The die pitch of three column green LED units is 3d; FIG. 18C is a scheme diagram of N (row)×3 (column) red (such as quaternary (AlGaInP)) LED units on a GaAs substrate to form a red LED array module. FIG. 18G is the top view example of N (row)×3 (column) red LED units on a GaAs substrate to form a red LED array module. In similar, array module, number of N units of red LED could be formed on the row, and three units of the red LED could be formed on the column. For the side view, three column red LED units in the column is represented underneath of the GaAs substrate. The die pitch of three column red LED units is 3d. In some particular, the red LED unit could be a nitride compound red LED by increasing the Indium composition of InGaN in active layer. FIG. 18D is multiple anode layers together formed on a backplane having circuitry to form an anode array module. The die pitch of the anode layers of the backplane is d.

FIGS. 19A-19L show a process follow and steps to fabricate a full color RGB LED semiconductor driving module. FIG. 19A shows a red LED array module could be assembled on a red-used anode of the backplane to form a red LED semiconductor assembly module. An organic or inorganic flowable material could be filled into the red LED semiconductor assembly module gap regions by using FIG. 15 steps of method. FIG. 19B is red LED semiconductor convert module showing the GaAs substrate of the red LED semiconductor assembly module could be then removed by a wet chemical etching solution to form a red LED semiconductor convert module. For example, the removal of GaAs substrate could be $NH_4OH$ and $H_2O_2$ blended solution. In the wet chemical etching, the gap regions of the backplane circuits could be protected by the covering layer of the organic or inorganic material to prevent the wet chemical solution attacking. After removing the GaAs substrate, the organic or inorganic material in gap regions could be removed by using another chemical solution such as acetone or suitable chemical solution. A red LED semiconductor convert module is formed and comprising multiple red LED units on red-used anodes of the backplane. Next, FIG. 19C shows a green LED array module could be assembled on the green-used anode of the backplane to form a green-red LED semiconductor assembly module. The green-used anodes is adjoin/neighboring to the red-used anodes and blue-used anodes. Please note that, the thickness of the green LED unit could be higher than that of the thickness of the red LED unit. FIG. 19D shows an organic or inorganic material could be filled into the green-red LED semiconductor assembly module gap regions. Please note that the thickness of the green LED unit could be higher than that of the red LED unit. Multiple height-gap regions are formed between the red LED unit and the sapphire substrate of the green LED after forming the green-red LED semiconductor assembly module. An organic or inorganic flowable material could be filled into the green-red LED semiconductor assembly module gap regions and the height-gap regions by using FIG. 15 steps of method. The height-gap region filled with organic or inorganic liquid material could absorb the laser irradiation energy to protect the red LED units not to be damaged during laser irradiation lift-off process. In option, FIG. 19E shows the relative red LED unit region could be patterned with a stop mask 21 on the top of the sapphire substrate to protect the red LED units not be damaged by a laser irradiation energy damage during the laser irradiation lift-off process. FIG. 19F is a green-red LED semiconductor convert module showing the sapphire substrate of the green LED array module could be then removed by a laser irradiation lift-off process. After removing the green LED sapphire substrate, FIG. 19G is the green-red semiconductor convert module showing the organic or inorganic material in gap regions and the height gap regions could be further removed by using a chemical solution such as acetone or suitable chemical solution. A green-red LED semiconductor convert module is formed and comprising: multiple red LED units on the red-used anodes of the backplane, and multiple green LED units on the green-used anodes of the backplane.

In option to obtain enough green LED light output power level, the process steps from FIG. 19C to FIG. 19G could be repeat to form an additional one or more green LED units on the addition green-used anodes of the backplane.

Next, FIG. 19H shows a blue LED array module could be assembled on a backplane to form a blue-green-red LED semiconductor assembly module. The blue-used anodes are adjoin/neighboring to the green-used anodes and red-used anodes. Please note that, the thickness of the blue LED units could be higher than that of the thickness of the green LED units and the thickness of the red LED units. After forming the blue-green-red LED assembly, multiple height-gap regions are formed between the green LED unit and the sapphire substrate of the blue LED, and another multiple height-gap regions are formed between the red LED units and the sapphire substrate of the blue LED. FIG. 19I shows an organic or inorganic material could be filled into the blue-green-red LED semiconductor assembly module gap regions and all height-gap regions. The gap regions of the backplane and the height-gap regions could be filled with organic or inorganic material to absorb the laser irradiation energy; the height-gap region filled with the organic or inorganic material could protect the red LED units and the green LED units not to be damaged during the laser irradiation lift-off process. In option, FIG. 19J shows the relative red LED units and green LED units region could be patterned with a hard mask 21 on the top of the sapphire substrate of the blue LED to prevent a laser irradiation damage.

The sapphire substrate of the blue LED could be then removed by a laser irradiation lift-off process and the organic or inorganic material in gaps could be removed to form a blue-green-red semiconductor convert module. The organic or inorganic material in gap regions and the height-gap regions could be removed by using a chemical solution such as acetone or suitable chemical solution. FIG. 19K shows a blue-green-red LED semiconductor convert module is formed comprising: multiple red LED units on red-used anodes of the backplane, multiple green LED units on the green-used anodes of the backplane, and multiple blue LED units on the blue-used anodes of the backplane. FIG. 19L is the top view of the blue-green-red LED semiconductor convert module. The blue-green-red LED semiconductor convert module which consists of N×3 color LED units on a backplane. Please note that, a cathode layer could be designed on the backplane (is not shown in here) for the blue-green-red LED convert module to further form a blue-green-red LED semiconductor driving module for color emissive light emitting diode.

In one specific embodiment, a full color display blue-green-red LED semiconductor driving module could be formed by using the blue-green-red LED semiconductor converted module. The gap regions between the LED units in the blue-green-red LED semiconductor converted module could be formed an insulation layer. An insulation layer as an isolation layer could also cover the edge of the sidewall of blue LED units, the sidewall of green LED units and the sidewall of red LED units. The insulation layer could be deposited by dielectric material such as $SiO_x$, $Si_xN_y$, $Al_2O_3$, $TiO_2$ using plasma enhance chemical vapor deposition, chemical vapor deposition, physical vapor deposition, atomic layer deposition. Please note that, the isolation layer could be multiple dielectrics having high/low refractive index such as distributed Bragg reflector (DBR) structure to provide a dielectric reflection layer on the sidewall of the light emitting units. The insulation layer could be optional selected from organic or inorganic material such as polyimide, silicone, and epoxy. The isolation layer could be option combined by multiple layers such as dielectric material and organic or inorganic material. The organic or inorganic material could be cured by thermal curing, UV curing, or IR curing after photolithography patterning or filling. The organic or inorganic material could be selected from the hard materials, such as gels, glues, sol-gels, epoxy, silicone, polyimide, phenyl-silicone; photo-sensitive resister, UV cure able glues, and thermal cure able glues. The organic or inorganic material could be also selected from the stretch materials, such as gels, glues, epoxy, polyimide, parylene, silicone, methyl-silicone, cohesive gels, silicone gels, PMMA, photosensitive photoresist, UV or thermal cure able glues. In some particular option, the organic or inorganic material could be dyeing to be a light absorption characteristic as a black matrix of display application.

FIG. 20 shows one embodiment layout for the full color display blue-green-red LED semiconductor driving module. FIG. 20A is a top view of the full color display blue-green-red LED semiconductor driving module. FIG. 20B is a cross section view of the full color display blue-green-red LED semiconductor driving module. A cathode layer could be pre-formed on top of the backplane. A N-contact metal could be formed on top of a portion of the top N-type layer of the multiple color (red, green, blue) LED units. Please note that the size of the N-contact metal layer should be optimized to be small enough to allow more light output. The N-contact metal layer for nitride compound green or blue LED could be selected from a group consisting at least one of Ti, Al, Ni, Au, Pt, Cr such as Ti/Al, Ti/Al/Ni/Au. The N-contact metal layer for the red quaternary (AlGaInP) LED could be selected from a group consisting at least one of Ge, Au and Ni such as Ni/Ge/Au.

A transparent conductive layer (TCL) as a common cathode electrical connecting layer could be formed on top of the entire blue-green-red LED semiconductor converted module and continuous to contact the cathode layer of the backplane. The TCL could be selected from indium tin oxide (ITO), Gallium-doped ZnO (GZO), Indium-Gallium doped ZnO (IGZO), Al-doped zinc oxide (AZO). The thickness of the TCL could be selected from the optical length match one fourth wavelength (in visible wavelength range) to output the optimized optical light output power.

FIG. 21 shows another one embodiment layout for the full color display blue-green-red LED semiconductor driving module. FIG. 21A is a top view of the full color display blue-green-red LED semiconductor driving module. FIG. 21B is a cross section view of the full color display blue-green-red LED semiconductor driving module. In similar, refer to FIG. 20, a cathode layer could be pre-formed on top of the backplane. A N-contact metal could be formed on top of a portion of the top N-type layer of the LED (red, green, blue) units. A continuous common cathode layer from the cathode layer of the backplane could be formed on the row line of gap region and connected to the N-contact metal layers.

In one specific embodiment of projection display, FIG. 22A shows another micro lens array could be formed on top of the FIG. 19K structure. In addition, FIG. 22B shows another one embodiment for the micro lens forming on top of the FIG. 19K structure. In another one embodiment, the projector could be a display light engine to project the display images to a target screen. FIG. 22C shows a heat sink module could be formed underneath of the backplane. A high current could be utilized into the display engine to generate enough light output to obtain enough projected lumen on the target screen. The heat sink could be formed by patterning and electroforming or any other suitable technologies.

The method of filling an organic or inorganic material in a semiconductor assembly module gap regions to form a substrate removal could provide a robust semiconductor convert module structure for further violent physical process. Now, referring to FIG. 11A, the semiconductor convert module could be selected to pick up a certain parts and transfer to any other target position. For the semiconductor unit, a magnetic property of metal base layers could be pre-formed to the semiconductor unit. Referring to FIGS. 16A-16I, the metal base layers such as one of Fe, Ni, Co, or their combination metal layers could be formed in the semiconductor unit structure. In one particular embodiment, the magnetic metal base layers could be formed by electroforming. In one particular embodiment, the electroforming magnetic metal base layers could be selected from a nickel-cobalt electroplating chemical solution. The weight percentage of cobalt could be ranging from 10% to 90% to form an electroforming nickel-cobalt metal layer. A thicker electroforming metal layers with a higher composition weight percentage of cobalt could enhance the magnetic properties to provide a stronger magnetic force characteristics. Any magnet or electromagnet elements could be able selected to touch the semiconductor unit having magnetic property and pick the semiconductor units up by a magnetic force. FIG. 23 shows a top electromagnetic head could be posited to close to the top of FIG. 11A structure for an example (Please note that the "backplane" in FIG. 11A structure is replaced to a "temporary substrate" in FIG. 23 structure). The electromagnetic head could be charging a magnetic force by utilizing current. When the electromagnetic head touch or slight touch the top surface of FIG. 13 structure, the electromagnetic head could be charged by current to generate the magnetic force to pick up a continuous array layer 31 from the temporary substrate; the continuous array layer 31 comprising the multiple semiconductor units, jointing layers and the organic or inorganic material in the gap region. FIG. 24 shows the electromagnetic head touch to the continuous array layer 31. In one embodiment, the jointing layer could be a not strong sticky adhesive organic or inorganic layer. The magnetic force of the electromagnetic head could be large enough to pick up the continuous array layer 31 from the temporary substrate. In another one embodiment, the jointing layer could be a thermal release able layer, or cooling release able layer. By either heating up the temporary substrate or cooling down the temporary substrate, the jointing layer could be easy to lose its stick effect. In addition, to heat up or cooling down the jointing layer could be also provided by the electromagnetic head. In another embodiment, the jointing layer could be a low melting temperature metal layer, the temporary substrate or magnetic head could be head up a temperature to melt the low melting temperature metal layer of the jointing layer.

In another aspect, too high temperature may reduce the magnetic properties based on the metal curing point effect. The magnetic metals used for electromagnetic head, and the magnetically metal base layers formed in the semiconductor unit, and the temperature property for releasing the jointing layer adhesion could be optimized to perform a best picking up action. FIG. 25 shows the continuous array layer 31 could be picked up from the temporary substrate by the electromagnetic head. The electromagnetic head could be easy to pick up the continuous array layer 31 and then transfer to a backplane by placing on and pressing down. Please note that the continuous array layer 31 is a robust connecting layer structure for the electromagnetic head to pick up and place/press down process. The robust connecting layer structure of the continuous array layer 31 could be picked up together to minimize the damage of the semiconductor units when applying any uneven magnetic force; When the electromagnetic head pressing the robust continuous array layer 31 to the backplane, the pressing force acting on the continuous array layer 31 could perform and balance a uniform distribution pressing force to the continuous array layer 31 and the backplane; any uneven pressing force suddenly generation could be distributed into the continuous array layer 31 to balance the uneven pressing force and minimize any potential damages. The suddenly generation force could be spreading to the whole continuous array layer 31 to reduce a local suddenly force effect. FIG. 26 shows the continuous array layer 31 could be aligned and placed/pressed to a backplane by the electromagnetic head. The second jointing layer could be pre-formed on the backplane. In one embodiment, the electromagnetic head could be heating up to a certain temperature to melt the jointing layer and the second jointing layer; then applying a pressing pressure to provide a certain pressure force to bond the continuous array layer 31 to the backplane. In another one embodiment, the magnetic property of the electromagnetic head could be reduced and degraded by heating up the electromagnetic head. After aligning and placing the continuous array layer 31 to the backplane, the electromagnetic head could be removed and apply another heating head to provide a heat capacity to melt the jointing layer and the second jointing layer; then press the continuous array layer 31 down and bonded to the backplane. The jointing layer and the second jointing layer could be a bonding layer selected from one or multiple metal layers such as Cu, Au, Pb, Sn, In, Al, Ag, Bi, Ga, or their alloys such as AuSn, InAu, CuSn, CuAgSn, SnBi, etcetera; The jointing layer and the second jointing layer could be selected from the organic or inorganic liquid mixed Nano-metals, such as Ni, Cu, Ag, Al, Au. The organic or inorganic liquid mixed Nano-metals could be formed self-assembly to the metal base layers of the semiconductor units after applying a curing temperature.

FIG. 27 shows another semiconductor convert module could be formed after pressing the continuous array layer 31 and removing the electromagnetic head. The yield of the semiconductor transfer module after magnetic pick and press process could be higher due to the robust continuous array layer 31 structure. Please note that a substantially same high level plane could be formed in the semiconductor convert module structure. The substantially same high level plane as a uniform plane could be provided to simplify further required process steps such as patterning process.

FIG. 28 shows the organic or inorganic material layer in the edge gap regions and gap regions of the semiconductor convert module after magnetic pick and place/press process could be further removed by a wet chemical etching or a dry etching for any suitable applications. The semiconductor convert module could be utilized for any further required process steps such as forming a semiconductor driving array modules for any other applications.

Figure 29:
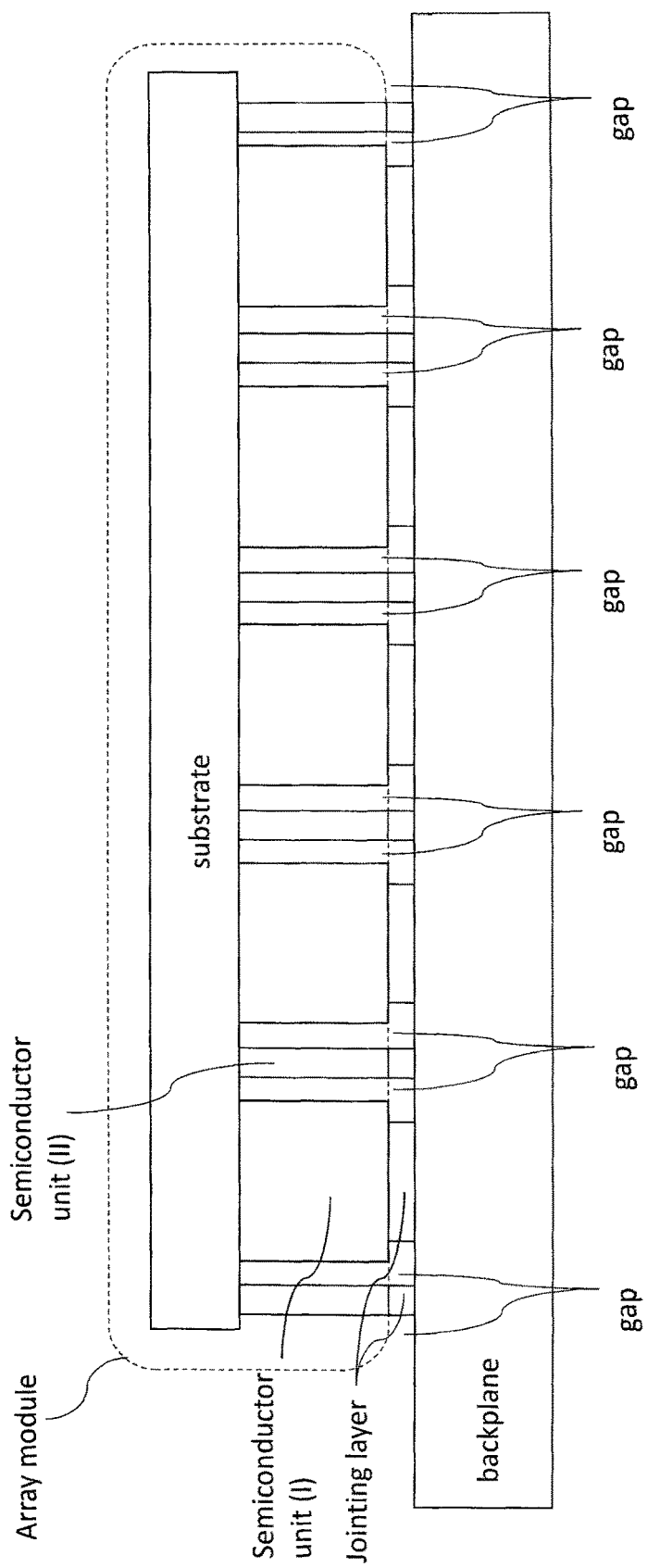
FIG. 29 is a cross sectional view to show a multiple-patterns of semiconductor units having multiple functions semiconductor assembly module.

Now, referring to FIG. 1A and FIG. 2, The array module could be varied to different combinations of semiconductor units to provide different functions. In some particular embodiment, FIG. 29 is a cross sectional view to show a multiple-patterns of semiconductor units having multiple functions semiconductor assembly module. Multiple patterns of semiconductor units having multiple functions together formed on a substrate to form a multiple-patterns semiconductor array module. The semiconductor layers on a substrate could be patterned to multiple patterns having multiple functions to form multiple-pattern semiconductor array module. The first semiconductor unit (I) having a first function could be patterned to be the same size and shape compared to FIG. 1A. The second semiconductor unit (II) having the second function could be patterned to be different size and different shape compared to the first semiconductor unit (I). A backplane is jointed to the multiple-patterns array module by a jointing layer and formed an semiconductor multiple-patterns assembly module. Gap regions including gaps and gap channels could be formed in the multiple-patterns semiconductor assembly module. Please be noted that all the gaps of the gap regions forming inside the multiple-patterns semiconductor assembly module requires a gap channel; the gap channels is an exposed channel connected to the edge of the substrate; an organic or inorganic material could be filled through the exposed gap channels into the multiple-patterns semiconductor assembly module gap regions.

The first semiconductor units (I) having a first pattern array and a second semiconductor units (II) having a second pattern array could be formed on a substrate to form a multiple-patterns semiconductor array module. Please note that multiple patterns of semiconductor units could be formed to a multiple-patterns semiconductor array module, but not limited to one or two patterns. Two or more multiple-patterns semiconductor array module having multiple functions together assembled to a backplane having circuitry to form a multiple-patterns semiconductor assembly module to provide multiple array functions.

Figure 30:
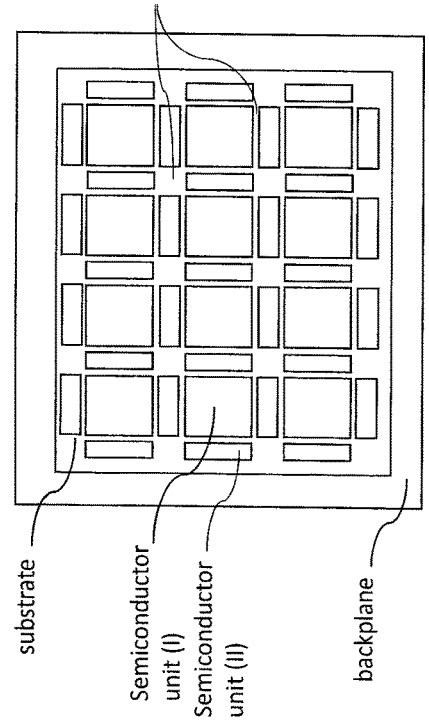
FIG. 30 is a top view of a multiple-patterns of semiconductor units having multiple functions semiconductor assembly module.

In one embodiment, FIG. 30 shows a top view of a multiple-patterns semiconductor assembly module. The first semiconductor unit (I) having a first function could be a square pattern and the second semiconductor unit (II) having a second function could be a rectangular pattern. The second semiconductor unit (II) could be formed between the semiconductor units. Please be noted that, a gap regions including a gap channel could be formed inside the multiple-patterns semiconductor assembly module. The gap channel could expose and connect to the edge of the substrate. An organic or inorganic material could be filled into all multiple-patterns semiconductor assembly module gap regions through the gap channel.

Figure 31:
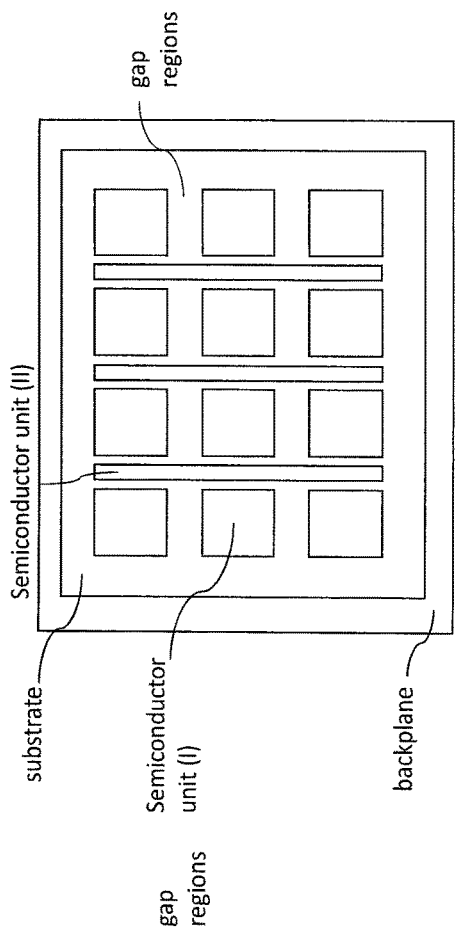
FIG. 31 is a top view of another one multiple-patterns of semiconductor units having multiple functions semiconductor assembly module.

In another one embodiment, FIG. 31 shows a top view of another one multiple-patterns semiconductor assembly module. The first semiconductor unit (I) having a first function could be a square pattern, and the second semiconductor unit (II) having a second function could be a long rectangular pattern as bar. The second semiconductor unit (II) as a bar could be formed in a row or column between the first semiconductor units (I). Please be noted that gap regions including gap channels and gap regions could be formed inside the multiple-patterns semiconductor assembly module. The gap channels could expose and connect to the edge of the substrate. An organic or inorganic material could be filled into all multiple-patterns semiconductor assembly module gap regions through the gap channel.

Figure 32:
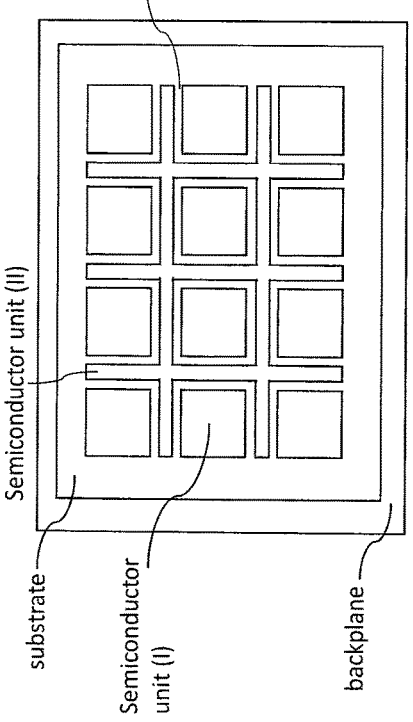
FIG. 32 is a top view of another one multiple-patterns of semiconductor units having multiple functions semiconductor assembly module.

In another one embodiment, FIG. 32 shows a top view of another one multiple-patterns semiconductor assembly module. The first semiconductor unit (I) having a first function could be a square pattern, and the second semiconductor unit (II) having a second function could be non-frame mesh pattern. The second semiconductor unit (II) as non-frame mesh pattern could be formed to separate the first semiconductor units (I). Please be noted that gap regions including gaps and gap channels could be formed inside the multiple-patterns semiconductor assembly module. The gap channels could expose and connect to the edge of the substrate. An organic or inorganic material could be filled into all multiple-patterns semiconductor assembly module gap regions through the gap channel.

Figure 33:
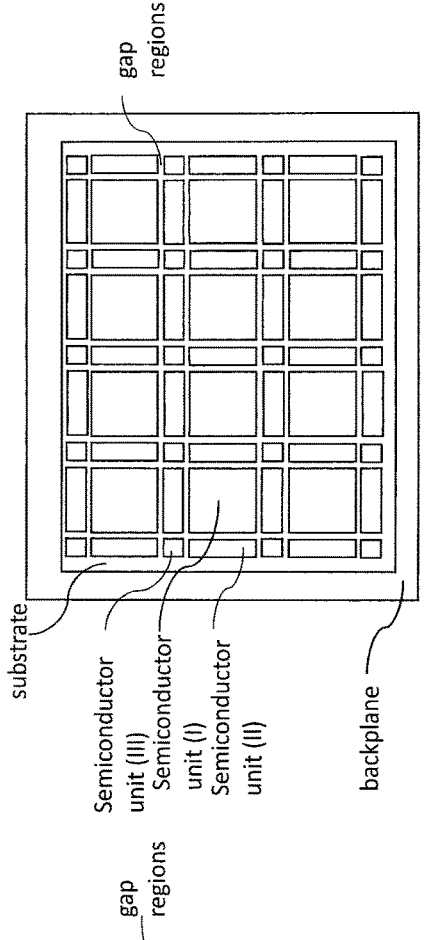
FIG. 33 is a top view of another one multiple-patterns of semiconductor units having multiple functions semiconductor assembly module.

In another one embodiment, FIG. 33 shows a top view of another one multiple-patterns semiconductor assembly module. The first semiconductor unit (I) having a first function could be a square pattern and the second semiconductor unit (II) having a second function could be a rectangular pattern. The third semiconductor unit (III) having a third function could be a relative small square pattern compared to the first semiconductor unit (I). The second semiconductor unit (II) could be formed between the semiconductor unit (I). The third semiconductor unit (III) could be formed in the cross region of four second semiconductor units (II). Please be noted that gap regions including gaps and gap channels could be formed inside the multiple-patterns semiconductor assembly module. The gap channels could expose and connect to the edge of the substrate. An organic or inorganic liquid could be filled into all multiple-patterns semiconductor assembly module gap regions through the gap channel.

Now referring from FIG. 29 to FIG. 33, the multiple-patterns semiconductor assembly modules could be utilized to form different required modules such as forming of a multiple-patterns semiconductor convert module, forming of a multiple-patterns semiconductor driving modules for any other applications. In one embodiment, the first semiconductor unit (I) could be selected to form a first functional semiconductor driving module. The second semiconductor unit (II) could be selected to form second functional semiconductor driving module or a dummy functional semiconductor driving module. The third semiconductor unit (III) could be selected to form a third functional semiconductor driving module. In one embodiment, the first semiconductor unit (I) could be a function of working LED semiconductor driving module, the second semiconductor unit (II) could be dummy LED semiconductor driving module. The second dummy LED semiconductor driving module could be purposed to provide as a same height unit inside the semiconductor assembly module for the LED circuitry connection could be formed at the same height level plane after removal of the substrate. In another one embodiment, the first semiconductor unit (I) could be as a function of working LED semiconductor driving module, the second semiconductor unit (II) and the third semiconductor unit (III) could be as a function of a wall inside the semiconductor driving module to provide a property to prevent a light from the first LED unit emitting to the neighboring/adjacent first LED unit. In another aspect, the wall could provide a same height as the semiconductor unit (I) to form a substantially same height level plane after removal of the substrate to simplify a further photolithography patterning needed steps. In another one embodiment, the first semiconductor unit (I) could be formed as a functional LED or diode unit. The second semiconductor unit (II) could formed be as another reversed bias functional LED or diode unit such as a Zener diode. In another one particular embodiment, for a smart display screen application, the first semiconductor unit (I) could be formed as a functional self-emissive light pixel such as LED or OLED. The second semiconductor unit (II) could be a motion sensor to detect a hand or finger moving motion. The third semiconductor unit (III) could be an infrared self-emissive IR LED or VCSEL (vertical cavity surface emitting laser) and emit an optical signal to an object such as a face or eyes for patterning recognition. There are many functions of the semiconductor units could be selected to form a multiple-patterns semiconductor assembly module for different applications, not limited to the above description embodiment.

Thus the disclosure describes methods for filling in the organic and inorganic material into the semiconductor assembly modules, forming the semiconductor convert modules, forming the semiconductor driving modules and forming multiple patterns having multiple functions semiconductor assembly modules. While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A method to fill an flowable material into a gap region in a semiconductor assembly module comprising:
    forming multiple semiconductor units on a substrate to create an array module;
    attaching the array module to a backplane having circuitry to form the semiconductor assembly module having multiple gap regions inside the semiconductor assembly module and edge gap regions surround an edge of the semiconductor assembly module;
    dispensing a flowable material on an edge of the semiconductor assembly module;

providing a high acting pressure environment to force the flowable material into the semiconductor assembly module gap regions;

creating voids in the gap region of the semiconductor assembly module by reducing the high acting pressure and;

applying heat or a photon energy to harden the flowable material to retain the harden flowable material and the voids in the gap regions.

2. The method to fill the flowable material into the gap region in the semiconductor assembly module according to claim 1 further comprising:

removing the partially cured or semi-cured flowable material on the edge of the substrate sidewall using mechanical or chemical means.

3. The method to fill the flowable material into the gap region in the semiconductor assembly module according to claim 1 further comprising:

applying the curing temperature and a certain time to the semiconductor assembly module to cure the partially cured or semi-cured flowable material to be a stable solid.

4. The method to fill the flowable material into the gap region in the semiconductor assembly module according to claim 3, wherein forming a semiconductor convert module by removing the substrate from the semiconductor assembly module utilizing a substrate removal process.

5. The method to fill the flowable material into the gap region in the semiconductor assembly module according to claim 4, wherein fabricating a circuitry connection on the semiconductor convert module to form a semiconductor driving module.

6. The method to fill the flowable material into the gap region in the semiconductor assembly module according to claim 4, wherein multiple metal base layers with a magnetic property formed in the semiconductor units to handle or pick up a continuous array layer from a temporary substrate;

handling the continuous array layer utilizing an electromagnetic force.

7. The method to fill the flowable material into the gap region in the semiconductor assembly module according to claim 4 further comprising:

Utilizing an electromagnetic head to place the continuous array layer on the backplane; and applying a bonding process via a temperature or the photon energy to connect a jointing layer of the continuous array layer to a second jointing layer of the backplane to form the semiconductor convert module.

8. The method to fill the flowable material into the gap region in the semiconductor assembly module according to claim 4 further comprising:

forming a N-contact metal layer on the semiconductor units;

forming an isolation layer on the semiconductor convert module;

Connecting a common cathode conductive layer on a cathode of the backplane and on the N-contact metal layer of the semiconductor convert module to form a semiconductor driving module.

9. The method to fill the flowable material into the gap region in the semiconductor assembly module according to claim 8, wherein the semiconductor convert module is a vertical light emitting diode (VLED) semiconductor convert module; and the semiconductor driving module is a VLED driving module.

10. The method to fill the flowable material into the gap region in the array assembly module according to claim 9, wherein the semiconductor units has magnetic property of metal base layers; and the metal base layers is formed by electroforming or electrical less forming.

11. A method to fill the flowable material into multiple gap regions in one or more color LED semiconductor assembly modules comprising:

multiple first color LED units together formed on a substrate to create a first color LED array module;

multiple second color LED units together formed on a substrate to create a second color LED array module;

multiple third color LED units together formed on a substrate to create a third color LED array module;

attaching a first color LED array module on a backplane having circuitry to form a first color LED semiconductor assembly module in which multiple gap regions are formed inside the first color LED semiconductor assembly module;

dispensing the flowable material and introducing an internal acting gas pressure to force the organic or inorganic flowable material into the multiple gap regions;

performing curing step by applying heat and time to cure the flowable material to be stable solid;

utilizing a substrate removing process to remove the first color LED substrate; removing the cured flowable material to form a first color LED semiconductor convert module;

attaching a second color LED array module on the first color LED semiconductor convert module to form a second-first color LED semiconductor assembly module in which multiple gap regions are formed inside the second color-first color LED semiconductor assembly module;

dispensing the flowable material and introducing an internal acting gas pressure to force the flowable material into the multiple gap regions;

performing curing step by applying heat and time to cure the flowable material to be stable solid;

utilizing a substrate removing process to remove the second color LED substrate;

removing the cured flowable material to form a second-first color LED semiconductor convert module;

attaching a third color LED array module on the second-first color LED semiconductor convert module to form a third-second-first color LED semiconductor assembly module in which multiple gap regions are formed inside the third-second color-first color LED semiconductor assembly module;

dispensing the flowable material and introducing an internal acting gas pressure to force the flowable material into the multiple gap regions; and performing curing step by applying heat and time to cure the flowable material to be stable solid;

utilizing a substrate removing process to remove the third color LED substrate; removing the organic or inorganic material to form a third-second-first color LED semiconductor convert module;

forming a N-contact metal layer on multiple color LED units of the third-second-first color LED semiconductor convert module; and utilizing an isolation layer in the gap regions and on a portion of multiple color LED units of the third-second-first color LED semiconductor convert module;

fabricating a common cathode conductive layer on a cathode of the backplane, and connect to the N-contact metal layer of the third-second-first color LED semiconductor convert module to form a color emissive light emitting diode semiconductor driving module.

12. The method to fill the flowable material into multiple gap regions in one or more color LED semiconductor assembly module according to claim 11, further comprising:

Repeating steps of the forming of a color LED semiconductor assembly module and a color LED semiconductor convert module to obtain desired one or more color LED light output.

* * * * *